(12) United States Patent
Seki

(10) Patent No.: US 7,777,411 B2
(45) Date of Patent: Aug. 17, 2010

(54) LIGHT-EMITTING DEVICE, METHOD OF PRODUCING LIGHT-EMITTING DEVICE, EXPOSURE UNIT, AND ELECTRONIC DEVICE

(75) Inventor: Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 589 days.

(21) Appl. No.: 11/625,079

(22) Filed: Jan. 19, 2007

(65) Prior Publication Data

US 2007/0252525 A1 Nov. 1, 2007

(30) Foreign Application Priority Data

| Feb. 2, 2006 | (JP) | ............................. 2006-025349 |
| Feb. 13, 2006 | (JP) | ............................. 2006-034778 |
| Feb. 13, 2006 | (JP) | ............................. 2006-034784 |
| Nov. 16, 2006 | (JP) | ............................. 2006-309936 |

(51) Int. Cl.
*H01J 1/62* (2006.01)
(52) U.S. Cl. ...................................... 313/506; 313/509
(58) Field of Classification Search .......... 313/498–512
See application file for complete search history.

(56) References Cited

U.S. PATENT DOCUMENTS

| 2003/0011304 A1* | 1/2003 | Duineveld et al. .......... 313/506 |
| 2004/0131386 A1* | 7/2004 | Koide ......................... 399/167 |
| 2005/0112341 A1* | 5/2005 | Ito et al. ...................... 428/209 |
| 2005/0268984 A1* | 12/2005 | Seki et al. ...................... 141/1 |

FOREIGN PATENT DOCUMENTS

| JP | A 11-329741 | 11/1999 |
| JP | A 2001-18441 | 1/2001 |
| JP | B2 3328297 | 7/2002 |
| JP | A 2003-19826 | 1/2003 |
| JP | A 2003-45665 | 2/2003 |
| JP | A 2003-282244 | 10/2003 |
| JP | B2 3601716 | 10/2004 |
| JP | A 2005-158494 | 6/2005 |
| JP | A 2005-174907 | 6/2005 |

* cited by examiner

*Primary Examiner*—Bumsuk Won
(74) *Attorney, Agent, or Firm*—Oliff & Berridge, PLC

(57) ABSTRACT

A light-emitting device includes a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, wherein an insulating layer having liquid repellency for a hole injection layer-forming material is provided between the adjacent pixel electrodes so as to separate the pixel electrodes from each other and to overlap with the peripheries of the pixel electrodes in plain view, the hole injection layer is provided on the pixel electrodes separated by the insulating layer, and the level of the top surface of the hole injection layer is substantially the same as the level of the top surface of the insulating layer provided on the peripheries of the pixel electrodes.

3 Claims, 36 Drawing Sheets

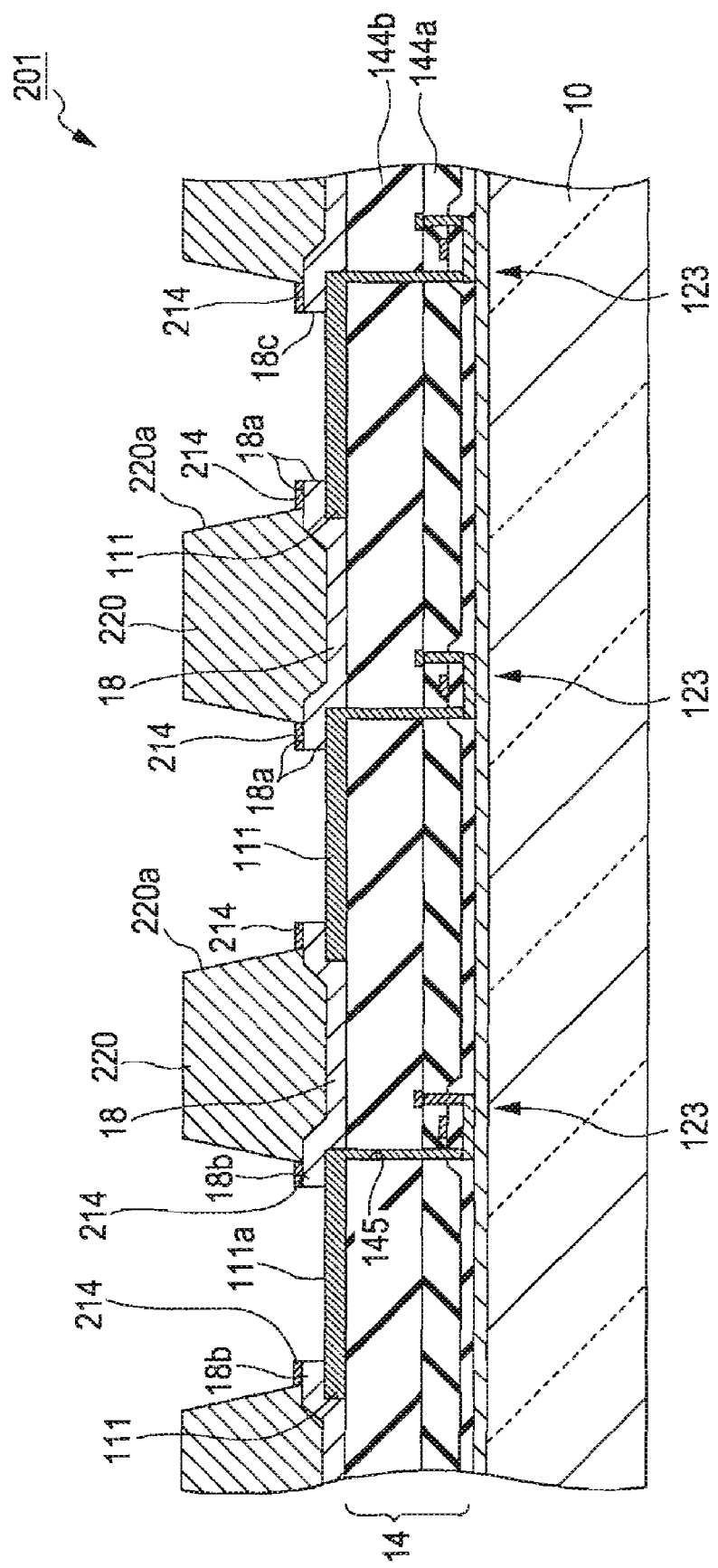

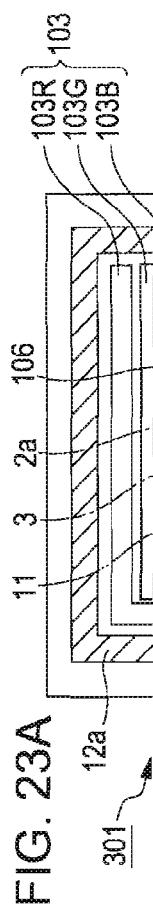
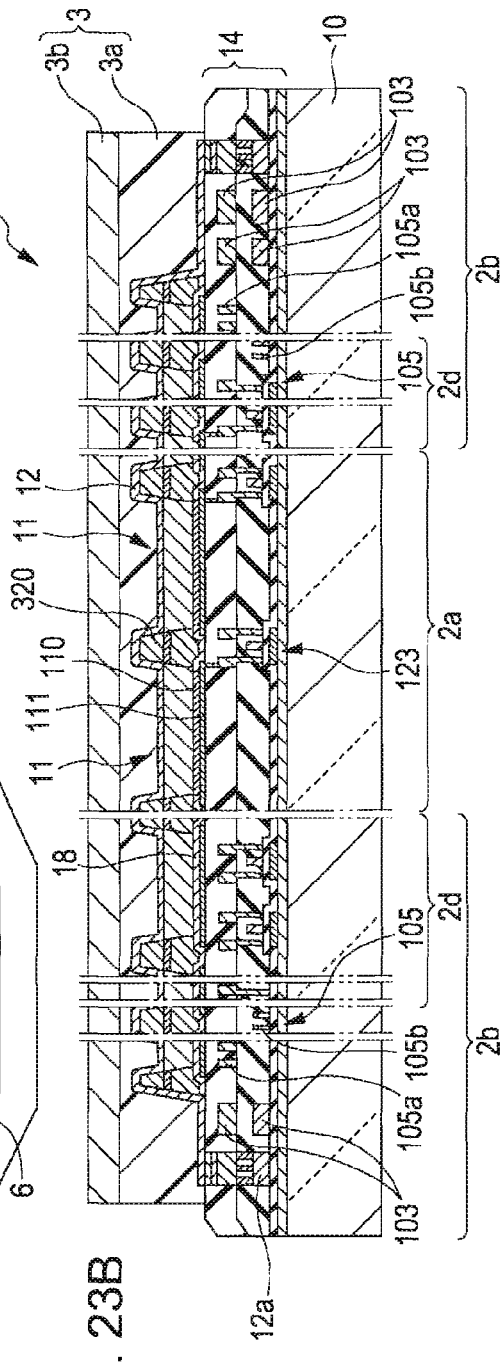
FIG. 23A
FIG. 23B

LIGHT-EMITTING DEVICE, METHOD OF PRODUCING LIGHT-EMITTING DEVICE, EXPOSURE UNIT, AND ELECTRONIC DEVICE

BACKGROUND

1. Technical Field

The present invention relates to a light-emitting device, a method of producing a light-emitting device, an exposure unit, and an electronic device.

2. Related Art

Recently, organic EL devices using electroluminescence have widely attracted attention because of their excellent features such as high visibility due to self-emission, a small thickness and light weight, and excellent impact resistance. In such an organic EL device, a positive electrode composed of a transparent conductive material such as indium tin oxide (ITO) or tin oxide ($SnO_2$), a hole injection layer composed of a doped polythiophene derivative, a luminescent layer composed of a light-emitting material such as polyfluorene, and a negative electrode composed of a metal, such as Ca, or metal compound having a low work function are sequentially laminated on a transparent substrate, such as a glass substrate, having thin-film transistors, which are switching elements disposed thereon.

When a low-molecular-weight material is used as the material of these organic thin films, these thin films are generally formed by vacuum deposition. However, it is difficult to uniformly form the thin films over a wide area by vacuum deposition. Furthermore, since an expensive vacuum apparatus is required and the utilization efficiency of the materials is extremely low, it is difficult to reduce the cost. Consequently, a method in which a polymeric material is used as the material of the organic thin films and the organic thin films are formed by a liquid phase method such as spin coating, dipping, or ink-jetting has been widely employed. A description will now be made of a method of forming organic thin films (a hole injection layer and a luminescent layer) by (1) al spin-coating method and (2) an ink-jet method.

(1) Spin-Coating Method

When a hole injection layer and a luminescent layer are formed by a spin-coating method, first, a plurality of pixel electrodes are formed on a substrate, and an inorganic bank layer composed of $SiO_2$ or the like is then formed so as to separate the pixel electrodes from each other. Subsequently, the hole injection layer is formed by spin coating on the entire surface of the pixel electrodes including the inorganic bank layer. The luminescent layer is then laminated on this hole injection layer (see JP-A-2003-45665 and JP-A-2001-18441).

(2) Ink-Jet Method

When a hole injection layer and a luminescent layer are formed by an ink-jet method, first, an inorganic bank layer composed of an inorganic material such as $SiO_2$ or $TiO_2$ is formed so as to separate the pixel electrodes from each other. An organic bank layer composed of an acrylic resin or a polyimide resin is then formed on the inorganic bank layer. A lyophilicity-providing treatment is performed on the side walls of the inorganic bank layer and on the electrode surfaces of the pixel electrodes, and a liquid-repellency-providing treatment is performed on the inner walls and the ton surface of the organic bank layer. The hole injection layer is formed in areas separated by the inorganic bank layer and the organic bank layer thus formed, and the luminescent layer is laminated on the hole injection layer (see JP-A-2001-18441, JP-A-2003-19826, Japanese Patent No. 3,328,297, and JP-A-2003-282244).

However, the formation of a hole injection layer and a luminescent layer by (1) the spin-coating method or (2) the ink-jet method causes the following problems.

(1) In the case of the spin-coating method, a material having a low resistance, such as a PEDOT/PSS (Baytron P, manufactured by H. C. Starck), is used as the material of the hole injection layer. As described above, since the hole injection layer is formed on the entire surface of the substrate, holes in the hole injection layer are also transferred to the hole injection layer located between pixels other than luminescent areas separated by the inorganic bank layer, thereby causing cross talk. Accordingly, the hole injection layer disposed on the inorganic bank layer between pixels may also function as an electrode. Consequently, light is emitted in areas other than the luminescent areas, resulting in a problem of a degradation of display quality, i.e., blurring of the outline of luminous shapes of objects being displayed. In addition, when the hole injection layer or the like is formed on the entire surface of the substrate by the spin-coating method, a step of removing the layer disposed on mounting portions and areas for forming a negative electrode is required.

(2) In the ink-jet method, in consideration of the accuracy of photolithography, the organic bank layer is formed inside the inorganic bank layer so that a certain space is formed between the peripheries of the inorganic bank layer and the side faces of the organic bank layer. Accordingly, the laminated portion of the inorganic bank layer and the organic bank layer forms a step. This inorganic bank layer is lyophilic. Therefore, when a hole injection layer-forming material is discharged onto areas separated by the inorganic bank layer and the organic bank layer, the hole injection layer-forming material is also disposed on the area of the inorganic bank layer forming the step. The luminescent layer is then formed on this hole injection layer. In this case, the thicknesses of the hole injection layer and the luminescent layer formed on this inorganic bank layer forming the step are different from the thicknesses of the hole injection layer and the luminescent layer formed on each pixel area. Accordingly, the emission luminance in the areas surrounded by the bank is different from that in other areas.

After the light-emitting material is discharged onto the hole injection layer, a drying process is performed to vaporize a solvent in the light-emitting material, thus forming the luminescent layer. However, points (pinning points) at which drying of the light-emitting material starts are not always the same position on the side walls of the organic bank layer. The position at which the drying is started tends to be varied. Because of these variations in the pinning points on the side walls of the organic bank layer the thickness of the luminescent layer may be different between the central portion and the peripheral portion of the luminescent layer. Therefore, a luminescent layer having a uniform thickness cannot be formed. Consequently, the emission luminance is disadvantageously different between the central portion and the peripheral portion in pixel areas, and the emission lifetime is also different.

SUMMARY

An advantage of some aspects of the invention is that it provides a light-emitting device in which cross talk is prevented, functional layers of each of a plurality of pixels are flat and have a uniform thickness, and the emission luminance and the emission lifetime are uniform, a method of producing a light-emitting device, an exposure unit, and an electronic device.

According to a first aspect of the invention, a light-emitting device includes a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, wherein an insulating layer having liquid repellency for a hole injection layer-forming material is provided between the adjacent pixel electrodes so as to separate the pixel electrodes from each other and to overlap with the peripheries of the pixel electrodes in plan view, the hole injection layer is provided on the pixel electrodes separated by the insulating layer, and the level of the top surface of the hole injection layer is substantially the same as the level of the top surface of the insulating layer provided on the peripheries of the pixel electrodes.

According to this structure, the insulating layer provided on the periphery of each pixel electrode has liquid repellency for the hole injection layer-forming material. Therefore, the hole injection layer-forming material discharged on the insulating layer is repelled and flows into openings separated by the insulating layer. In addition, the level of the top surface of the hole injection layer is substantially the same as the level of the top surface of the insulating layer. Accordingly, after drying, the hole injection layer-forming material is controlled so that the material does not leak onto the insulating layer. This can be achieved by controlling the discharging conditions such as the amount of discharge of the hole injection layer-forming material. Consequently, the hole injection layer is disposed only on the pixel electrodes in the openings separated by the insulating layer and is not disposed on the insulating layer disposed outside the openings (i.e., between adjacent pixels). Accordingly, the generation of cross talk due to a phenomenon in which holes in the hole infection layer provided on each pixel electrode flow to adjacent pixels can be suppressed. Consequently, a degradation of display quality, for example, blurring of the outline of luminous shapes of objects being displayed caused by a flow of a current to adjacent pixels, can be prevented.

In the light-emitting device, the luminescent layer is preferably provided on the entire surface of the insulating layer and the hole injection layer.

According to this structure, since the level of the top surface of the insulating layer is substantially the same as the level of the top surface of the hole injection layer, the top surface of the insulating layer and the too surface of the hole injection layer form a continuous flat surface. Accordingly, the luminescent layer formed on the insulating layer and the hole injection layer is a flat layer having a uniform thickness. As a result, a uniform light emission without unevenness of luminance can be achieved.

According to a second aspect of the invention, in a method of producing a light-emitting device including a substrate pixel electrodes provided on the substrate, a negative electrode facing the pixel electrodes, and a hole injection layer and a luminescent layer that are provided between the pixel electrodes and the negative electrode so as to be laminated, from the substrate side, in that order, the method includes forming an insulating layer that has liquid repellency for a hole injection layer-forming material or that is subjected to a liquid-repellency-providing treatment between the adjacent pixel electrodes so as to separate the pixel electrodes from each other and to overlap with the peripheries of the pixel electrodes in plan view, forming the hole injection layer on the pixel electrodes separated by the insulating layer so that the level of the top surface of the hole injection layer is substantially the same as the level of the top surface of the insulating layer, and forming the luminescent layer on the entire surface of the insulating layer and the hole injection layer.

In forming the insulating layer, the insulating layer is preferably composed of a material containing silicon nitride and carbon, and a plasma treatment is then preferably performed on the insulating layer in a fluorine compound gas atmosphere. In forming the insulating layer, the insulating layer is preferably composed of silicon oxide ($SiO_2$), silicon nitride (SiN), or titanium oxide ($TiO_2$), and a silane coupling treatment is then preferably performed on the surface of the insulating layer.

According to this method, the insulating layer formed on the periphery of each pixel electrode has liquid repellency for the hole injection layer-forming material. Therefore, the hole injection layer-forming material discharged on the insulating layer is repelled and flows into openings separated by the insulating layer. In addition, the hole injection layer is formed so that the level of the top surface of the hole injection layer is substantially the same as the level of the top surface of the insulating layer. Accordingly, the hole injection layer-forming material does not leak onto the insulating layer. This can be achieved by controlling the discharging conditions such as the amount of discharge of the hole injection layer-forming material. Consequently, the hole injection layer does not overflow from the openings separated by the insulating layer and is not formed on the insulating layer disposed outside the openings. Accordingly, the generation of cross talk due to a phenomenon in which holes in the hole injection layer provided on each pixel electrode flow to adjacent pixels can be suppressed. Consequently, a degradation of display quality, for example, blurring of the outline of luminous shapes of objects being displayed caused by a flow of a current to adjacent pixels, can be prevented.

In the method of producing a light-emitting device, in forming the hole injection layer, the hole injection layer is preferably formed by a liquid droplet discharging method, and in forming the luminescent layer, the luminescent layer is preferably formed by a liquid phase method.

According to this method, the insulating layer has liquid repellency or the insulating layer is subjected to a liquid-repellency-providing treatment. Therefore, even when a liquid droplet discharging method is employed, the hole injection layer can be selectively formed without leaking the hole injection layer-forming material outside the openings separated by the insulating layer. Accordingly, by employing the liquid droplet discharging method, wastage of the material can be suppressed, and the hole injection layer can be formed with high accuracy and at low cost. Furthermore, according to this method, since the top surface of the insulating layer and the top surface of the hole injection layer form a continuous flat surface, the luminescent layer can be formed by a simple spin-coating method. Accordingly, the flat luminescent layer having a uniform thickness can be easily formed.

According to a third aspect of the invention, an exposure unit includes the above light-emitting device and a rotatable photoconductive drum, wherein the photoconductive drum is exposed to light emitted from the light-emitting device. According to a fourth aspect of the invention, an electronic device includes the above light-emitting device. According to these structures, since the above light-emitting device is included, a high-quality exposure unit and a high-quality electronic device that do not have unevenness of luminance can be provided.

According to a fifth aspect of the invention, a light-emitting device includes a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, wherein a first barrier having liquid repellency for a hole injection layer-forming material is provided between the adjacent pixel electrodes so as to separate the pixel electrodes from each other and to overlap with the peripheries of the pixel electrodes in plan view, a second barrier is provided on the first barrier so as to separate the pixel electrodes from each other, the hole injection layer is provided on the pixel electrodes separated by the first barrier, and the level of the top surface of the hole injection layer is substantially the same as the level of the top surface of the first barrier provided on the peripheries of the pixel electrodes.

In the light-emitting device, the luminescent layer is preferably provided on the entire surface of the first barrier and the hole injection layer.

According to this structure, the first barrier provided on the periphery of each pixel electrode has liquid repellency for the hole injection layer-forming material. Therefore, the hole injection layer-forming material discharged on the first barrier is repelled and flows into openings separated by the first barrier. In addition, the level of the top surface of the hole injection layer is substantially the same as the level of the top surface of the first barrier. Accordingly, the hole injection layer-forming material is controlled so that the material does not leak onto the first barrier. This can be achieved by controlling the discharging conditions such as the amount of discharge of the hole injection layer-forming material. Consequently, the hole injection layer is not disposed outside the openings separated by the first barrier. Since the level of the top surface of the first barrier is substantially the same as the level of the top surface of the hole injection layer, the uniform and flat hole injection layer and luminescent layer can be formed. Furthermore, since the film thicknesses of the hole injection layer and the luminescent layer can be uniform at the periphery and at the central portion, the emission lifetime is uniform. Accordingly, a uniform emission lifetime can be achieved.

According to a sixth aspect of the invention, in a method of producing a light-emitting device including a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, the method includes forming a first barrier having liquid repellency for a hole injection layer-forming material between the adjacent pixel electrodes so as to separate the pixel electrodes from each other and to overlap with the peripheries of the pixel electrodes in plan view, forming a second barrier on the first barrier so as to separate the pixel electrodes from each other, forming the hole injection layer on the pixel electrodes separated by the first barrier and the second barrier so that the level of the top surface of the hole injection layer is substantially the same as the level of the top surface of the first barrier provided on the peripheries of the pixel electrodes, and forming the luminescent layer on the entire surface of the hole injection layer separated by the first barrier and the second barrier.

In the method of producing a light-emitting device, in forming the first barrier, the first barrier is preferably composed of a material containing silicon nitride and carbon, and after the formation or the second barrier, a plasma treatment is preferably performed on the first barrier in a fluorine compound gas atmosphere to perform a liquid-repellency-providing treatment on the first barrier.

In the method of producing a light-emitting device, in forming the first barrier, the first barrier is preferably composed of silicon oxide, silicon nitride, or titanium oxide, and after the formation of the second barrier, a silane coupling treatment is preferably performed on the surface of the first barrier to perform a liquid-repellency-providing treatment on the surface of the first barrier.

In the method of producing a light-emitting device, after the formation of the second barrier, a plasma treatment is preferably performed in a fluorine compound gas atmosphere to perform a liquid-repellency-providing treatment on the second barrier.

According to this method, the first barrier formed on the periphery of each pixel electrode has liquid repellency for the hole injection layer-forming material. Therefore, the hole injection layer-forming material discharged on the first barrier is repelled and flows into openings separated by the first barrier. In addition, the level of the top surface of the hole injection layer is substantially the same as the level of the top surface of the first barrier. Accordingly, the hole injection layer-forming material is controlled so that the material does not leak onto the first barrier. This can be achieved by controlling the discharging conditions such as the amount of discharge of the hole injection layer-forming material. Consequently, the hole injection layer is not disposed outside the openings separated by the first barrier. Since the level of the top surface of the first barrier is substantially the same as the level of the top surface of the hole injection layer, the uniform and flat hole injection layer and luminescent layer can be formed. Furthermore, since the film thicknesses of the hole injection layer and the luminescent layer can be uniform at the periphery and at the central portion, the emission lifetime is uniform. Accordingly, a uniform emission lifetime can be achieved.

In the method of producing a light-emitting device, in forming the hole injection layer, the hole injection layer is preferably formed by a liquid droplet discharging method and in forming the luminescent layer, the luminescent layer is preferably formed by the liquid droplet discharging method.

According to this method, the hole injection layer and the luminescent layer can be selectively formed by the liquid droplet discharging method. Accordingly, wastage of the materials can be suppressed, and the hole injection layer and the luminescent layer can be formed with high accuracy and at low cost.

According to a seventh aspect of the invention, a light-emitting device includes a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, wherein a first barrier is provided between the adjacent pixel electrodes so as to separate the pixel electrodes from each other and to overlap with the peripheries of the pixel electrodes in plan view, a second barrier is provided on the first barrier so as to separate the pixel electrodes from each other, and the side faces of the second barrier each include a first area having liquid repellency and a second area having liquid repellency relatively lower than the liquid repellency in the first area.

According to this structure, the liquid repellency of the second area, which is the side face of the second barrier, is relatively lower than the liquid repellency of the first area. The discharged luminescent layer-forming material is easily wetted on the second area compared with the first area. Accordingly, the second area serves as a pinning point at which drying and precipitation of the luminescent layer-forming material start. Therefore, the pinning point at which drying and precipitation start can be controlled (pinned) by adjusting the position of the second area of the second barrier. Accordingly, the thickness of the luminescent layer after drying can be controlled by controlling the amount of discharge of the luminescent layer-forming material or the like. Thus, a more uniform and flatter luminescent layer can be formed. A pinning phenomenon will now be described. In general, drying of a liquid droplet disposed on a substrate rapidly proceeds at the periphery (edge) thereof. Accordingly, when the liquid droplet contain a solvent, during a drying process of this liquid droplet, the concentration of a solute and the like first reaches the saturated concentration at the periphery of the liquid droplet and the solute starts to precipitate. On the other hand, to compensate for the liquid lost by vaporization at the periphery of the liquid droplet, a liquid flow from the center to the periphery of the liquid droplet is generated inside the liquid droplet. As a result, the solvent at the center of the liquid droplet is carried to the periphery in accordance with the flow and accelerates the precipitation from the periphery as the drying of the liquid droplet proceeds. This phenomenon in which a solvent contained in a liquid droplet is precipitated along the periphery of the liquid droplet disposed on a substrate is referred to as "pinning". In the invention, for each of the liquid droplets (luminescent layer-forming material) discharged in areas separated by the second barrier, a position at which the outer edge of the liquid droplet where precipitation starts is in contact with the side face of the second barrier is referred to as a "pinning point".

In the above light-emitting device, the second barrier preferably includes a first organic layer, a barrier insulating layer, and a second organic layer that are laminated, from the substrate side, in that order, and the liquid repellency of the surface of the barrier insulating layer is preferably relatively lower than the liquid repellency of the surfaces of the first organic layer and the second organic layer.

According to this structure, by, for example, a plasma treatment using a fluorine compound, the surface of the barrier insulating layer has liquid repellency lower than that of the surfaces of the first organic layer and the second organic layer. Accordingly, a state in which the luminescent layer-forming material to be discharged is easily wetted on the surface of the barrier insulating layer compared with the surface of the first organic layer and the like can be formed. Therefore, the surface of the barrier insulating layer serves as the pinning point. Accordingly, the position at which drying starts can be controlled (pinned), and the thickness of the luminescent layer after drying can be controlled. Thus, the thickness of the luminescent layer can be controlled to be a desired value by controlling the amount of discharge of the luminescent layer-forming material or the like, and a flat luminescent layer can be formed.

According to an eighth aspect of the invention, a light-emitting device includes a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, wherein a first barrier is provided between the adjacent pixel electrodes so as to separate the pixel electrodes from each other and to overlap with the peripheries of the pixel electrodes in plan view, a second barrier is provided on the first barrier so as to separate the pixel electrodes from each other, and a flexion is provided on at least a part of the side faces of the second barrier.

The second barrier preferably includes an upper barrier portion and a lower barrier portion whose side faces protrude beyond the side faces of the upper barrier portion, and the flexion is preferably provided at the boundary between the top surface of the protruding lower barrier portion and the side faces of the upper barrier portion.

According to this structure, the flexion provided on the side faces of the second barrier serves as the pinning point at which drying and precipitation of the luminescent layer-forming material start. Drying of the luminescent layer-forming material discharged in areas separated by the second barrier starts while the flexion serves as a base point. Accordingly, the pinning point at which the drying starts can be controlled by controlling the position of the flexion. When the side face of the second barrier is a flat surface or a curved surface, the side face does not serve as the pinning point.

In the light-emitting device, the first barrier preferably has liquid repellency for a hole injection layer-forming material, and the level of the too surface of the hole injection layer is preferably substantially the same as the level of the top surface of the first barrier provided on the peripheries of the pixel electrodes.

According to this structure, the first barrier provided on the periphery of each pixel electrode has liquid repellency for the hole injection layer-forming material. Therefore, the hole injection layer-forming material discharged on the first barrier is repelled and flows into areas separated by the first barrier. In addition, the level of the top surface of the hole injection layer is substantially the same as the level of the top surface of the first barrier. Accordingly, the hole injection layer-forming material is controlled so that the material does not leak onto the first barrier. This can be achieved by controlling the discharging conditions such as the amount of discharge of the hole injection layer-forming material. Consequently, the hole injection layer is disposed only on the pixel electrodes in the areas separated by the first barrier and is not disposed on the first barrier. Accordingly, a uniform and flat hole injection layer can be formed. Since the luminescent layer can be formed on this hole injection layer, a uniform and flat luminescent layer can be formed. Furthermore, since the film thicknesses of the hole injection layer and the luminescent layer can be uniform at the central portion and the periphery, unevenness of luminance can be prevented.

According to a ninth aspect of the invention, in a method of producing a light-emitting device including a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, the method includes forming a first barrier between the adjacent pixel electrodes so as to separate the pixel electrodes from each other and to overlap with the peripheries of the pixel electrodes in plan view, forming a second barrier on the first barrier so as to separate the pixel electrodes from each other, forming the hole injection layer on the pixel electrodes separated by the first barrier and the second barrier, and forming the luminescent layer on the hole injection layer separated by the first barrier and the second barrier, wherein, in forming the second barrier, from the substrate side, a first organic layer, a barrier insulating layer, and a second organic layer are laminated on the first barrier in that order, and the laminated layer is then patterned so as to have a predetermined shape to form the second barrier. In this case, after the formation of the second barrier, a plasma treatment is preferably performed using oxygen and a fluorine compound gas, thereby imparting lyophilicity to the surface of the barrier insulating layer and imparting liquid repellency to the surfaces of the first organic layer and the second organic layer.

According to this method, since the barrier insulating layer having lyophilicity is provided between the first organic layer and the second organic layer, the discharged luminescent layer-forming material is easily wetted on the barrier insulating layer. The surface of the barrier insulating layer serves as the pinning point. Drying and precipitation of the luminescent layer-forming material discharged in areas separated by the second barrier start while the pinning point serves as a base point. Therefore, the position of the pinning point at which drying starts can be controlled (pinned) by adjusting the position of the barrier insulating layer. Accordingly, the thickness of the luminescent layer after drying can be controlled by controlling the amount of discharge of the luminescent layer-forming material or the like. Thus, a more uniform and flatter luminescent layer can be formed.

According to a tenth aspect of the invention, in a method of producing a light-emitting device including a substrate, pixel electrodes provided on the substrate, a negative electrode facing the pixel electrodes, and a hole injection layer and a luminescent layer that are provided between the pixel electrodes and the negative electrode so as to be laminated, from the substrate side, in that order, the method includes forming a first barrier between the adjacent pixel electrodes so as to separate the pixel electrodes from each other and to overlap with the peripheries of the pixel electrodes in plan view, forming a second barrier on the first barrier so as to separate the pixel electrodes from each other, forming the hole injection layer on the pixel electrodes separated by the first barrier and the second barrier, and forming the luminescent layer on the hole injection layer separated by the first barrier and the second barrier, wherein, in forming the second barriers a flexion is formed on at least a part of the side faces of the second barrier. In this case, the second barrier is preferably composed of an organic material, and a plasma treatment is then preferably performed using oxygen and a fluorine compound gas, thereby imparting liquid repellency to the surfaces of the organic layer.

According to this method, since the flexion is formed on the side face of the second barrier, the flexion serves as the pinning point. Drying and precipitation of the luminescent layer-forming material discharged in areas separated by the second barrier start while the flexion serves as a base point. Accordingly, the pinning point at which the drying and precipitation start can be controlled by controlling the position of the flexion formed on the side face of the second barrier. Accordingly, the thickness of the luminescent layer after drying can be controlled by controlling the amount of discharge of the luminescent layer-forming material or the like. Thus, a more uniform and flatter luminescent layer can be formed.

In the method of producing a light-emitting device, in forming the first barrier, the first barrier is preferably composed of a material containing silicon nitride and carbon, after the formation of the second barrier, a plasma treatment is preferably performed on the first barrier using a fluorine compound gas to impart liquid repellency to the first barrier, and in forming the hole injection layer, the hole injection layer is preferably formed on the pixel electrodes separated by the first barrier so that the level of the top surface of the hole injection layer is substantially the same as the level of the top surface of the first barrier provided on the peripheries of the pixel electrodes.

In the method of producing a light-emitting device, in forming the first barrier, the first barrier is preferably composed of silicon oxide or titanium oxide, after the second barrier is formed and a plasma treatment is performed, a silane coupling treatment is preferably performed on the first barrier to impart liquid repellency to the first barrier, and in forming the hole injection layer, the hole injection layer is preferably formed on the pixel electrodes separated by the first barrier so that the level of the top surface of the hole injection layer is substantially the same as the level of the too surface of the first barrier provided on the peripheries of the pixel electrodes.

In the method of producing a light-emitting device, in forming the hole injection layer, the hole injection layer is preferably formed by a liquid droplet discharging method, and in forming the luminescent layer, the luminescent layer is preferably formed by the liquid droplet discharging method.

According to this method, the hole injection layer and the luminescent layer can be selectively formed by the liquid droplet discharging method. Accordingly, wastage of the materials can be suppressed, and the hole injection layer and the luminescent layer can be formed with high accuracy and at low cost.

BRIEF DESCRIPTION OF THE DRAWINGS

The invention will be described with reference to the accompanying drawings, wherein like numbers reference like elements.

FIG. 22 is a cross-sectional view showing a step of producing the organic EL device according to the fourth embodiment.

FIG. 23A is a plan view showing the schematic structure of an organic EL device according to a fifth embodiment.

FIG. 23B is a cross-sectional view taken along line XXIIIB-XXIIIB of the organic EL device shown in FIG. 23A.

DESCRIPTION OF EXEMPLARY EMBODIMENTS

First Embodiment

Figure 1:
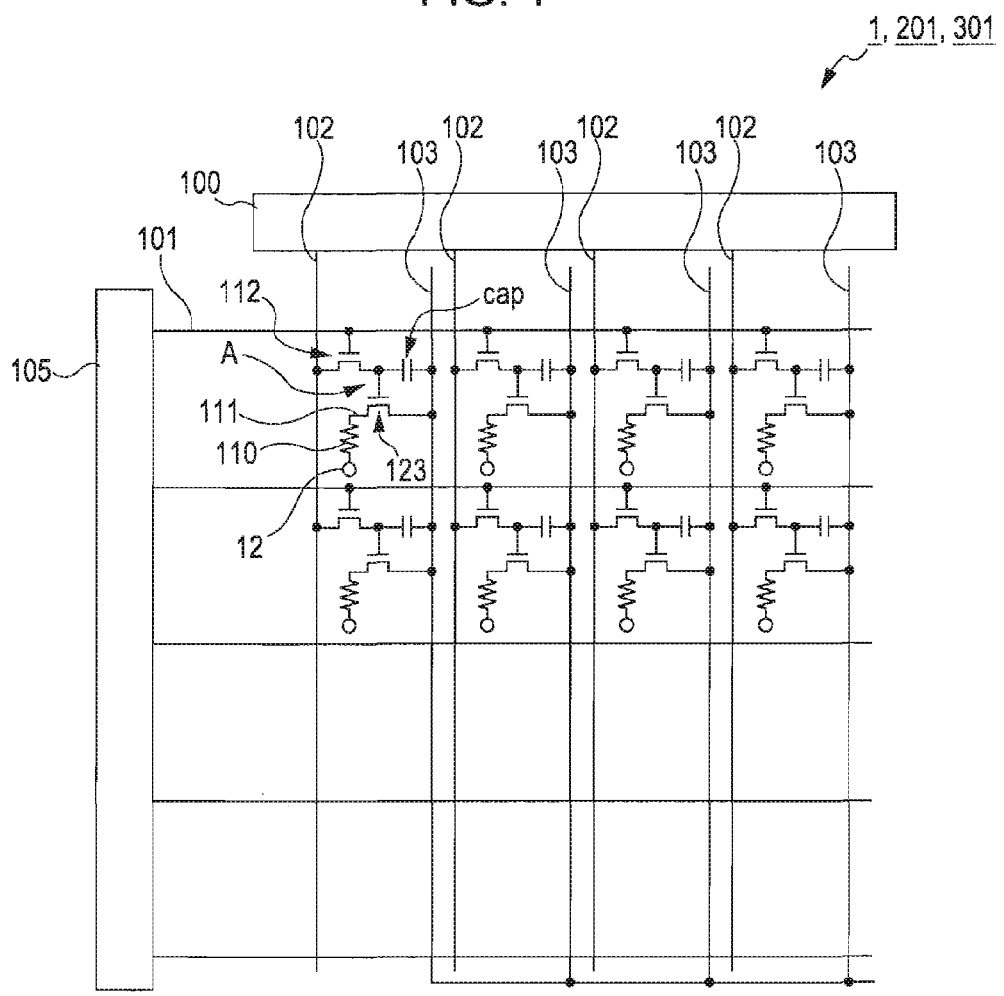
FIG. 1 is an equivalent circuit diagram of an organic EL device.

An embodiment of the invention will now be described with reference to the drawings. In the drawings described below, the scales at which each layer and each component are reproduced are different from those of the actual layers and components so that each layer and each component have a size enabling easy recognition in the drawings. In an organic EL device of this embodiment, a monochrome display that emits monochromatic light is used, and the organic EL device is a bottom emission-type organic EL device in which light emitted in a luminescent layer 110b is supplied from the side of a substrate.

Organic EL Device

Figure 2:
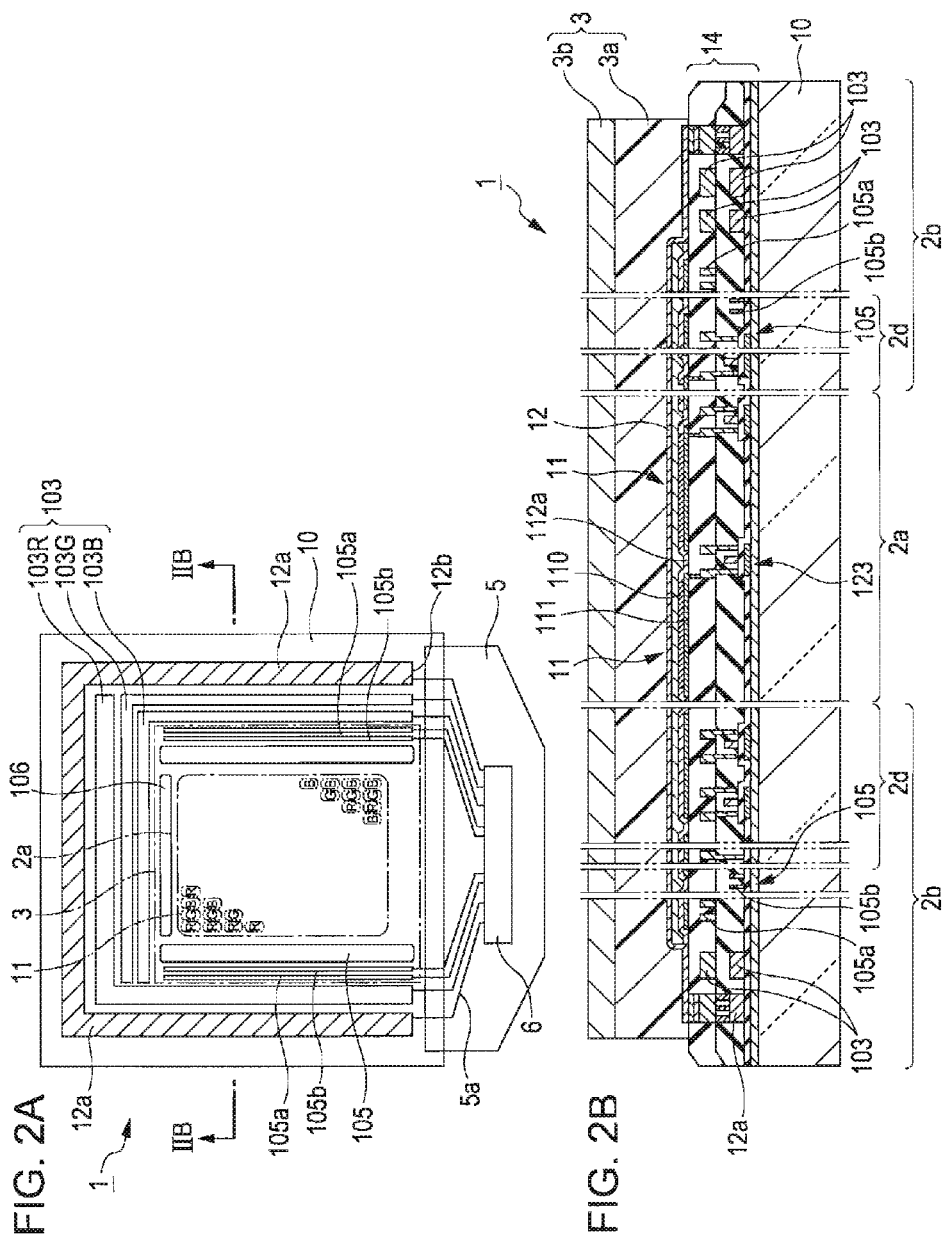
FIG. 2A is a plan view showing the schematic structure of the organic EL device.
FIG. 2B is a cross-sectional view taken along line IIB-IIB of the organic EL device shove in FIG. 2A.

FIG. 1 is an equivalent circuit diagram of a wiring structure of an organic EL device, which is a light-emitting device of this embodiment. FIG. 2A is a plan view showing the schematic structure of the organic EL device, and FIG. 2B is a cross-sectional view taken along line IIB-IIB of the organic EL device shown in FIG. 2A.

As shown in FIG. 1, an organic EL device 1 (light-emitting device) of this embodiment has a circuit configuration in which a plurality of scanning lines 101, a plurality of signal lines 102 extending in a direction perpendicular to the scanning lines 101, and a plurality of power supply lines 103 extending in a direction parallel to the signal lines 102 are arrayed. A pixel area A is provided in the vicinity of each intersection of the scanning lines 101 and the signal lines 102.

A data-side driving circuit 100 including a shift register, a level shifter, a video line, an analogue switch, and the like is connected to the signal lines 102. A scanning-side driving circuit 105 including a shift register, a level shifter, and the like is connected to the scanning lines 101. Furthermore, each pixel area A includes a thin-film transistor 114 for switching in which a scanning signal is supplied to a gate electrode through the scanning line 101, a storage capacitor (cap) for storing a pixel signal supplied from the signal line 102 through the thin-film transistor 112 for switching, a thin-film transistor 123 for driving in which the pixel signal stored by the storage capacitor (cap) is supplied to the gate electrode, ea pixel electrode 111 to which a driving current is supplied from the power supply line 103 when electrically connected to the power supply line 103 via the thin-film transistor 123 for driving, and a functional layer 110) disposed between the pixel electrode 111 and a negative electrode (counter electrode) 12. The pixel electrode 111, the negative electrode 12, and the functional layer 110 constitute a light-emitting element, e.g., an organic EL element.

According to the above structure, when the scanning line 101 is driven and the thin-film transistor 112 for switching enters an ON state, the electrical potential of the signal line 102 at that time is stored in the storage capacitor cap. The ON/OFF state of the thin-film transistor 123 for driving is determined in accordance with the state of the storage capacitor cap. A current flows from the power supply line 103 to the pixel electrode 111 through a channel of the thin-film transistor 123 for driving. Furthermore, a current flows to the negative electrode 12 through the functional layer 110. The functional layer 110 emits light in accordance with the amount of current flowing therethrough.

As shown in FIGS. 2A and 2B, the organic EL device 1 of this embodiment includes a transparent substrate 10 composed of glass or the like and a light-emitting element portion 11 including light-emitting elements arrayed on the substrate 10 in a matrix form. Each of the light-emitting elements includes a positive electrode, a functional layer, and a negative electrode. The functional layer includes a hole injection layer, a luminescent layer, an electron injection/transporting layer, and the like. The substrate 10 is a transparent substrate composed of, for example, glass and is divided into a display area 2a that is located at the center of the substrate 10 and a non-display area 2b located at the periphery of the substrate 10 and that is disposed outside the display area 2a. The display area 2a is formed by the light-emitting elements arrayed in a matrix form and is also referred to as an effective display area. The non-display area 2b is disposed outside the display area. A dumpy display area 2d adjacent to the display area 2a is provided in the non-display area 2b. As shown in FIG. 2B, a circuit element portion 14 is provided between the light-emitting element portion 11 and the substrate 10. This circuit element portion 14 includes the scanning lines 101, the signal lines 132, the storage capacitors, the thin-film transistors 112 for switching, the thin-film transistors 123 for driving, and the like. An end of the negative electrode 12 is connected to wiring 12a for the negative electrode, the wiring 12a being provided on the substrate 10. An end 12b of the wiring is connected to wiring 5a on a flexible substrate 5. The wiring 5a is connected to a drive IC 6 (driving circuit) provided on the flexible substrate 5.

As shown in FIGS. 2A and 2B, the above-described power supply lines 103 (103R, 103G, and 103B) are disposed on the non-display area 2b of the circuit element portion 14. The above-described scanning-side driving circuit 105 is provided on both sides of the display area 2a shown in FIG. 2A. These scanning-side driving circuits 105 are provided in the circuit element portion 14 on the lower side of the dummy display area 2d. Furthermore, control signal wiring 105a for the driving circuit and power supply wiring 105b for the driving circuit that are connected to the scanning-side driving circuits 105 are provided in the circuit element portion 14. Furthermore, an inspection circuit 106 is disposed on the upper side (the upper side in the drawings i.e., the side opposite the drive IC 6) of the display area 2a shown in FIG. 2A. Inspections of the quality and defects of the organic EL device in the course of the production or in shipping can be performed using the inspection circuit 106.

As shown in FIG. 2B, the light-emitting element portion 11 mainly includes the functional layer 110 laminated on each of the plurality of pixel electrodes 111 and an inorganic bank layer 112a that is provided on a planar region disposed between the pixel electrodes 111 and the functional layer 110 and that separates the functional layer 110 two-dimensionally. The negative electrode 12 is disposed on the functional layer 110. The pixel electrode 111, the functional layer 110, and the negative electrode 12 constitute a light-emitting element (e.g., an organic EL element). Each pixel electrode 111 is composed of, for example, ITO and is formed by patterning so as to have a substantially rectangular shape in plan view. The thickness of the pixel electrode 111 is preferably, for example, in the range of 50 to 200 nm, and about 150 nm is particularly preferable. The inorganic bank layer 112a (insulating layer) is provided between adjacent pixel electrodes 111.

As shown in FIG. 2B, a sealing portion 3 is provided on the light-emitting element portion 11. The sealing portion 3 includes a sealing resin 3a composed of a thermosetting resin, a UV curable resin, or the like applied on the negative electrode 12 and a sealing substrate 3b disposed on the sealing resin 3a. The sealing resin 3a is preferably a resin that does riot produce a gas, a solvent, or the like during curing. The sealing portion 3 is provided so as to cover at least the negative electrode 12. This sealing portion 3 prevents water or oxygen from intruding into the negative electrode 12 and the luminescent layer 110b and prevents oxidation of the negative electrode 12 and the luminescent layer 110b. The sealing substrate 3b is bonded to the sealing resin 3a to protect the sealing resin 3a. The sealing substrate 3b is preferably any one of a glass plate, a metal plate, and a resin plate. As described below, a can-sealing-type substrate is also preferred. A getter material may be placed in a recess so that the getter material adsorbs oxygen. Thus, oxidation of the components sealed inside can be prevented.

Figure 3:
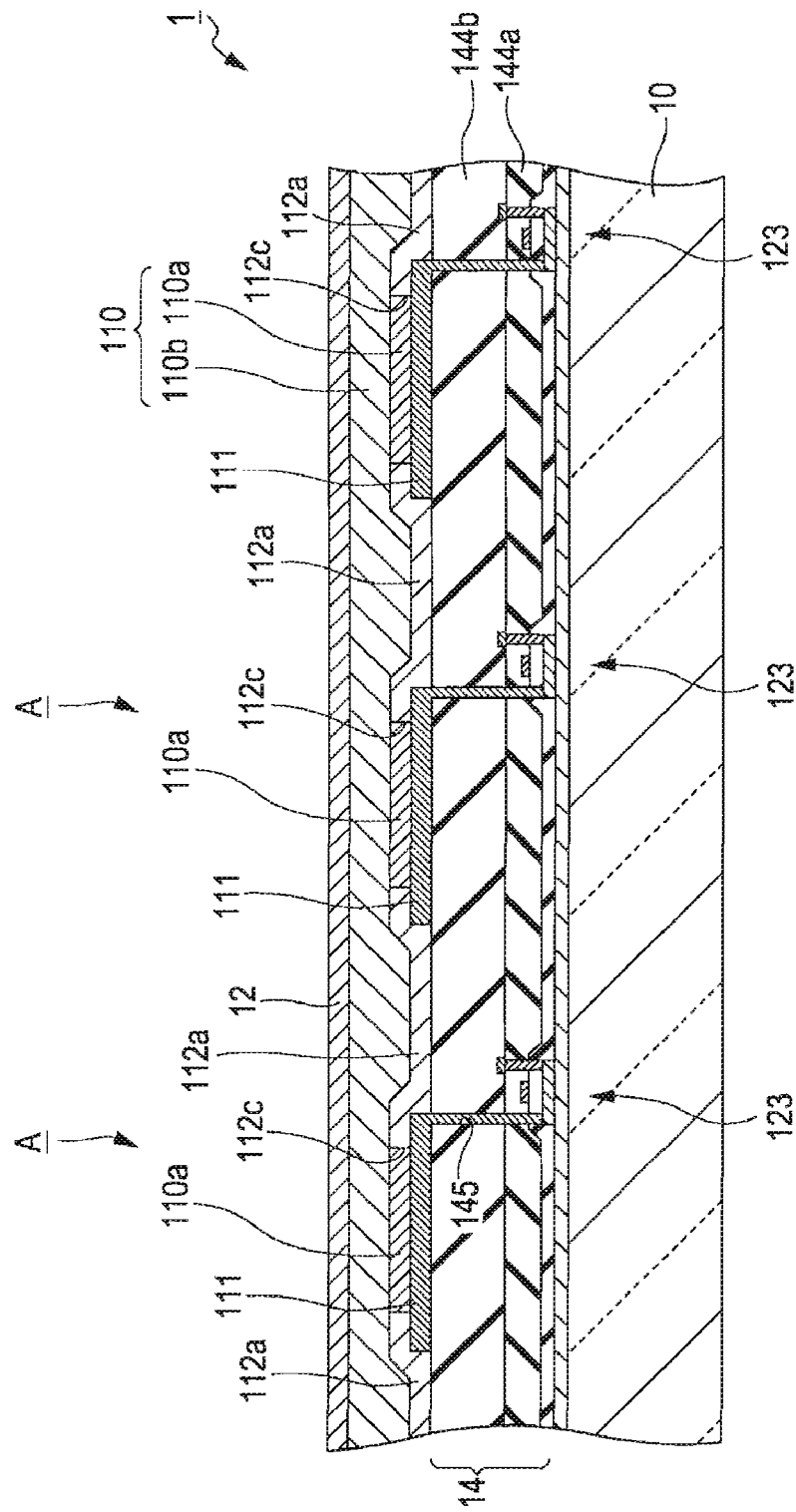
FIG. 3 is a cross-sectional view of the principal portion of the organic EL device.

FIG. 3 is an enlarged view of a light-emitting element of the organic EL device, and in particular, an enlarged view showing the cross-sectional structure of the display area. FIG. 3 shows three pixel areas A. The organic EL device 1 includes a substrate 10, a circuit element portion 14 that is provided on the substrate 10 and that includes circuits such as TFTs and the like, and a light-emitting element portion 11 that is provided on the circuit element portion 14 and that includes pixel electrodes (positive electrode) 111, a functioning layer 110 including a hole injection layer 110a and a luminescent layer 110b, and a negative electrode 12. The pixel electrode 111, the hole injection layer 110a, the luminescent layer 110b, and the negative electrode 12 constitute an organic EL element. In this organic EL device 1, light emitted from the functioning layer 110 to the side of the substrate 10 is transmitted through the circuit element portion 14 and the substrate 10 and is emitted to the lower side of the substrate 10 (the side of a viewer). In addition, light emitted from the functioning layer 110 to the opposite side of the substrate 10 is reflected by the negative electrode 12. The reflected light is transmitted through the circuit element portion 14 and the substrate 10 and is emitted to the lower side of the substrate 10 (the side of a viewer).

As shown in FIG. 3, an inorganic bank layer 112a controls the luminescent area and is provided between pixel electrodes 111 so as to separate the pixel electrodes 111 from each other. A part of the inorganic bank layer 112a is disposed on the periphery of each pixel electrode 111, and thus the inorganic bank layer 112a partly overlaps with the pixel electrode 114 in plan view. Accordingly, pixel openings 112c that are separated by the inorganic bank layer 112a are provided on the pixel electrodes 111. The ratio of the total area of the pixel openings 112c to the area of the display area is the opening ratio.

The inorganic bank layer 112a is composed of a material prepared by mixing a trace amount of carbon (C) with SiN. A continuous treatment including an oxygen gas plasma treatment and a plasma treatment with a fluorocarbon gas, or a plasma treatment with a mixed gas of the above gases is performed on the surface of the inorganic bank layer 112a. Accordingly, the surface of the inorganic bank layer 112a is provided with liquid repellency. The inorganic bank layer 112a may be formed of an inorganic material such as $SiO_2$, SiN, or $TiO_2$. In such a case, a single layer film composed of a silane coupling agent such as trimethoxysilane is provided on the surface of the inorganic bank layer 112a, and the surface of the inorganic bank layer 112a is provided with liquid repellency. Accordingly, the inorganic bank layer 112a has liquid repellency for a hole injection layer-forming material described below. On the other hand, the inorganic bank layer 112a has lyophilicity for a luminescent layer-forming material, in contrast with the case for the hole injection layer-forming material.

Preferably, the thickness of the inorganic bank layer 112a is substantially the same as the thickness of the target hole injection layer 110a. For example, the thickness of the inorganic bank layer 112a is preferably in the range of 30 to 200 nm and particularly preferably in the range of 50 to 100 nm. When the thickness is excessively small, a sufficient insulating property cannot be ensured. When the thickness is excessively large, it is difficult to form the insulating layer without cracks. A thickness exceeding 200 nm is not preferable because the flatness of the luminescent layer 110b described below, which is laminated on the hole injection layer 110a, cannot be ensured.

As shown in FIG. 3, the functioning layer 110 includes the hole injection layer 110a provided on each pixel electrode 111 and the luminescent layer 110b laminated on the hole injection layer 110a.

The hole injection layer 110a is provided on each pixel electrode 111 in the pixel openings 112c separated by the inorganic bank layer 112a. In this embodiment, the surface of the inorganic bank layer 112a has liquid repellency. Therefore, during the formation of the hole injection layer 110a by a liquid phase method, even if the hole injection layer-forming material is discharged onto the inorganic bank layer 112a, the material is repelled so as to be moved into the pixel, opening 112c and does not leak outside the pixel opening 112c. The hole injection layer 110a is formed so that the level of the top surface of the hole injection layer 110a is substantially the same as the level of the top surface of the inorganic bank layer 112a provided on the edge of the pixel electrode 111 by adjusting the discharging conditions such as the amount of material discharged. The level of the top surface of the hole injection layer 113a and the inorganic bank layer 112a is, for example, 50 nm from the surface of the pixel electrode 111. Accordingly, a continuous flat surface extending from the top surface of the inorganic bank layer 112a and the top surface of the hole injection layer 110a is formed.

A preferred example of the hole injection layer-forming material is a mixture of a polythiophene derivative such as polyethylenedioxythiophene (PEDOT) and polystyrene sulfonic acid or the like.

As shown in FIG. 3, the luminescent layer 110b is provided on the entire surface of the inorganic bank layer 112a and the hole injection layer 110a. Preferred examples of the polymer luminescent layer-forming material for the luminescent layer 110b include organic polymer materials such as polyfluorene (PF) derivatives, polyparaphenylene vinylene (PPV) derivatives, polyparaphenylene (PPP) derivatives, polyvinylcarbazole (PVK), polythiophene derivatives, and polysilanes, e.g., polymethylphenylsilane (PMPS). The thickness of the luminescent layer 110b is preferably, for example, in the range of 50 to 80 nm.

As shown in FIG. 3, the negative electrode 12 is provided on the entire surface of the luminescent layer 110b so as to face the pixel electrodes 111. This negative electrode 12 is formed by laminating, from the substrate 10 side, a calcium (Ca) layer and an aluminum (Al) layer in that order. The Al layer reflects light emitted from the luminescent layer 110b to the side of the substrate 10 (the side of a viewer). Instead of the Al layer, the layer may be preferably composed of, for example, a Ag layer or a laminated layer including an Al layer and a Ag layer. In order to efficiently emit light from the material of the luminescent layer 110b, a lithium fluoride (LiF) layer may be provided between the luminescent layer 110b and the Ca layer of the negative electrode 12. The thickness of the Ca layer is preferably, for example, in the range of 2 to 20 nm, and particularly preferably about 10 nm. The thickness of the Al layer is preferably, for example, in the range of 100 to 1,000 nm, and particularly preferably about 200 nm. Furthermore, a protective layer for preventing oxidation, the protective layer being composed of SiO, $SiO_2$, SiN, or the like, may be provided on the Al layer Method of Producing Organic EL Device A method of producing an organic EL device according to a first embodiment will now be described with reference to FIGS. 4 to 7. Since TFTs and the like are produced by a known method, a description of the production process is omitted.

Step of Forming Bank Layer

Figure 4:
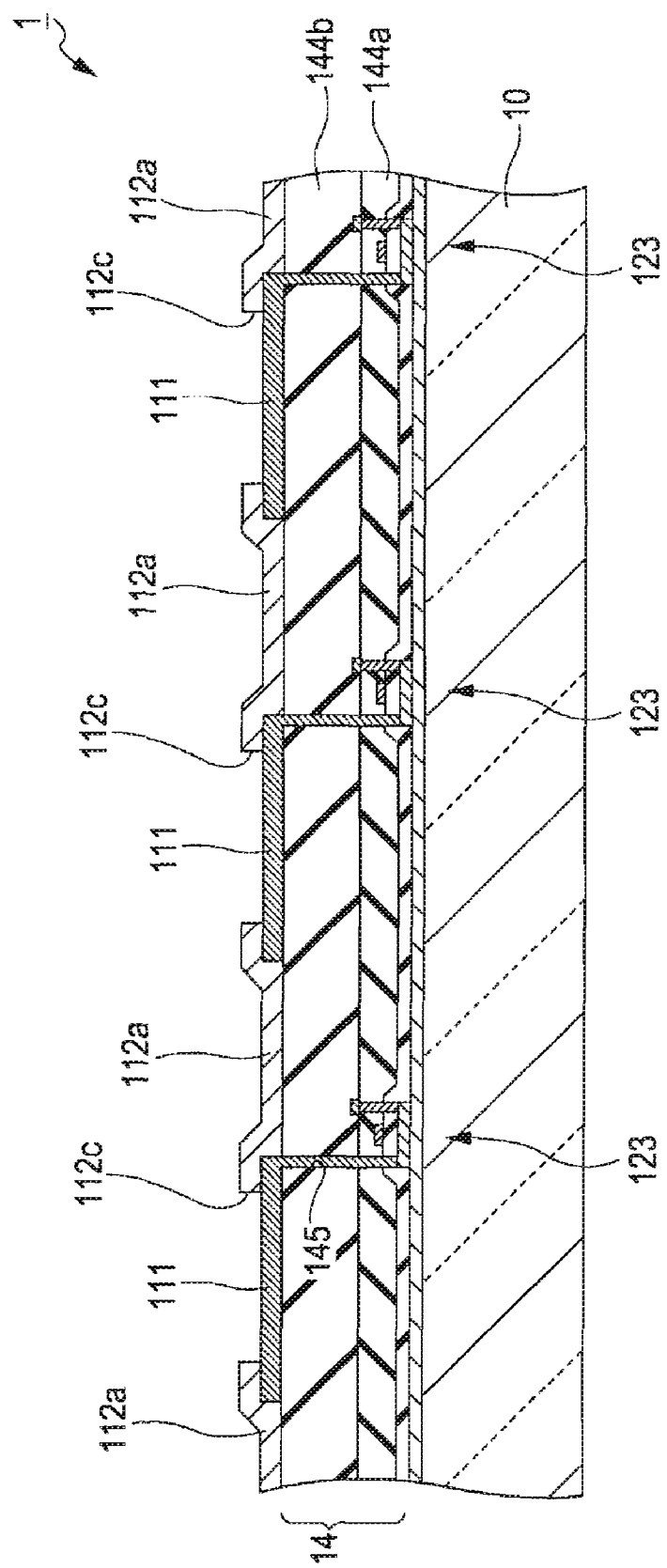
FIG. 4 is a cross-sectional view showing a step of producing an organic EL device according to a first embodiment.

First, an insulating layer, which becomes an inorganic bank layer, is formed on the entire surface of a second interlayer insulation film 144b including pixel electrodes 111 by chemical vapor deposition (CELL) using a material prepared by mixing a trace amount of material containing carbon (C) with a material containing silicon (Si) and nitrogen (N) A photosensitive resist is then applied on the entire surface of the insulating layer. The photosensitive resist is then processed by photolithography using a mask in which areas of the resist at positions corresponding to pixel openings 112c on the pixel electrodes 111 are opened. Accordingly, the photosensitive resist is patterned so as to have a predetermined shape. Subsequently, the insulating layer is etched using the patterned photosensitive resist as a mask. Consequently, as shown in FIG. 4, an inorganic bank layer 112a which separates the pixel electrodes 111 and a part of which is provided on the periphery of each pixel electrode 111 is formed on a circuit element portion 14. The thickness of the inorganic bank layer 112a is preferably in the range of 30 to 200 nm, and particularly preferably 50 nm. A liquid-repellency-providing treatment is performed on the surface of the inorganic bank layer 112a by performing an oxygen gas plasma treatment and a plasma treatment using tetrafluoromethane as a process gas ($CF_4$ plasma treatment). Alternatively, a plasma treatment may be performed with a process gas in which oxygen gas is mixed in a fluorine compound gas atmosphere. Accordingly, the liquid repellency of the surface of the inorganic bank layer 112a can be adjusted.

Step of Forming Hole Injection Layer

Figure 5:
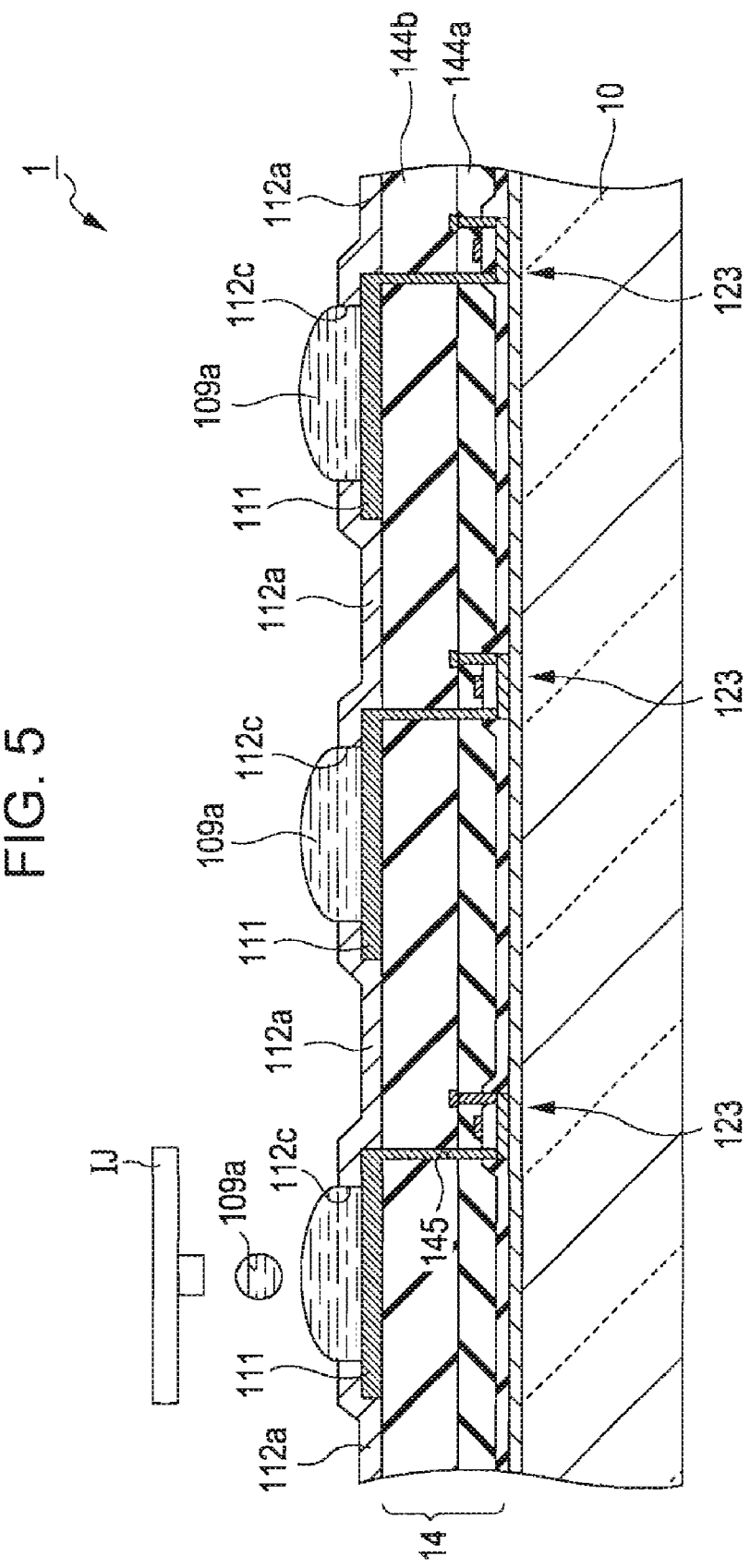
FIG. 5 is a cross-sectional view showing a step of producing the organic EL device according to the first embodiment.

Next, as shown in FIG. 5, a hole injection layer-forming material 109a prepared by adding a solvent, such as diethylene glycol, to an aqueous dispersion liquid containing a mixture of PEDOT/PSS (PEDOT:PSS=1:6 or 1:20) is discharged from an ink jet apparatus IJ into the pixel openings 112c separated by the inorganic bank layer 112a. In this case, the liquid-repellency-providing treatment has already been performed on the surface of the inorganic bank layer 112a. The angle of contact between the surface of the inorganic bank layer 112a and the hole injection layer-forming material 109a is about 80°. Accordingly, even if the hole injection layer-forming material 109a to be discharged into the pixel openings 112c of the inorganic bank layer 112a is discharged onto the top surface of the inorganic bank layer 112a, the hole injection layer-forming material 109a is repelled and flows into the pixel, openings 112c.

In this embodiment, the amount of discharge of the hole injection layer-forming material 109a discharged from the ink jet apparatus IJ and the solid content of PEDOT/PSS or the like contained in the solvent of the hole injection layer-forming material 109a to be discharged are controlled. Accordingly, a hole injection layer 110a can be formed so that the level of the top surface of the inorganic bank layer 112a provided on the periphery of the pixel electrode 111 is the same as the level of the top surface of the hole injection layer 110a obtained by drying the discharged hole injection layer-forming material 109a.

Drying Step

Figure 6:
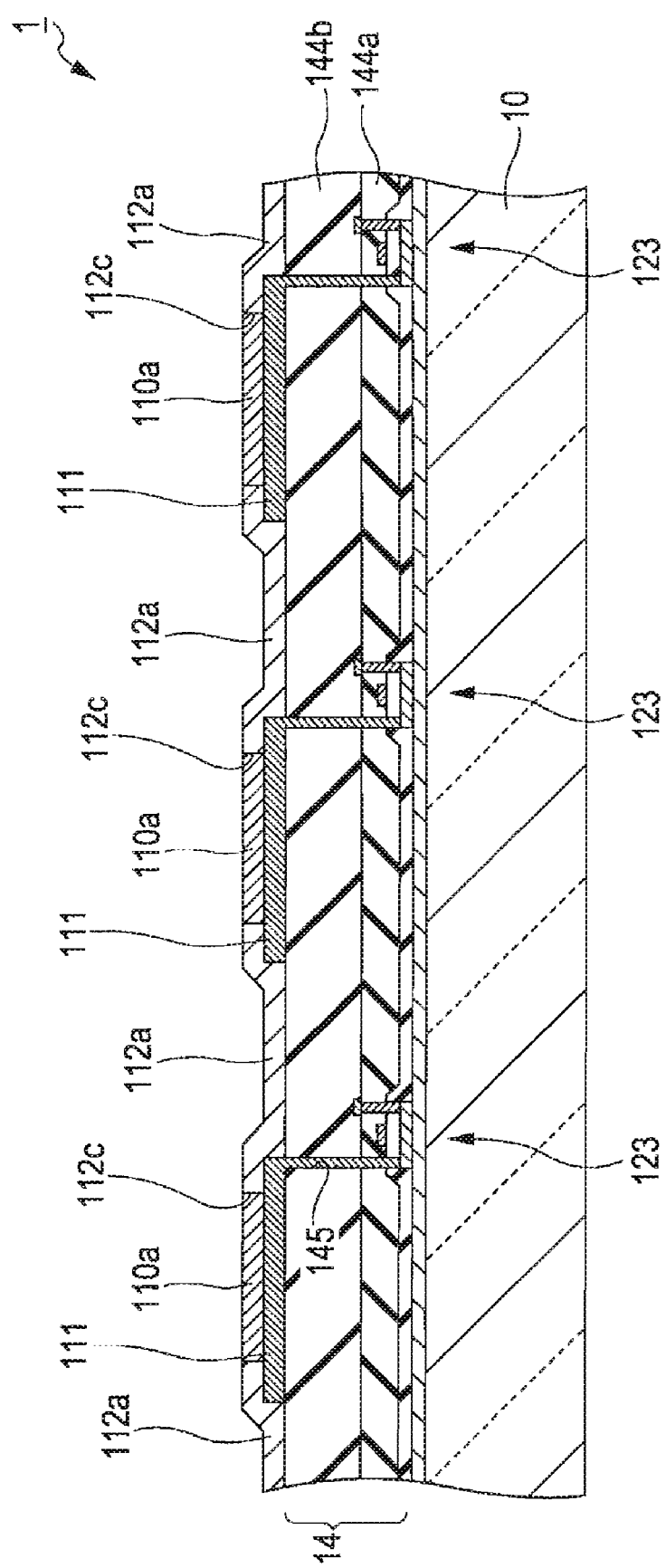
FIG. 6 is a cross-sectional view showing a step of producing the organic EL device according to the first embodiment.

Next, as shown in FIG. 6, the solvent contained in the discharged hole injection layer-forming material is vaporized by a drying process. Accordingly, the hole injection layer 110a is formed on each pixel electrode 111 in the pixel openings 112c separated by the inorganic bank layer 112a. More specifically, the discharged hole injection layer-forming material is dried under vacuum and then dried in the atmospheric pressure at 200° C. for 10 minutes. By performing this drying process, as shown in FIG. 6, the hole injection layer 110a in which the level of the top surface is the same level as that of the top surface of the inorganic bank layer 112a provided on the periphery of each pixel electrode 111 can be formed. Furthermore, since the liquid-repellency-providing treatment has already been performed on the surface of the inorganic bank layer 112a, the hole injection layer 110a is not formed on the inorganic bank layer 112a, and a continuous flat surface extending from the top surface of the inorganic bank layer 112a and the top surface of the hole injection layer 110a is formed.

Step of Forming Luminescent Layer

Next, a luminescent layer-forming material is applied on the entire surface of the inorganic bank layer 112a and the hole injection layer 110a by a spin-coating method. Examples of the luminescent layer-forming material include polyfluorene (PF) derivatives, polyparaphenylene vinylene (CPV) derivatives, polyvinylcarbazole, and a mixture of CBP and Ir(ppy)$_3$ (an iridium complex). Solutions prepared by dissolving these luminescent layer-forming materials in xylene or toluene can be suitably used as coating solutions.

As described above, the surface of the inorganic bank layer 112a has liquid repellency. However, since the coating solution for forming the luminescent layer contains an aromatic material such as xylene, in the coating solution of the luminescent layer-forming material, the wettability of the luminescent layer-forming material to the surface of the inorganic bank layer 112a is better than that of the hole injection layer-forming material 109a. More specifically, the angle of contact between the surface of the hole injection layer 110a and the coating solution of the luminescent layer-forming material is about 30°. The angle of contact between the surface of the inorganic bank layer 119a and the coating solution of the luminescent layer-forming material is about 40°. Accordingly, the angle of contact between the top surface of the hole injection layer 110a and the coating solution of the luminescent layer-forming material is substantially the same as the angle of contact between the top surface of the inorganic bank layer 112a and the coating solution of the luminescent layer-forming material.

Figure 7:
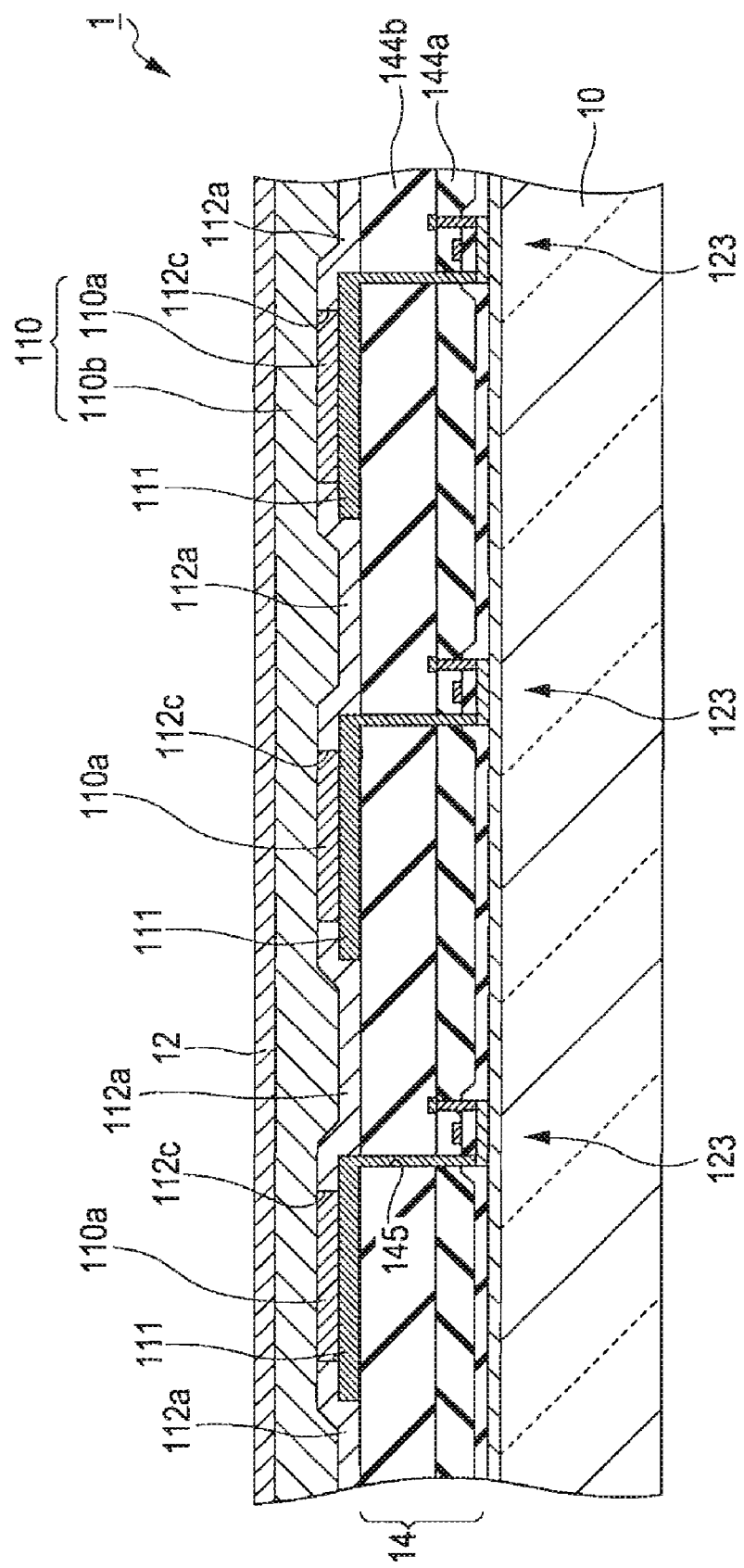
FIG. 7 is a cross-sectional view showing a step of producing the organic EL device according to the first embodiment.

Accordingly, as shown in FIG. 7, a luminescent layer 110b is formed on the entire surface of the inorganic bank layer 112a and the hole injection layer 110a by the spin-coating method. More specifically, after the layer is formed by spin coating, annealing is performed in an inert atmosphere at 130° C. for 60 minutes. Accordingly, the uniform and flat luminescent layer 110b having a thickness of, for example, 80 nm can be formed. In addition to the spin-coating method, the luminescent layer may be formed by another coating method such as dip coating, nozzle coating, blade coating, or the like.

Step of Forming Negative Electrode

Next, as shown in FIG. 7, a Ca layer and an Al layer are sequentially laminated on the entire surface of the luminescent layer 110b by vacuum heating vapor deposition to form a negative electrode 12 including these laminated layers. As described above, a LiF layer may be formed under the Ca layer. In order to prevent oxidation, a protective layer composed of $SiO_2$, SiN, or the like may be preferably formed on the negative electrode 12.

Finally, as shown in FIG. 2B, a sealing resin 3a composed of a thermosetting resin or a UV curable resin is applied on the entire surface of the negative electrode 17. A sealing substrate 3b is then laminated on the sealing resin 3a to form a sealing portion 3. This sealing step is preferably performed in an atmosphere of an inert gas such as nitrogen, argon, or helium. The organic EL device 1 according to the first embodiment can be produced by the above method.

In this embodiment, a hole-transporting layer is omitted, but the hole-transporting layer may be formed between the hole injection layer 110a and the luminescent layer 110b. A triphenylamine polymer can be used as the material of the hole-transporting layer. In such a case, since holes can be injected into the luminescent layer 110b more efficiently, excellent luminous efficiency and lifetime can be achieved.

According to this embodiment, the inorganic bank layer 112a provided on the periphery of each pixel electrode 111 has liquid repellency for the hole injection layer 110a. Therefore, the material for forming the hole injection layer 110a discharged on the inorganic bank layer 112a is repelled and lows into the pixel openings 112c separated by the inorganic bank layer 112a. In addition, the level of the top surface of the hole injection layer 110a is substantially the same as the level of the top surface of the inorganic bank layer 112a. Accordingly, the material for forming the hole injection layer 110a is controlled so that the material does not leak onto the inorganic bank layer 112a. Consequently, the hole inject ion layer 110a is formed only on the pixel electrodes 111 in the pixel openings 112c separated by the inorganic bank layer 112a and is not formed on the inorganic bank layer 112a disposed outside the pixel openings 112c (i.e., between adjacent pixels). Accordingly, the generation of cross talk due to a phenomenon in which holes in the hole injection layer 110a provided on each pixel electrode 111 flow to adjacent pixels can be suppressed. Consequently, a degradation of display quality, for example, blurring of the outline of luminous shapes of objects being displayed caused by a flow of a current to adjacent pixels, can be prevented.

According to this embodiment, since the level of the top surface of the inorganic bank layer 112a is substantially the same as the level of the top surface of the hole injection layer 110a, the top surface of the inorganic bank layer 112a and the top surface of the hole injection layer 110a form a continuous flat surface. Accordingly, the luminescent layer 110b formed on the inorganic bank layer 112a and the hole injection layer 110a is a flat layer having a uniform thickness. As a result, a uniform light emission without unevenness of luminance can be achieved.

According to this embodiment, the surface of the inorganic bank layer 112a has liquid repellency. Therefore, even when an ink jet apparatus is used, the hole injection layer 110a can be selectively formed without leaking the material for forming the hole injection layer 110a outside the pixel openings 112c separated by the inorganic bank layer 112a. Accordingly, by using the ink jet apparatus, wastage of the material can be suppressed, and the hole injection layer 110a can be formed with high accuracy and at low cost.

Furthermore, according to this embodiment, since the top surface of the inorganic bank layer 112a and the top surface of the hole injection layer 110a form a continuous flat surface, the luminescent layer 110b can be formed by a simple spin-coating method. Accordingly, the flat luminescent layer 110b having a uniform thickness can be easily formed.

Second Embodiment

A second embodiment of the invention will now be described with reference to FIGS. 8 to 10. This embodiment differs from the first embodiment in the method of performing a liquid-repellency-providing treatment on the inorganic bank layer 112a. The other basic structure and the production method of the organic EL device are the same as those of the first embodiment. The common constituent elements are assigned the same reference numerals, and the detailed description of those elements is omitted.

Figure 8:
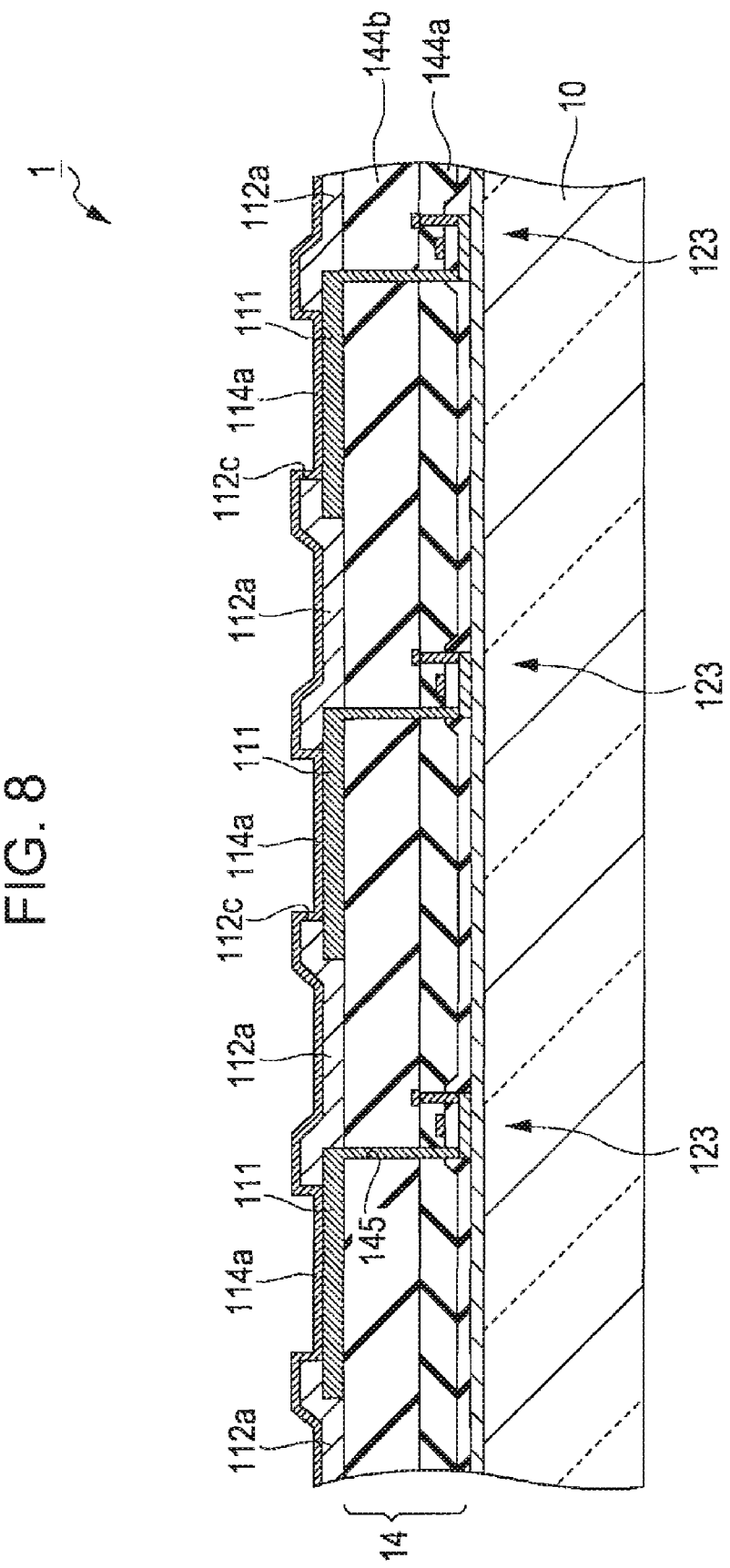
FIG. 8 is a cross-sectional view showing a step of producing an organic EL device according to a second embodiment.

As shown in FIG. 8, a silane coupling agent 114a such as trimethoxysilane is formed on the entire surface of the inorganic bank layer 112a and the pixel electrodes 111 by a gas-phase method or a dipping method. In this step, the wettability of the surface layer of the inorganic bank layer 112a can be controlled by appropriately selecting the type of terminal functional group of the silane coupling agent used.

Figure 9:
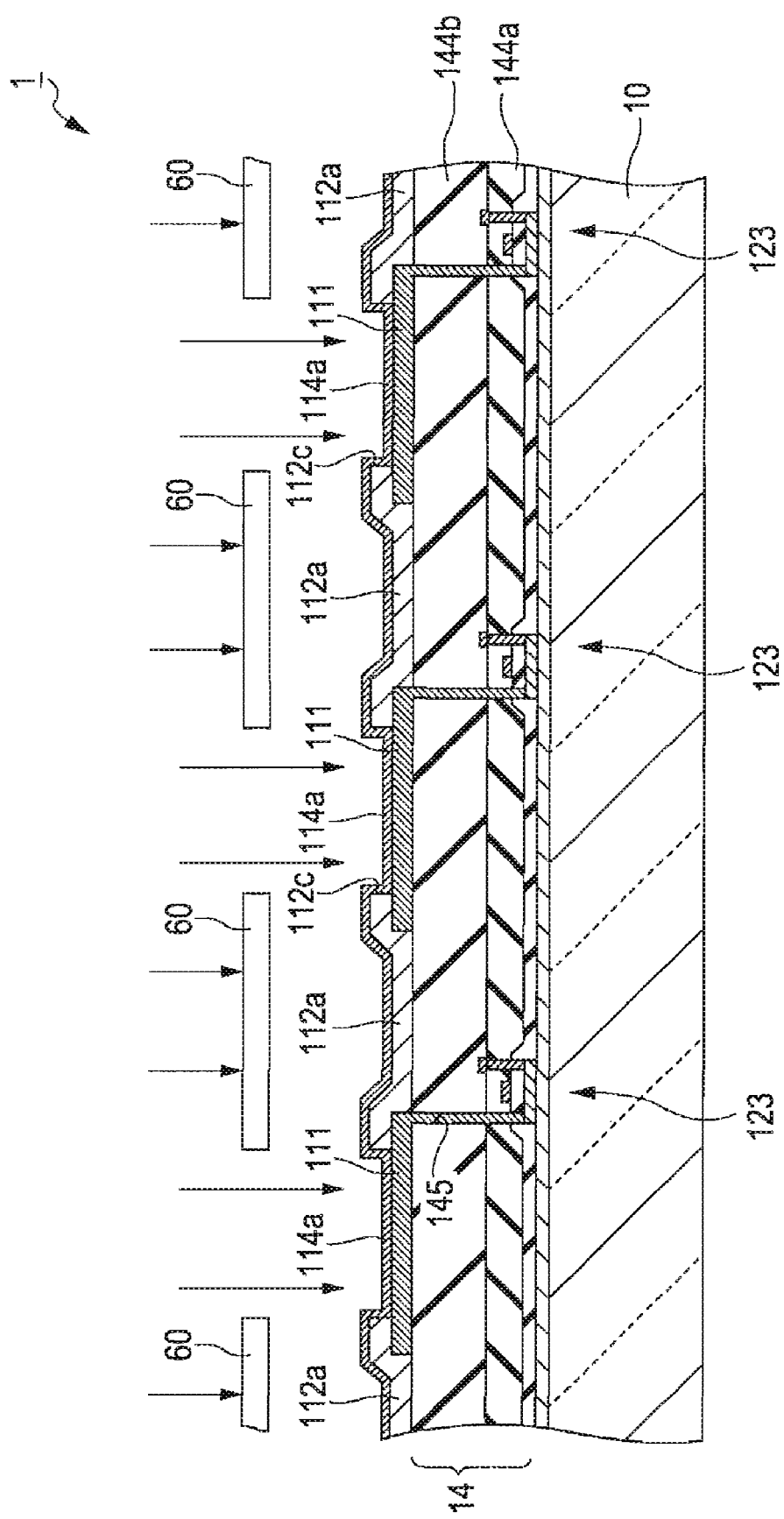
FIG. 9 is a cross-sectional view showing a step of producing the organic EL device according to the second embodiment.
Figure 10:
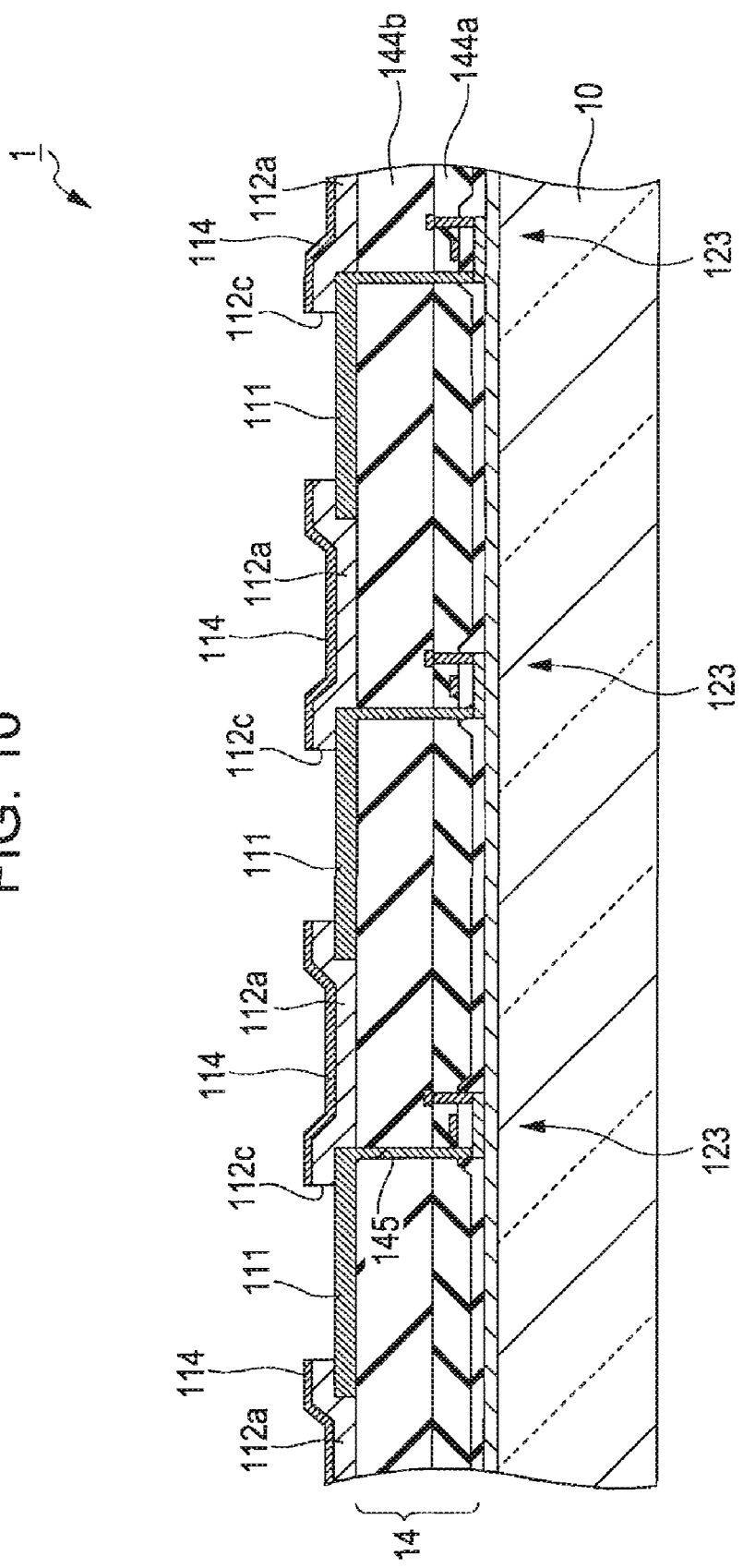
FIG. 10 is a cross-sectional view showing a step of producing the organic EL device according to the second embodiment.

Next as shown in FIG. 9, a mask 60 in which planar regions corresponding to the pixel openings 112c are opened is placed on the inorganic bank layer 112a. The silane coupling agent 114a formed on the inorganic bank layer 112a and the pixel electrodes 111 is then irradiated with ultraviolet rays through the mask 60.

By this irradiation, the ultraviolet rays passed through the mask 60 enter the silane coupling agent 114a. Consequently, as shown FIG. 10, the silane coupling agent formed on the pixel openings 112c, more specifically, formed on the top surface of the pixel electrodes 111 and the side faces of the inorganic bank layer 112a is removed. A single layer film 114 composed of the silane coupling agent is formed on the top surface of the inorganic bank layer 112a, thus providing liquid repellency to the surface of the inorganic bank layer 112a. In contrast, since the silane coupling agent is removed from the top surface of the pixel electrodes 111 in the pixel openings 112c and the side faces of the inorganic bank layer 112a, these surfaces are lyophilic compared with the top surface of the inorganic bank layer 112a having the single layer film 114 thereon.

Exposure Unit

A description will now be made of an exposure unit including the organic EL device 1 (exposure head) described in the above embodiment. Organic EL, elements arrayed in a zigzag shape are used in the exposure head.

Figure 11:
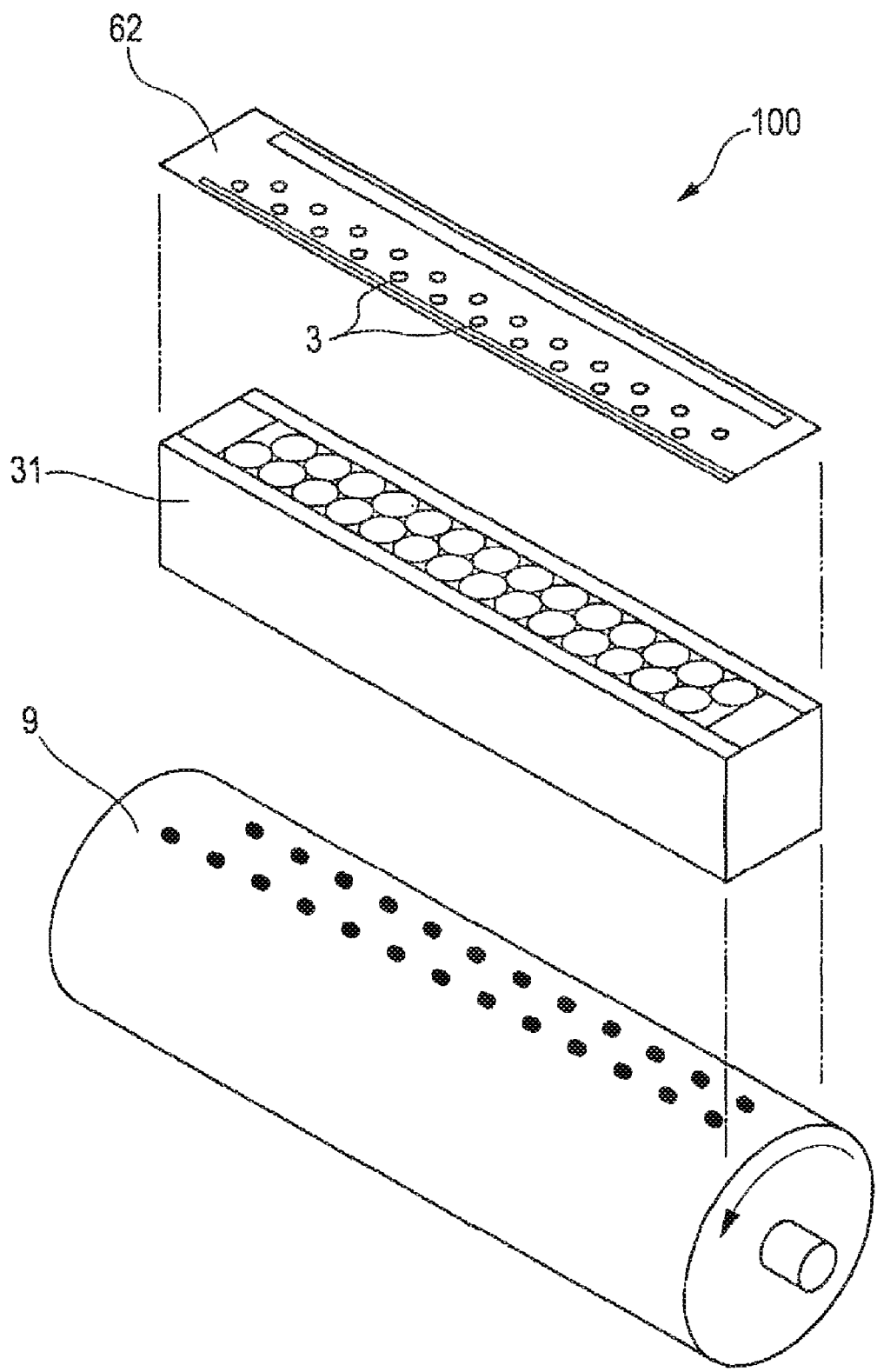
FIG. 11 is a perspective view showing the schematic structure of an exposure unit.
Figure 12:
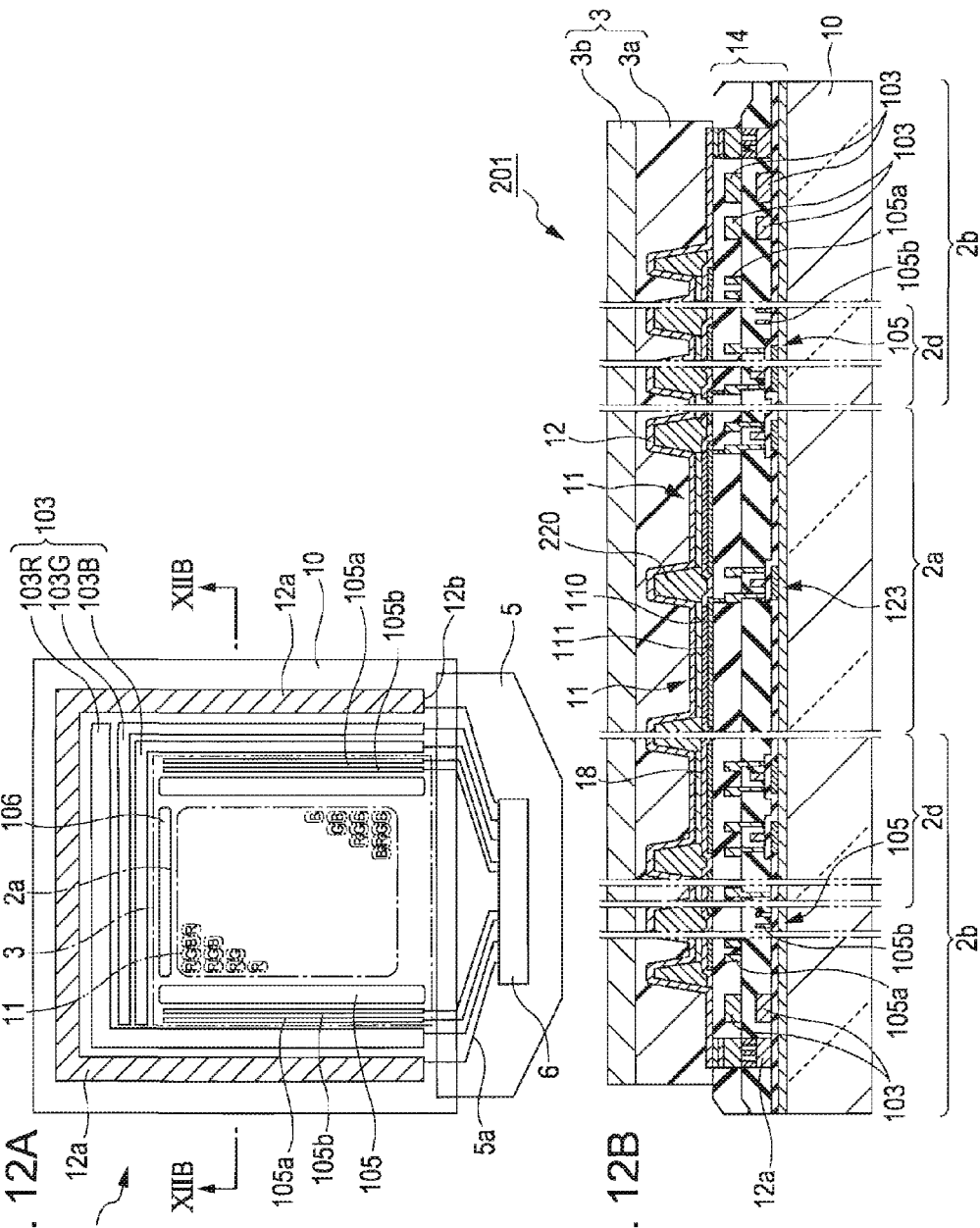
FIG. 12A is a plan view snowing the schematic structure of an organic EL device according to a third embodiment.
FIG. 12B is a cross-sectional view taken along line XIIB-XIIB of the organic EL device shown in FIG. 12A.

FIG. 11 is a perspective view showing the schematic structure of an exposure unit 100. As shown in FIG. 11, the exposure unit 100 includes an exposure head 62, a lens array 31 for focusing light from the exposure head 62, and a photoconductive drum 9 that is exposed by the light that is emitted from the exposure head 62 and passed through the lens array 31. Since this exposure unit 100 includes the above organic EL device as the exposure head 62, a high-quality exposure unit 100 without unevenness of luminance can be provided.

Third Embodiment

A third embodiment of the invention will now be described with reference to the drawings. In FIGS. 12 to 22, the scales at which each layer and each component are reproduced are different from those of the actual layers and components so that each layer and each component have a size enabling easy recognition in the drawings. An organic EL device of this embodiment is a bottom emission-type organic EL device in which light emitted in a luminescent layer is supplied from the side of a substrate.

Organic EL Device

FIG. 12A is a plan view showing the schematic structure of an organic EL device of this embodiment, and FIG. 12B is a cross-sectional view taken along line XIIB-XIIB of the organic EL device shown in FIG. 12A.

As shouts in FIG. 1, an organic EL device 201 (light-emitting device) of this embodiment has a circuit configuration in which a plurality of scanning lines 101, a plurality of signal lines 102 extending in a direction perpendicular to the scanning lines 101, and a plurality of power supply lines 103 extending in a direction parallel to the signal lines 102 are arrayed. A pixel area A is provided in the vicinity of each intersection of the scanning lines 101 and the signal lines 102.

A data-side driving circuit 100 including a shift register, a level shifter, a video line, an analogue switch, and the like is connected to the signal lines 102. A scanning-side driving circuit 105 including a shift register, a level shifter, and the like is connected to the scanning lines 101. Furthermore, each pixel area A includes a thin-film transistor 112 for switching in which a scanning signal is supplied to a gate electrode through the scanning line 101, a storage capacitor (cap) for storing a pixel signal supplied from the signal line 102 through the thin-film transistor 112 for switching, a thin-film transistor 123 for driving in which the pixel signal stored by the storage capacitor (cap) is supplied to the gate electrode, a pixel electrode 111 to which a driving current is supplied from the power supply line 103 when electrically connected to the power supply line 103 via the thin-film transistor 123 for driving, and a functional layer 110 disposed between the pixel electrode 111 and a negative electrode (counter electrode) 12. The pixel electrode 111, the negative electrode 12, and the functional layer 110 constitute a light-emitting element, e.g., an organic EL element.

According to the above structure. When the scanning line 101 is driven and the thin-film transistor 112 for switching enters an ON state, the electrical potential of the signal line 102 at that time is stored in the storage capacitor cap. The ON/OFF state of the thin-film transistor 123 for driving is determined in accordance with the state of the storage capacitor cap. A current flows from the power supply line 103 to the pixel electrode 111 through a channel of the thin-film transistor 123 for driving. Furthermore, a current flows to the negative electrode 12 through the functional layer 110. The functional layer 110 emits light in accordance with the amount of current flowing therethrough.

As shown in FIGS. 12A and 12B, the organic EL device 201 of this embodiment includes a transparent substrate 10 composed of glass or the like and a light-emitting element portion 11 including light-emitting elements arrayed on the substrate 10 in a matrix form. Each of the light-emitting elements includes a positive electrode, a functional layer, and a negative electrode. The functional layer includes a hole injection layer, a luminescent layer, an electron injection/transporting layer, and the like. The substrate 10 is a transparent substrate composed of, for example, glass and is divided into a display area 2a that is located at the center of the substrate 10 and a non-display area 2b located at the periphery of the substrate 10 and that is disposed outside the display area 2a. The display area 2a is formed by the light-emitting elements arrayed in a matrix form and is also referred to as an effective display area. The non-display area 2b is disposed outside the display area. A dummy display area 2d adjacent to the display area 2a is provided in the non-display area 2b. As shown in FIG. 12B, a circuit element portion 14 is provided between the light-emitting element portion 11 and the substrate 10. This circuit element portion 14 includes the scanning lines 101, the signal lines 102, the storage capacitors, the thin-film transistors 112 for switching, the thin-film transistors 123 for driving, and the like. An end of the negative electrode 12 is connected to wiring 12a for the negative electrode, the wiring 12a being provided on the substrate 10. An end 12b of the wiring is connected to wiring 5a on a flexible substrate 5. The wiring 5a is connected to a drive IC 6 (driving circuit) provided on the flexible substrate 5.

As shown in FIGS. 12A and 12B, the above-described power supply lines 103 (103R, 103G, and 103B) are disposed on the non-display area 2b of the circuit element portion 14. The above-described scanning-side driving circuit 105 is provided on both sides of the display area 2a shown in FIG. 12A. These scanning-side driving circuits 105 are provided in the circuit element portion 14 on the lower side of the dummy display area 2d. Furthermore, control signal wiring 105a for the driving circuit and power supply wiring 105b for the driving circuit that are connected to the scanning-side driving circuits 105 are provided in the circuit element portion 14. Furthermore, an inspection circuit 106 is disposed on the upper side (the upper side in the drawing, i.e., the side opposite the drive IC 6) of the display area as shown in FIG. 12A. Inspections of the quality and defects of the organic EL device in the course of the production or in shipping can be performed using the inspection circuit 106.

As shown in FIG. 12B, the light-emitting element portion 11 mainly includes the functional layer 110 laminated on each of the plurality of pixel electrodes 111 and an inorganic bank layer 18 (first barrier) that is provided on a planar region disposed between the pixel electrodes 111 and the functional layer 110 and that separates the functional layer 110 two-dimensionally. The negative electrode 12 is disposed on the functional layer 110. The pixel electrode 111, the functional layer 110, and the negative electrode 12 constitute a light-emitting element (e.g., an organic EL element). Each pixel electrode 111 is composed of, for example, ITO and is formed by patterning so as to have a substantially rectangular shape in plan view. The thickness of the pixel electrode 111 is preferably, for example, in the range of 50 to 200 nm, and about 150 nm is particularly preferable. The inorganic bank layer 18 (first barrier) is provided between adjacent pixel electrodes 111.

As shown in FIG. 12B, a sealing portion 3 is provided on the light-emitting element portion 11. The sealing portion 3 includes a sealing resin 3a composed of a thermosetting resin, a UV curable resin, or the like applied on the negative electrode 12 and a sealing substrate 3b disposed on the sealing resin 3a. The sealing resin 3a is preferably a resin that does not produce a gas, a solvent, or the like during curing. The sealing portion 3 is provided so as to cover at least the negative electrode 12. This sealing portion 3 prevents water or oxygen from intruding into the negative electrode 12 and the luminescent layer 110b and prevents oxidation of the negative electrode 12 and the luminescent layer 110b. The sealing substrate 3b is bonded to the sealing resin 3a to protect the sealing resin 3a. The sealing substrate 3b is preferably any one of a glass plate, a metal plate, and a resin plate. As described below, a can-sealing-type substrate is also preferred. A getter material may be placed in a recess so that the getter material adsorbs oxygen. Thus, oxidation of the components sealed inside can be prevented.

Figure 13:
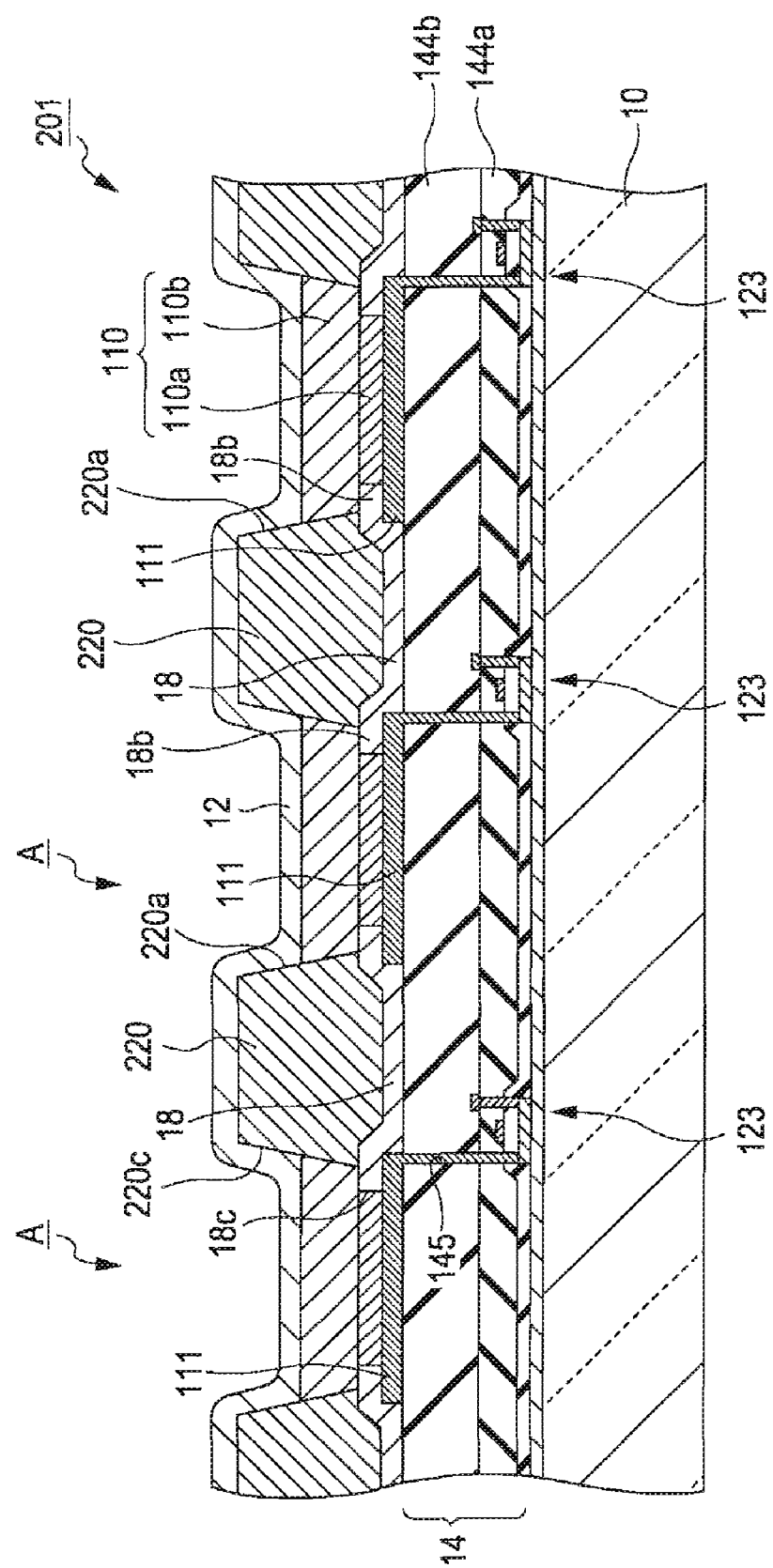
FIG. 13 is a cross-sectional view of the principal portion of the organic EL device.

FIG. 13 is an enlarged view of a light-emitting element of the organic EL device, and in particular, an enlarged view snowing the cross-sectional structure of the display area. FIG. 13 shows three pixel areas A. The organic EL device 201 includes a substrate 10, a circuit element portion 14 that is provided on the substrate 10 and that includes circuits such as TFT's and the like, and a light-emitting element portion 11 that is provided on the circuit element portion 14 and that includes pixel electrodes (positive electrode) 111, a functioning layer 110 including a hole injection layer 110a and a luminescent layer 110b, and a negative electrode 12. The pixel electrode 111 the hole injection layer 110a, the luminescent layer 110b, and the negative electrode 12 constitute an organic EL element. In this organic EL device 201, light emitted from the functioning layer 110 to the side of the substrate 10 is transmitted through the circuit element portion 14 and the substrate 10 and is emitted to the lower side of the substrate 10 (the side of a viewer) in addition, light emitted from the functioning layer 110 to the opposite side of the substrate 10 is reflected by the negative electrode 12. The reflected light is transmitted through the circuit element portion 14 and the substrate 10 and is emitted to the lower side of the substrate 10 the side of a viewer).

As shown in FIG. 13, an inorganic bank layer 18 controls the luminescent area and is provided between pixel electrodes 111 so as to separate the pixel electrodes 111 from each other. A part of the inorganic bank layer 18 is disposed on the periphery of each pixel electrode 111, and thus the inorganic bank layer 18 partly overlaps with the pixel electrode 111 in plan view. Pixel openings 18c that are separated by the inorganic bank layer 18 are provided on the pixel electrodes 111.

The ratio of the total area of the pixel openings 18c to the area of the display area is the opening ratio. The thickness of the inorganic bank layer 18 is preferably, for example, in the range of 30 to 200 nm, and in particular, in the range of 50 to 100 nm.

The inorganic bank layer 18 is composed of a material prepared by mixing a trace amount of carbon (C) with SiN. A plasma treatment is performed on the surface of the inorganic bank layer 18. Accordingly, the surface of the inorganic bank layer 18 is provided with liquid repellency. The inorganic bank layer 18 may be formed of an inorganic material such as $SiO_2$, $TiO_2$, or SiN. In such a case, a single layer film composed of a silane coupling agent such as trimethoxysilane is provided on the surface of the inorganic bank layer 18, and the surface of the inorganic bank layer 18 is provided with liquid repellency. Accordingly, the inorganic bank layer 18 has liquid repellency for a hole injection layer-forming material described below. On the other hand, the inorganic bank layer 18 has lyophilicity for a luminescent layer-forming material, in contrast with the case for the hole injection layer-forming material.

As shown in FIG. 13, an organic bank layer 220 (second barrier) is provided on the inorganic bank layer 18. In consideration of the accuracy of photolithography, the organic bank layer 220 is provided inside the periphery of the inorganic bank layer 18 so that a certain space is formed between the side face of the organic bank layer 220 and the periphery of the inorganic bank layer 18. Consequently, a protrusion 18b protruding from a side face 220a of the organic bank layer 220 is provided at the periphery of the inorganic bank layer. The organic bank layer 220 includes inclined planes that make an acute angle with the surface of the substrate 10 so as to have a trapezoidal cross section. A liquid-repellency-providing treatment is performed on the side faces 220a of the organic bank layer 220.

As shown in FIG. 13, the functioning layer 110 includes the hole injection layer 110a provided on each pixel electrode 111 and the luminescent layer 110b laminated on the hole injection layer 110a.

The hole injection layer 110a is provided on each pixel electrode 111 in the pixel openings 18c separated by the inorganic bank layer 18. In this embodiment, a liquid-repellency-providing treatment is performed on the surface of the inorganic bank layer 18. Therefore, during the formation of the hole injection layer 110a by a liquid phase method, even if the hole injection layer-forming material is discharged onto the inorganic bank layer 18, the material is repelled so as to be moved into the pixel opening 18c and does not leak outside the pixel opening 18c. The hole injection layer 110a is formed so that the level of the top surface of the hole injection layer 110a is substantially the same as the level of the top surface of the inorganic bank layer 18 (protrusion 18b) provided on the edge of the pixel electrode 111 by adjusting the discharging conditions such as the amount of material discharged. Accordingly, a continuous flat surface extending from the top surface of the inorganic bank layer 18 and the top surface of the hole injection layer 110a is provided.

A preferred example of the hole injection layer-forming material is a mixture of a polythiophene derivative such as polyethylenedioxythiophene (PEDOT) and polystyrene sulfonic acid or the like.

As shown in FIG. 13, the luminescent layer 110b is provided on the entire surface of the hole injection layer 110a in each opening 220c separated by the organic bank layer 220. The luminescent layer 110b includes three types of luminescent layer, i.e., a red luminescent layer that emits red (R) light, a green luminescent layer that emits green (G) light, and a blue luminescent layer that emits blue (B) light. These luminescent layers are arranged in a stripe shape. Preferred examples of the polymer luminescent layer-forming material for the luminescent layer 110b include organic polymer materials such as polyfluorene (PF) derivatives, polyparaphenylene vinylene (PPV) derivatives, polyparaphenylene (PPP) derivatives, polyvinylcarbazole (PVK), polythiophene derivatives, and polysilanes, e.g., polymethylphenylsilane (PMPS). The thickness of the luminescent layer 110b is preferably, for example, in the range of 50 to 100 nm. In this embodiment, a liquid-repellency-providing treatment is performed on the surface of the organic bank layer 220. Therefore, the luminescent layer-forming material discharged in the opening 220c is applied on the entire surface of the predetermined hole injection layer 110a and the inorganic bank layer 18 without expanding to adjacent pixels, thereby forming the luminescent layer 110b.

As shown in FIG. 13, the negative electrode 12 is provided on the entire surface of the organic bank layer 220 and the luminescent layer 110b so as to face the pixel electrodes 111. This negative electrode 12 is formed by laminating, from the substrate 10 side, a calcium (Ca) layer and an aluminum (Al) layer in that order. The Al layer reflects light emitted from the luminescent layer 110b to the side of the substrate 10 (the side of a viewer). Instead of the Al layer, the layer may be preferably composed of, for example, a Ag layer or a laminated layer including an Al layer and a Ag layer. In order to efficiently emit light from the material of the luminescent layer 110b, a lithium fluoride (LiF) layer may be provided between the luminescent layer 110b and the Ca layer of the negative electrode 12. The thickness of the Ca layer is preferably, for example, in the range of 2 to 20 nm, and particularly preferably about 10 nm. The thickness of the Al layer is preferably, for example, in the range of 100 to 1,000 nm, and particularly preferably about 200 nm. Furthermore, a protective layer for preventing oxidation, the protective layer being composed of SiO, $SiO_2$, SiN, or the like, may be provided on the Al layer.

Method of Producing Organic EL Device

Figure 14:
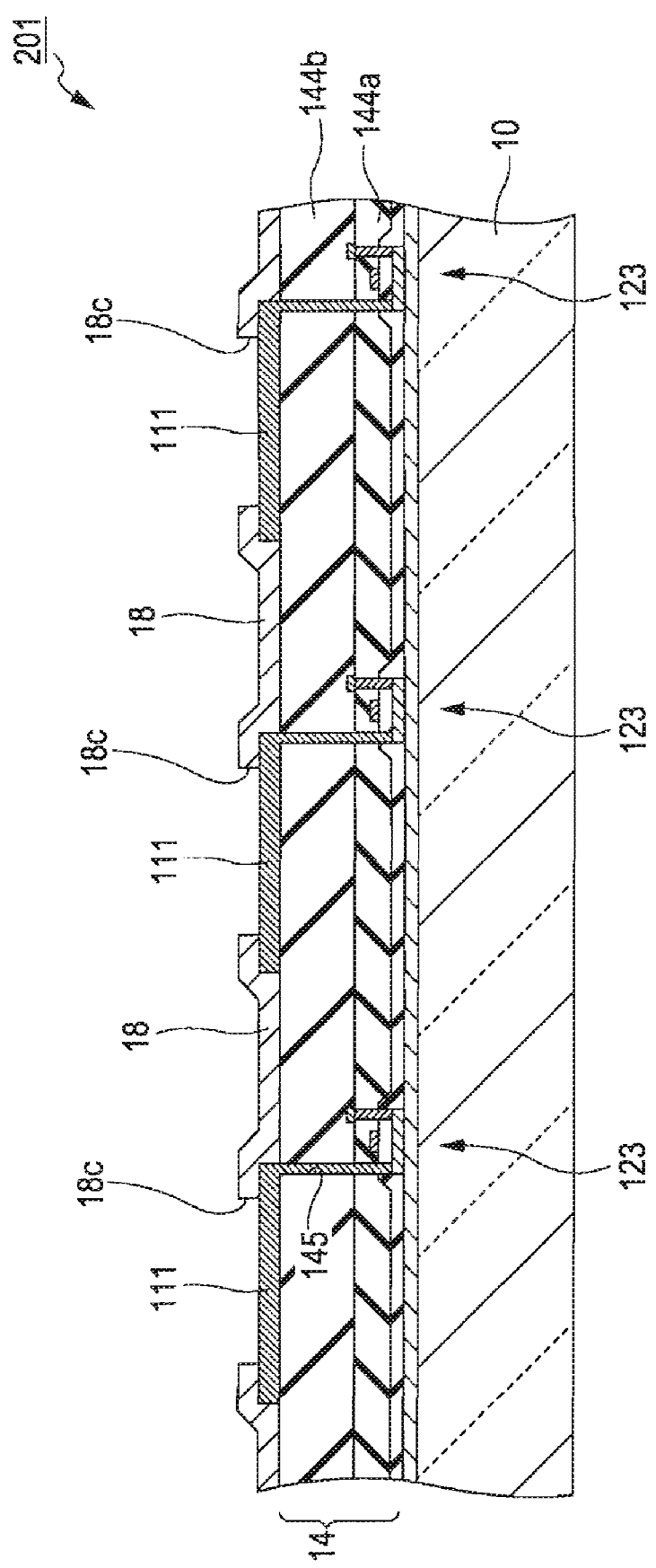
FIG. 14 is a cross-sectional view showing a step of producing the organic EL device according to the third embodiment.

A method of producing an organic EL device according to the third embodiment will now be described. FIGS. 14 to 20 are cross-sectional views showing the steps of producing the organic EL device according to the third embodiment. Since TFTs and the like are produced by a known method, a description of the production process is omitted. Step of forming inorganic bank layer First, an insulating layer, which becomes an inorganic bank layer, is formed on the entire surface of a second interlayer insulation film 144b including pixel electrodes 111 by sputtering using a material prepared by mixing a trace amount of carbon (C) or silicon carbide (SiC) with silicon nitride (SiN). A photosensitive resist is then applied on the entire surface of the insulating layer. The photosensitive resist is then processed by photolithography using a mask in which areas of the resist at positions corresponding to pixel openings 18c on the pixel electrodes 111 are opened. Accordingly, the photosensitive resist is patterned so as to have a predetermined shape. Subsequently, the insulating layer is etched using the patterned photosensitive resist as a mask. Consequently, as shown in FIG. 14, an inorganic bank layer 18 which separates the pixel electrodes 111 and a part of which is provided on the periphery of each pixel electrode 111 is formed. The thickness of the inorganic bank layer 18 is preferably in the range of 30 to 200 nm, and particularly preferably in the range of 50 to 100 nm.

Step of Forming Organic Bank Layer

Next, an organic bank layer-forming material such as an acrylic resin or a polyimide resin is applied on the entire surface of the inorganic bank layer 18 and the pixel electrodes 111.

A photosensitive resist is then applied on the entire surface of the organic bank layer-forming material. The photosensitive resist is then processed by photolithography using a mask having openings larger than the pixel openings 18c separated by the inorganic bank layer 18. In this step, in consideration of the accuracy of photolithography, the position of the organic bank layer 220 is controlled so that side faces of the organic bank layer 220 are disposed inside the periphery of the inorganic bank layer 18. That is, the photolithography is performed so that the area of the opening separated by the organic bank layer 220 is larger than the pixel opening separated by the inorganic bank layer 18.

Figure 15:
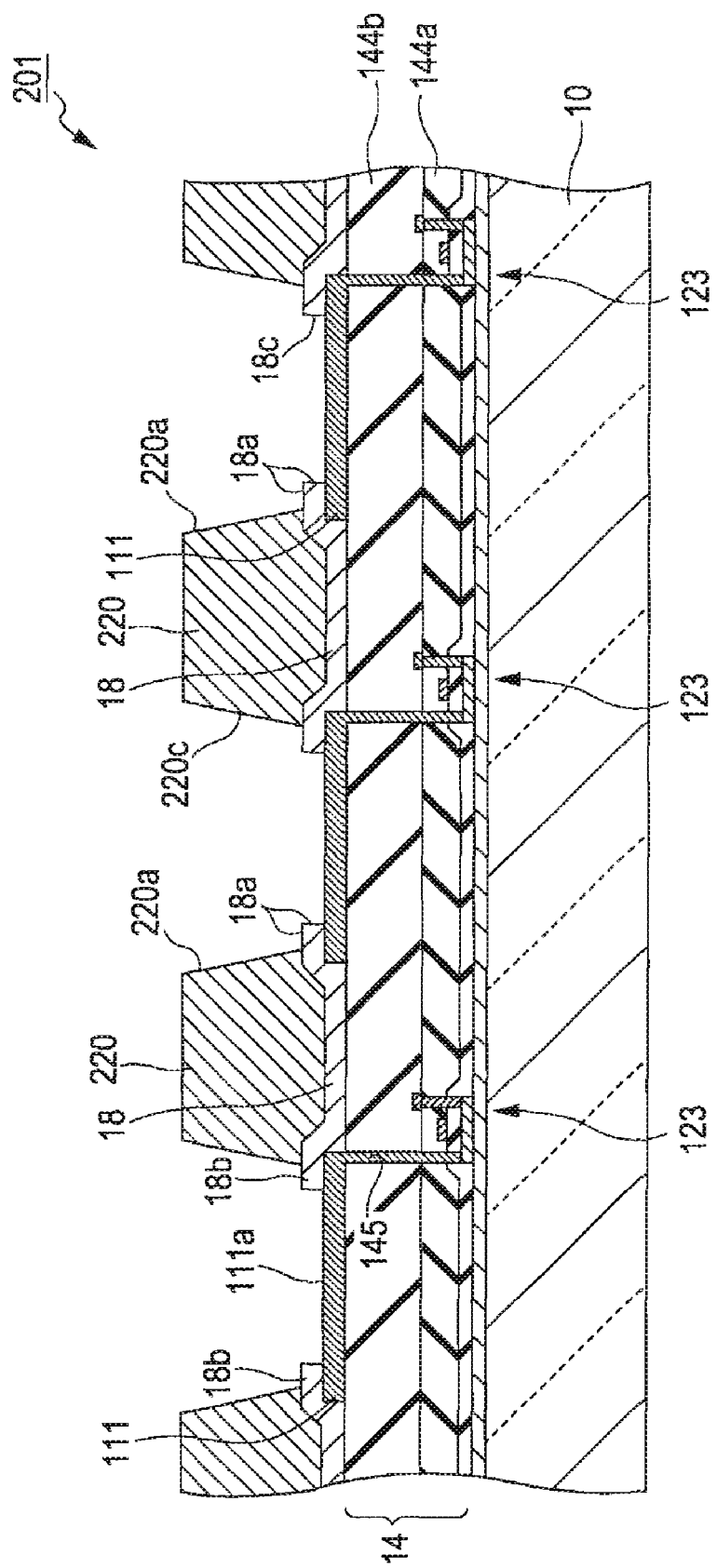
FIG. 15 is a cross-sectional view showing a step of producing the organic EL device according to the third embodiment.

Subsequently, the organic bank layer-forming material is etched using the patterned photosensitive resist as a mask. In this etching process, etching conditions such as the type of etchant used and the etching time are controlled so that the organic bank layer 220 has a trapezoidal cross section having inclined planes. Accordingly, as shown in FIG. 15, the organic bank layer 220 is formed on the inorganic bank layer 18.

Step of Activation Treatment

An activation treatment is performed on the electrode surfaces of the pixel electrodes 111, surfaces 18a of the inorganic bank layer 18, and the surface of the organic bank layer 220. The activation treatment includes the adjustment and control of the work function in the pixel electrodes 111, cleaning of the surfaces of the pixel electrodes 111, and a lyophilicity-providing treatment of the surfaces of the pixel electrodes 111. First, a plasma treatment is performed as the lyophilicity-providing treatment in the atmosphere using oxygen as a process gas ($O_2$ plasma treatment). By performing this $O_2$ plasma treatment, electrode surfaces 111a of the pixel electrodes 111 and the surfaces 18a of protrusions 18b of the inorganic bank layer 18 (hereinafter simply referred to as surface 18a) are subjected to a lyophilicity-providing treatment. By this $O_2$ plasma treatment, not only lyophilicity is provided, but also ITO constituting the pixel electrodes is cleaned and the work function is adjusted, as described above.

Subsequently, a plasma treatment is performed as a liquid-repellency-providing treatment in the atmosphere using tetrafluoromethane as a process gas ($CF_4$ plasma treatment). The process gas is not limited to tetrafluoromethane (carbon tetrafluoride), and other fluorocarbon gases may be used. By performing the $CF_4$ plasma treatment, the surfaces 18a of the inorganic bank layer 18 and the surface layer of the organic bank layer 220 are subjected to a liquid-repellency-providing treatment. The liquid repellency of the inorganic bank layer is lower than that of the organic bank layer because the carbon content of the inorganic bank layer is lower than that of the organic bank layer. When preliminary treatment is performed with $O_2$ plasma, fluorination is easily performed. Therefore, this process is particularly effective for this embodiment. Although the electrode surfaces 111a of the pixel electrodes 111 are also somewhat affected by this $CF_4$ plasma treatment, the wettability is negligibly affected.

Step of Forming Hole Injection Layer

Figure 16:
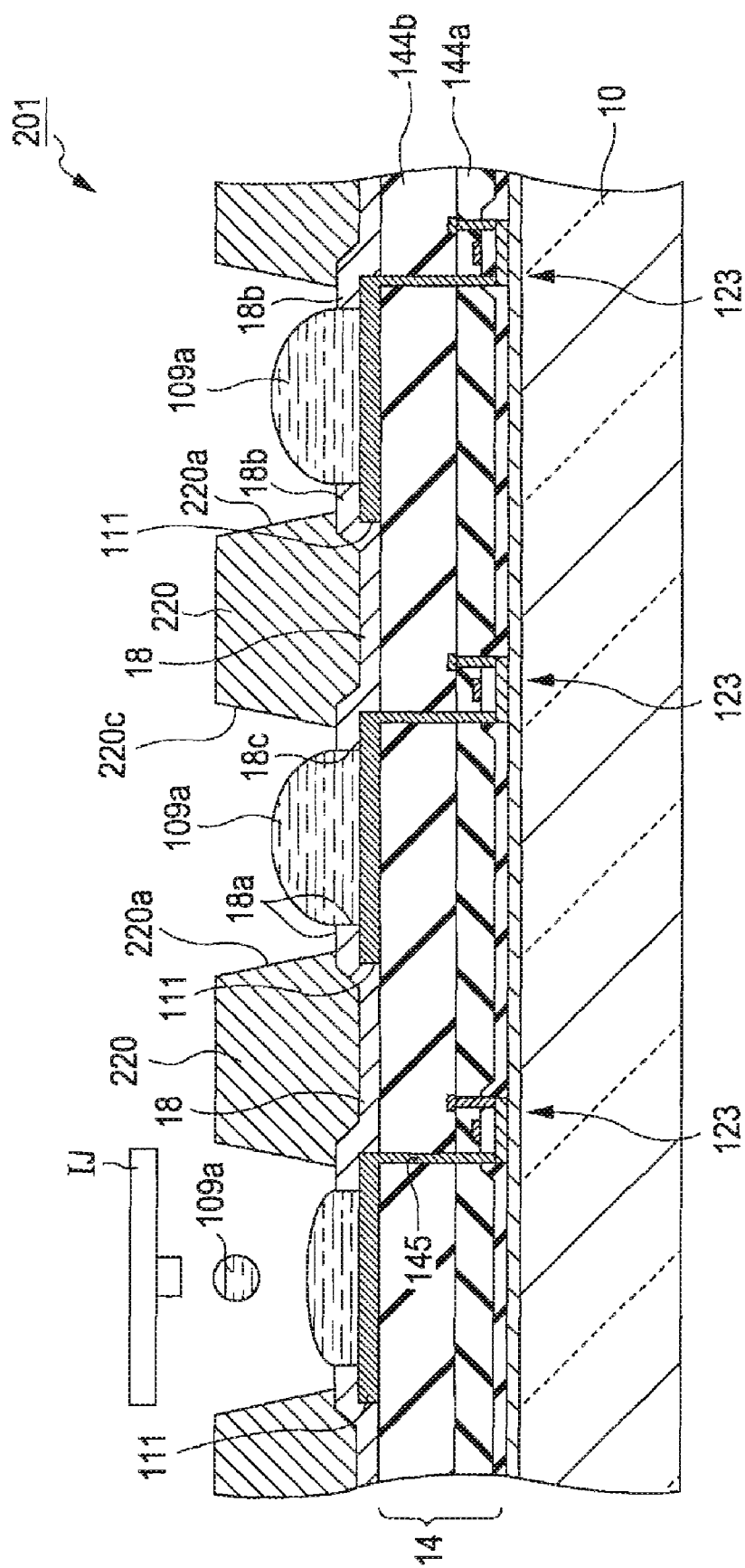
FIG. 16 is a cross-sectional view snowing a step of producing the organic EL device according to the third embodiment.

Next, as shown in FIG. 16, a hole injection layer-forming material 109a prepared by adding a solvent, such as diethylene glycol, to an aqueous dispersion liquid containing a mixture of PEDOT/PSS (PEDOT:PSS=1:6 or 1:20) is discharged from an ink jet apparatus IJ into the pixel openings 18c separated by the inorganic bank layer 18. In this case, the liquid-repellency-providing treatment has already been performed on the surface of the inorganic bank layer 18. The angle of contact between the surface 18a of the inorganic bank layer 18 and the hole injection layer-forming material 109a is about 80°. Accordingly, even if the hole injection layer-forming material 109a to be discharged into the pixel openings 18c of the inorganic bank layer 18 is discharged onto the protrusions 18b of the inorganic bank layer 18, the hole injection layer-forming material 109a is repelled and flows into the pixel openings 18c.

In this embodiment, the amount of discharge of the hole injection layer-forming material 109a discharged from the ink jet apparatus IJ and the solid content of PEDOT/PSS or the like contained in the solvent of the hole injection layer-forming material 109a to be discharged are controlled. Accordingly, a hole injection layer 110a can be formed so that the level of the top surface of the inorganic bank layer 18 provided on the periphery of the pixel electrode 111 is the same as the level of the top surface of the hole injection layer 110a obtained by drying the discharged hole injection layer-forming material 109a.

Drying Step

Figure 17:
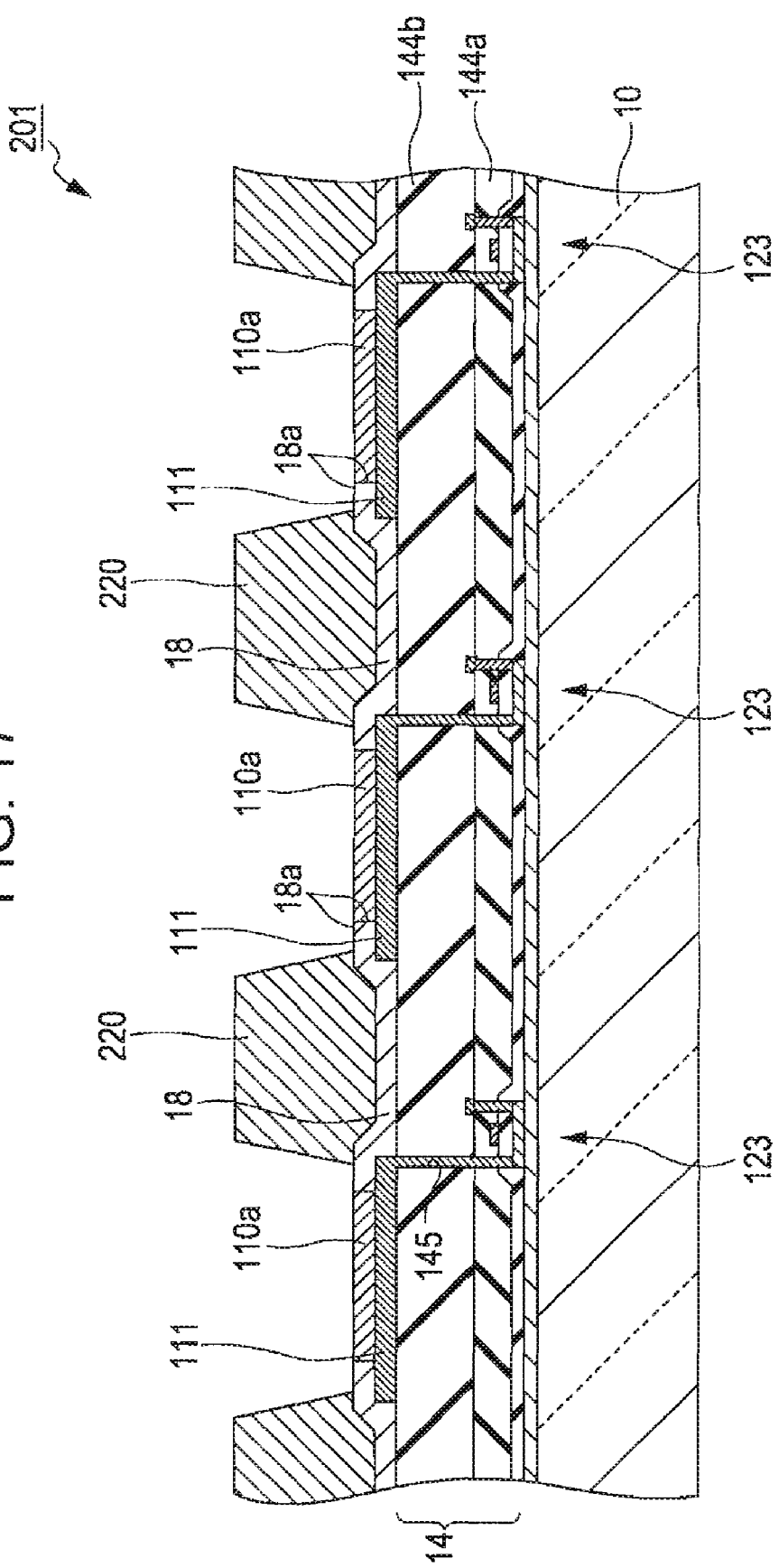
FIG. 17 is a cross-sectional view showing a step of producing the organic EL device according to the third embodiment.

Next, as shown in FIG. 17, the solvent contained in the discharged hole injection layer-forming material is vaporized by a drying process. Accordingly, the hole injection layer 110a is formed on each pixel electrode 111 in the pixel openings 18c separated by the inorganic bank layer 18. More specifically, the discharged hole injection layer-forming material is dried under vacuum and then dried in the atmospheric pressure at 200° C. for 10 minutes. By performing this drying process, as shown in FIG. 17, the hole injection layer 110a in which the level of the top surface thereof is the same level as that of the top surface of the inorganic bank layer 18 provided on the periphery of each pixel electrode 111 can be formed. Furthermore, since the liquid-repellency-providing treatment has already been performed on the surface 18a of the inorganic bank layer 18, the hole injection layer 110a does not remain on the inorganic bank layer 18, and a continuous flat surface extending from the top surface of the inorganic bank layer 18 and the top surface of the hole injection layer 110a is formed.

Step of Forming Luminescent Layer

Figure 18:
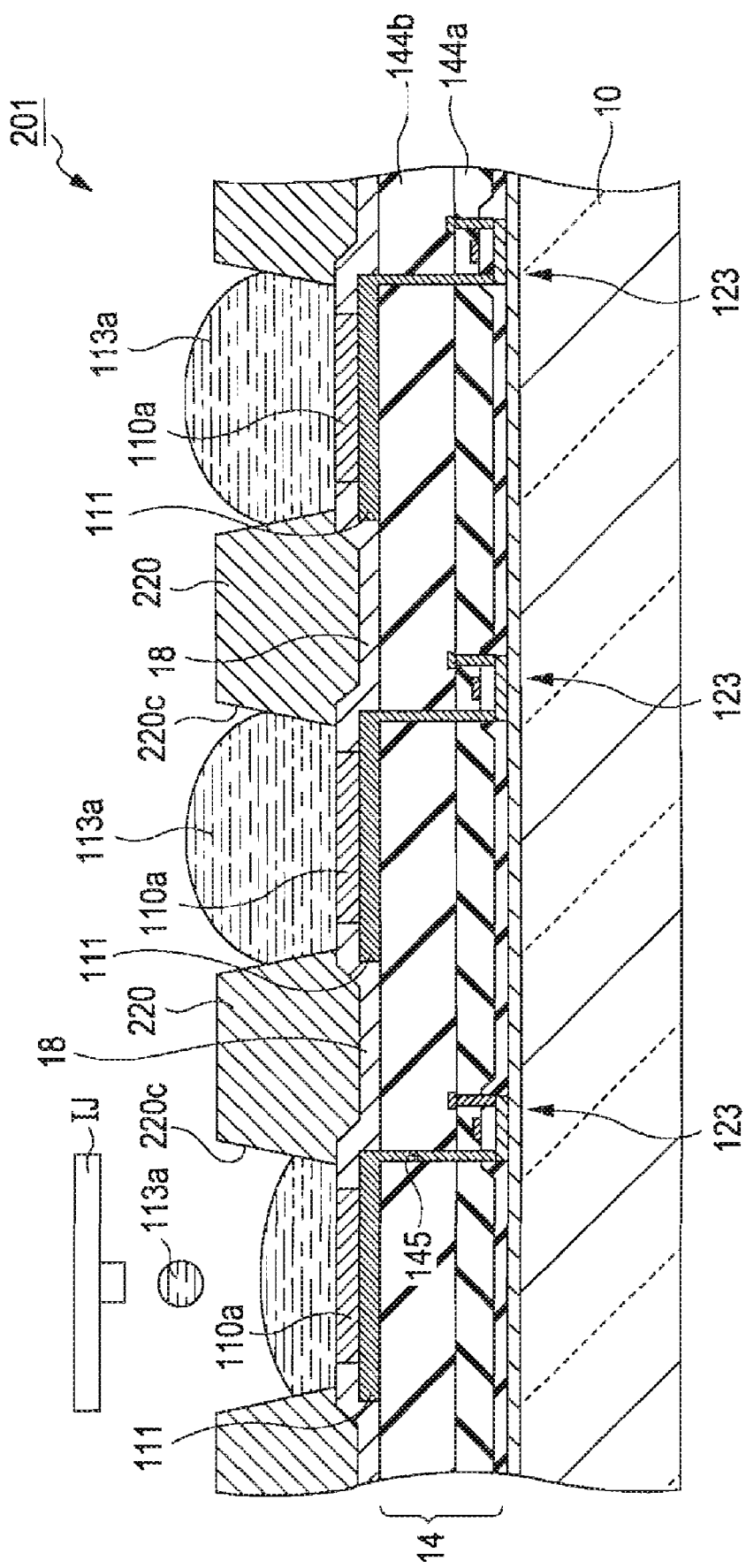
FIG. 18 is a cross-sectional view showing a step of producing the organic EL device according to the third embodiment.

Next, as shown in FIG. 18, a luminescent layer-forming material 113a is discharged onto the entire surface of the protrusion 18b of the inorganic bank layer 18 and the hole injection layer 110a in the opening 220c separated by the organic bank layer 220 with an ink jet apparatus IJ. A solution prepared by dissolving a polyfluorene (PF) derivative or a polyparaphenylene vinylene (PPV) derivative in an aromatic hydrocarbon solvent is used as the luminescent layer-forming material 113a. Examples of the aromatic hydrocarbon solvent include alkyl-group-containing benzene solvents, such as trimethylbenzene, cyclohexylbenzene, and dodecylbenzene; and ether-group-containing benzene solvents, such as methoxyethoxybenzene.

The surface layer of the organic bank layer 220 has liquid repellency. Therefore, the discharged luminescent layer-forming material 113a is repelled on the surface of the bank layer and is disposed in the opening 220c without expanding to the adjacent pixels (openings) or being mixed with each other. Although the surface 18a of the inorganic bank layer 18 also has liquid repellency, this liquid repellency is lower than the liquid repellency of the surface of the organic bank layer 220. In addition, since the luminescent layer-forming material 113a contains an aromatic material having a low surface tension, the wettability (the angle of contact) of the luminescent layer-forming material to the surface of the hole injection layer is not significantly different from that to the surface 18a of the inorganic bank layer 18. Accordingly, the luminescent layer-forming material 113a can be uniformly wetted and expanded both on the surface of the hole injection layer 110a and the surface 18a of the inorganic bank layer 18. More specifically, the angle of contact between the surface of the hole injection layer 110a and the luminescent layer-forming material 113a is about 40°. The angle of contact between the surface of the inorganic bank layer 18 and the luminescent layer-forming material 113a is about 50°. Accordingly, the angle of contact between the top surface of the hole injection layer 110a and the luminescent layer-forming material 113a is substantially the same as the angle of contact between the top surface of the inorganic bank layer 18 and the luminescent layer-forming material 113a.

Figure 19:
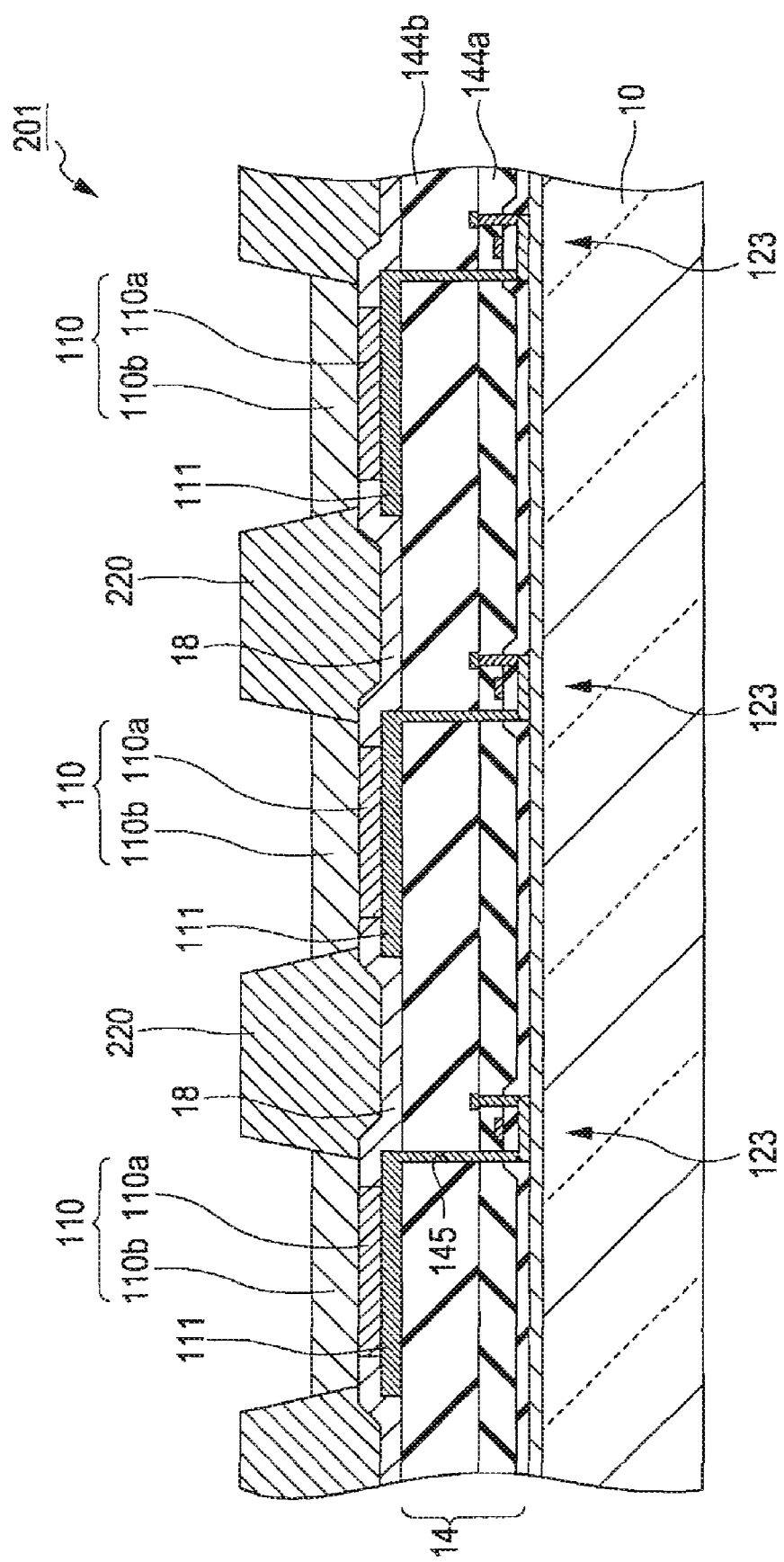
FIG. 19 is a cross-sectional view showing a step of producing the organic EL device according to the third embodiment.

Subsequently, as shown in FIG. 19, the solvent contained in the luminescent layer-forming material 113a that is separately applied by the ink jet discharge is vaporized by a drying process. Accordingly, the luminescent layer 110b is formed on the entire surface of the inorganic bank layer 18 and the hole injection layer 110a. More specifically, the solvent contained in the discharged luminescent layer-forming material 113a is removed under vacuum, and annealing is then performed in an atmosphere of an inert gas such as Ar or nitrogen at 130° C. for 60 minutes. Accordingly, the luminescent layer 110b having a uniform thickness of, for example, 80 nm can be formed.

Step of Forming Negative Electrode

Figure 20:
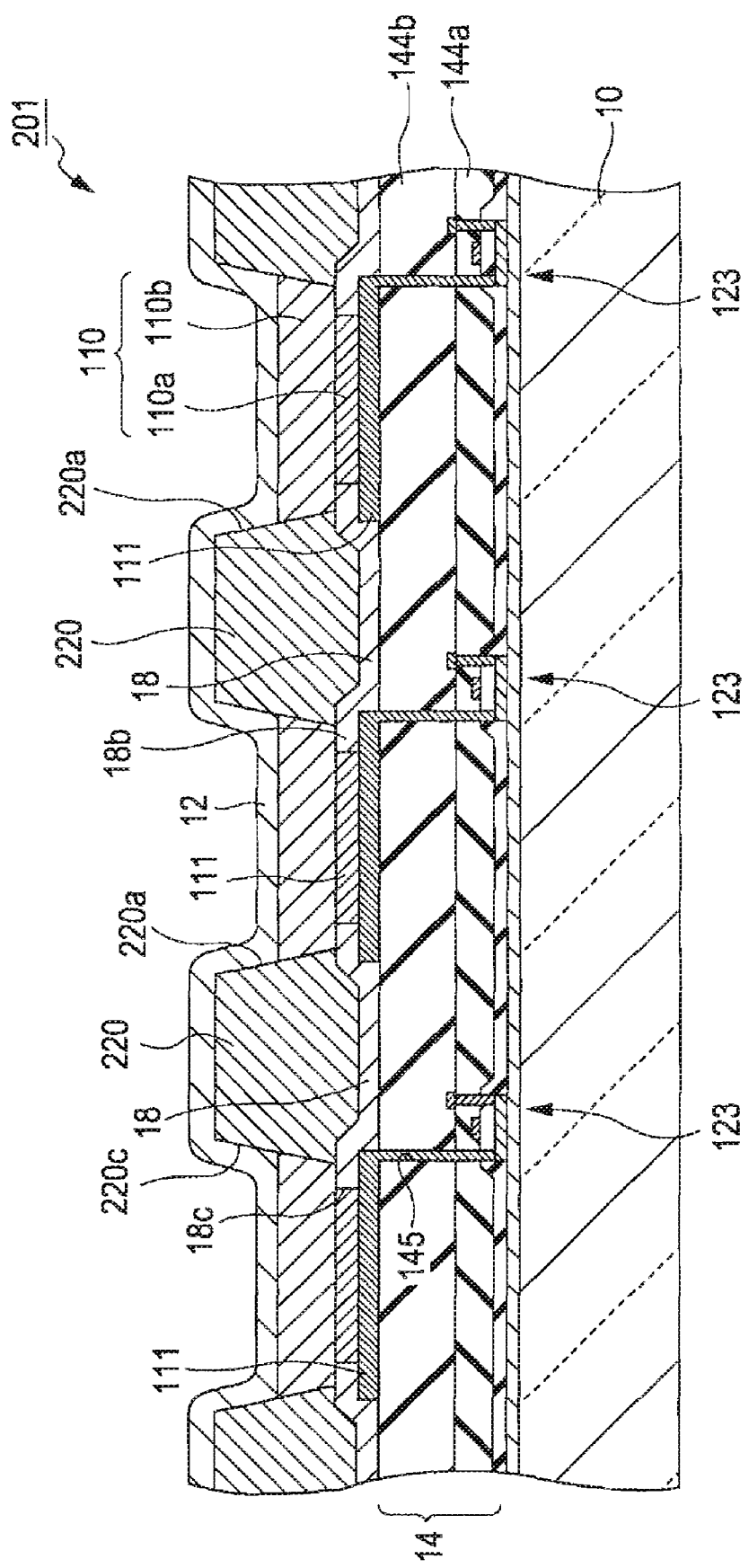
FIG. 20 is a cross-sectional view showing a step of producing the organic EL device according to the third embodiment.

Next, as shown in FIG. 20, a Ca layer and an Al layer are sequentially laminated on the entire surface of the luminescent layer 110b by vacuum heating vapor deposition to form a negative electrode 12 including these laminated layers. As described above, a LiF layer may be formed under the Ca layer. In order to prevent oxidation, a protective layer composed of $SiO_2$, SiN, or the like may be preferably formed on the negative electrode 12.

Finally, as shown in FIG. 12B, a sealing resin 3a composed of a thermosetting resin or a UV curable resin is applied on the entire surface of the negative electrode 12. A sealing substrate 3b is then laminated on the sealing resin 3a to form a sealing portion 3. This sealing step is preferably performed in an atmosphere of an inert gas such as nitrogen, argon, or helium. The organic EL device 201 can be produced by the above method.

In this embodiment, a hole-transporting layer is omitted, but the hole-transporting layer may be formed between the hole injection layer 110a and the luminescent layer 110b. A triphenylamine polymer can be used as the material of the hole-transporting layer. In such a case, since holes can be injected into the luminescent layer 110b more efficiently, excellent luminous efficiency and lifetime can be achieved.

According to this embodiment, the inorganic bank layer 18 has liquid repellency for the hole injection layer 110a. Therefore, the hole injection layer-forming material 109a discharged on the inorganic bank layer 18 is repelled and flows into the pixel openings 18c separated by the inorganic bank layer 18. In addition, the level of the top surface of the hole injection layer 110a is substantially the same as the level of the top surface of the inorganic bank layer 18. Accordingly, the hole injection layer-forming material is controlled so that the material does not leak onto the inorganic bank layer 18. Therefore, the hole injection layer 110a is not disposed outside the pixel openings 18c separated by the inorganic bank layer 18. As described above, since the level of the top surface of the inorganic bank layer 18 is substantially the same level of the top surface of the hole injection layer 110a, the uniform and flat hole injection layer 110a and luminescent layer 110b can be formed. Furthermore, since the film thicknesses can be uniform at the periphery and at the central portion of the hole injection layer 110a and the luminescent layer 110b, the emission lifetime is uniform. Accordingly, a uniform emission lifetime can be achieved.

Fourth Embodiment

A fourth embodiment of the invention will now be described with reference to the drawings. This embodiment differs from the third embodiment in the method of performing a liquid-repellency-providing treatment on the inorganic bank layer. The other basic structure and the production method of the organic EL device are the same as those of the third embodiment. The common constituent elements are assigned the same reference numerals, and the detailed description of those elements is omitted.

Figure 21:
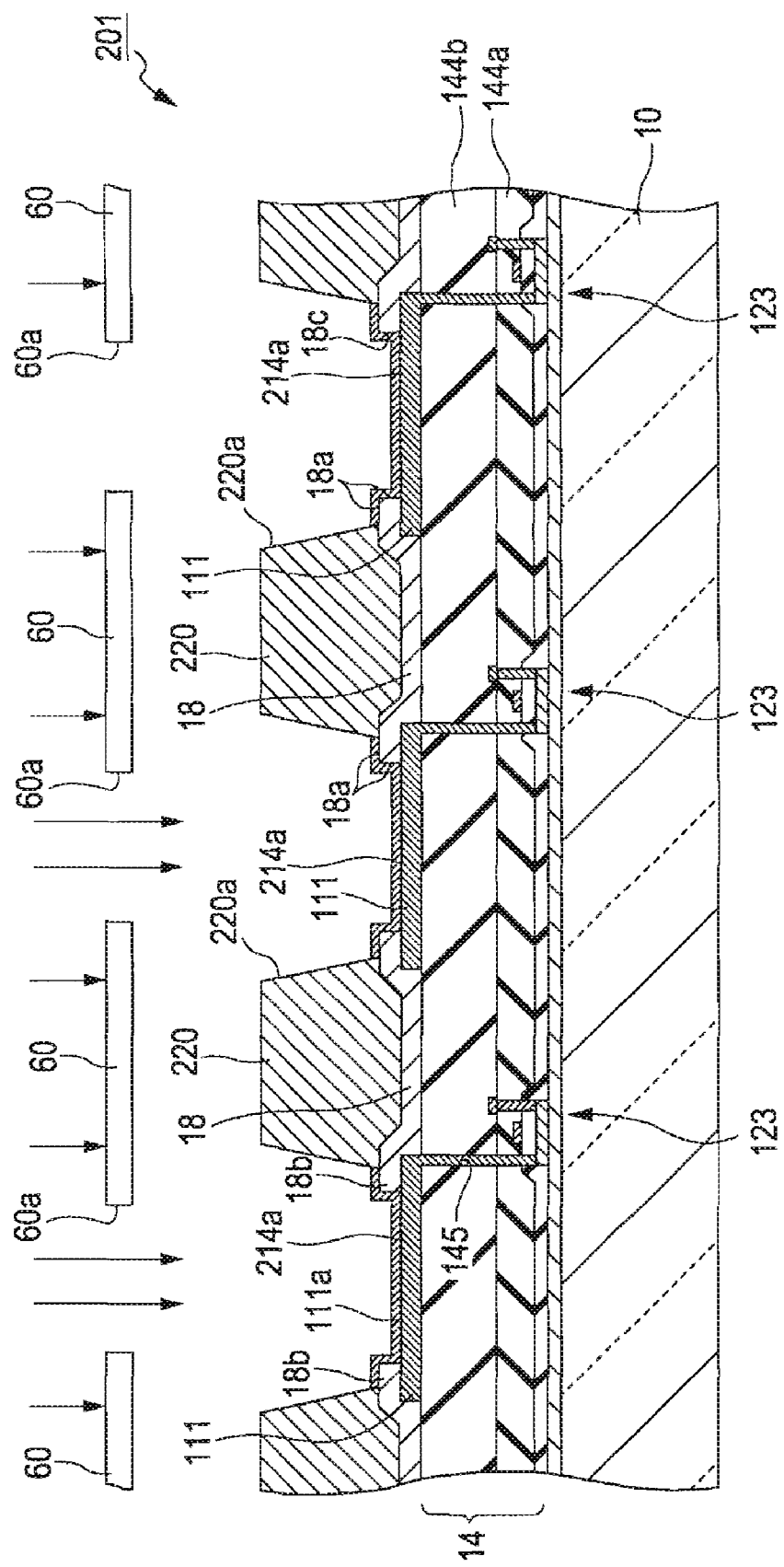
FIG. 21 is a cross-sectional view showing a step of producing an organic EL device according to a fourth embodiment.

FIGS. 21 and 22 are cross-sectional views showing steps of producing an organic EL device according to this embodiment. First, an inorganic material such as $SiO_2$ or $TiO_2$ is deposited on the entire surface of a second interlayer insulation film 144b including pixel electrodes 111 by CVD, sputtering, vapor deposition, or the like. Subsequently, photolithography and etching are performed to form an inorganic bank layer 18, as shown in FIG. 21.

As shown in FIG. 21, an organic bank layer 220, composed of a polyimide resin or an acrylic resin is then formed on the inorganic bank layer 18.

Subsequently, a continuous plasma treatment is performed on the surfaces of pixel electrodes 111, the inorganic bank layer 18, and the organic bank layer 220 using $O_2$ and $CF_4$ as process gases. By performing this plasma treatment, electrode surfaces 111a of the pixel electrodes 111 and the surfaces 18a of hole inorganic bank layer 18 are subjected to a lyophilicity providing treatment, whereas side faces 220a of the organic bank layer 220 are subjected to a lipid-repellency-providing treatment.

After the plasma treatment, the substrate is immersed in a solution of a silane coupling agent such as trimethoxysilane. Accordingly, as shown in FIG. 21, a single layer film 214a of the coupling agent is formed on the surfaces 18a of the inorganic bank layer 18 and the electrode surfaces 111a of the pixel electrodes, the surfaces being subjected to the lyophilicity-providing treatment.

Subsequently, as shown in FIG. 21, the substrate is irradiated with ultraviolet rays through a mask 60 having openings 60a at positions corresponding to the pixel openings 18c. Accordingly, the silane coupling agent formed on the electrode surfaces 111a and the side faces of the inorganic bank layer 18 is removed. Thus, as shown in FIG. 22, a silane coupling agent 214 is formed only on the surfaces 18a (the top surface of the protrusions 18b) of the inorganic bank layer 18. The silane coupling agent has satisfactory adhesiveness to oxides, and the wettability to ink such as a hole injection layer-forming material can be controlled by appropriately selecting the type of terminal functional group of the silane coupling agent used.

The same operation and advantages as those in the third embodiment can be achieved by this embodiment.

Fifth Embodiment

A fifth embodiment of the invention will now be described with reference to the drawings. An organic EL device of this embodiment is a bottom emission-type organic EL device in which light emitted in a luminescent layer is supplied from the side of a substrate.

Organic EL Device

FIG. 23A is a plan view showing the schematic structure of an organic EL device, and FIG. 23B is a cross-sectional view taken along line XXIIIB-XXIIIB of the organic EL device shown in FIG. 23A.

As shove in FIG. 1, an organic EL device 301 (light-emitting device) of this embodiment has a circuit configuration in which a plurality of scanning lines 101, a plurality of signal lines 102 extending in a direction perpendicular to the scanning lines 101, and a plurality of power supply lines 103 extending in a direction parallel to the signal lines 102 are arrayed. A pixel area A is provided in the vicinity of each intersection of the scanning lines 101 and the signal lines 102.

A data-side driving circuit 100 including a shift register, a level shifter, a video line, an analogue switch, and the like is connected to the signal lines 102. A scanning-side driving circuit 105 including a shift register, a level shifter, and the like is connected to the scanning lines 101. Furthermore, each pixel area A includes a thin-film transistor 112 for switching in which a scanning signal is supplied to a gate electrode through the scanning line 101, a storage capacitor (cap) for storing a pixel signal supplied from the signal line 102 through the thin-film transistor 112 for switching, a thin-film transistor 123 for driving in which the pixel signal stored by the storage capacitor (cap) is supplied to the gate electrode, a pixel electrode 111 to which a driving current is supplied from the power supply line 103 when electrically connected to the power supply line 103 via the thin-film transistor 123 for driving, and a functional layer 110 disposed between the pixel electrode 111 and a negative electrode (counter electrode) 12. The pixel electrode 111, the negative electrode 12, and the functional layer 110 constitute a light-emitting element, e.g., an organic EL element.

According to the above structure, when the scanning line 101 is driven and the thin-film transistor 112 for switching enters an ON state, the electrical potential of the signal line 102 at that time is stored in the storage capacitor cap. The ON/OFF state of the thin-film transistor 123 for driving is determined in accordance with the state of the storage capacitor cap. A current flows from the power supply line 103 to the pixel electrode 111 through a channel of the thin-film transistor 123 for driving. Furthermore, a current flows to the negative electrode 12 through the functional layer 110. The functional layer 110 emits light in accordance with the amount of current flowing therethrough.

As shove in FIGS. 23A and 23B, the organic EL device 301 of this embodiment includes a transparent substrate 10 composed of glass or the like and a light-emitting element portion 11 including light-emitting elements arrayed on the substrate 10 in a matrix form. Each of the light-emitting elements includes a positive electrode, a functional layer, and a negative electrode. The functional layer includes a hole injection layer, a luminescent layer, an electron injection/transporting layer, and the like. The substrate 10 is a transparent substrate composed of, for example, glass and is divided into a display area 2a that is located at the center of the substrate 10 and a non-display area 2b located at the periphery of the substrate 10 and that is disposed outside the display area 2a. The display area 2a is formed by the light-emitting elements arrayed in a matrix form and is also referred to as an effective display area. The non-display area 2b is disposed outside the display area. A dummy display area 2d adjacent to the display area 2a is provided in the non-display area 2b. As shown in FIG. 23B, a circuit element portion 14 is provided between the light-emitting element portion 11 and the substrate 10. This circuit element portion 14 includes the scanning lines 101, the signal lines 102, the storage capacitors, the thin-film transistors 112 for switching, the thin-film transistors 123 for driving, and the like. An end of the negative electrode 12 is connected to wiring 12a for the negative electrode, the wiring 12a being provided on the substrate 10. An end 12b of the wiring is connected to wiring 5a on a flexible substrate 5. The wiring 5a is connected to a drive IC 6 (driving circuit) provided on the flexible substrate 5.

As shown in FIGS. 23A and 23B, the above-described power supply lines 103 (103R, 103G, and 103B) are disposed on the non-display area 2b of the circuit element portion 14. The above-described scanning-side driving circuit 105 is provided on both sides of the display area 2a shown in FIG. 23A. These scanning-side driving circuits 105 are provided in the circuit element portion 14 on the lower side of the dummy display area 2d. Furthermore, control signal wiring 105a for the driving circuit and power supply wiring 105b for the driving circuit that are connected to the scanning-side driving circuits 105 are provided in the circuit element portion 14. Furthermore, an inspection circuit 106 is disposed on the upper side (the upper side in the drawing, i.e., the side opposite the drive IC 6) of the display area 2a shown in FIG. 23A. Inspections of the quality and defects of the organic EL device in the course of the production or in shipping can be performed using the inspection circuit 106.

As shown in FIG. 23B, the light-emitting element portion 11 mainly includes the functional layer 110 laminated on each of the plurality of pixel electrodes 111 and an inorganic bank layer 18 (first barrier) that is provided on a planar region disposed between the pixel electrodes 111 and the functional layer 110 and that separates the functional layer 110 two-dimensionally. The negative electrode 12 is disposed on the functional layer 110. The pixel electrode 111, the functional layer 110, and the negative electrode 12 constitute a light-emitting element (e.g., an organic EL element). Each pixel electrode 111 is composed of, for example, ITO and is formed by patterning so as to have a substantially rectangular shape in plan view. The thickness of the pixel electrode 111 is preferably, for example, in the range of 50 to 200 nm, and about 150 nm is particularly preferable. The inorganic bank layer 18 first barrier) is provided between adjacent pixel electrodes 111.

As shown in FIG. 23B, a sealing portion 3 is provided on the light-emitting element portion 11. The sealing portion 3 includes a sealing resin 3a composed of a thermosetting resin, a UV curable resin, or the like applied on the negative electrode 12 and a sealing substrate 3b disposed on the sealing resin 3a. The sealing resin 3a is preferably a resin that does not produce a gas, a solvent, or the like during curing. The sealing portion 3 is provided so as to cover at least the negative electrode 12. This sealing portion 3 prevents water or oxygen from intruding into the negative electrode 12 and the luminescent layer 110b and prevents oxidation of the negative electrode 12 and the luminescent layer 110b. The sealing substrate 3b is bonded to the sealing resin 3a to protect the sealing resin 3a. The sealing substrate 3b is preferably any one of a glass plate, a metal plate, and a resin plate. As described below, a can-sealing-type substrate is also preferred. A getter material may be placed in a recess so that the getter material adsorbs oxygen. Thus, oxidation of the components sealed inside can be prevented.

Figure 24:
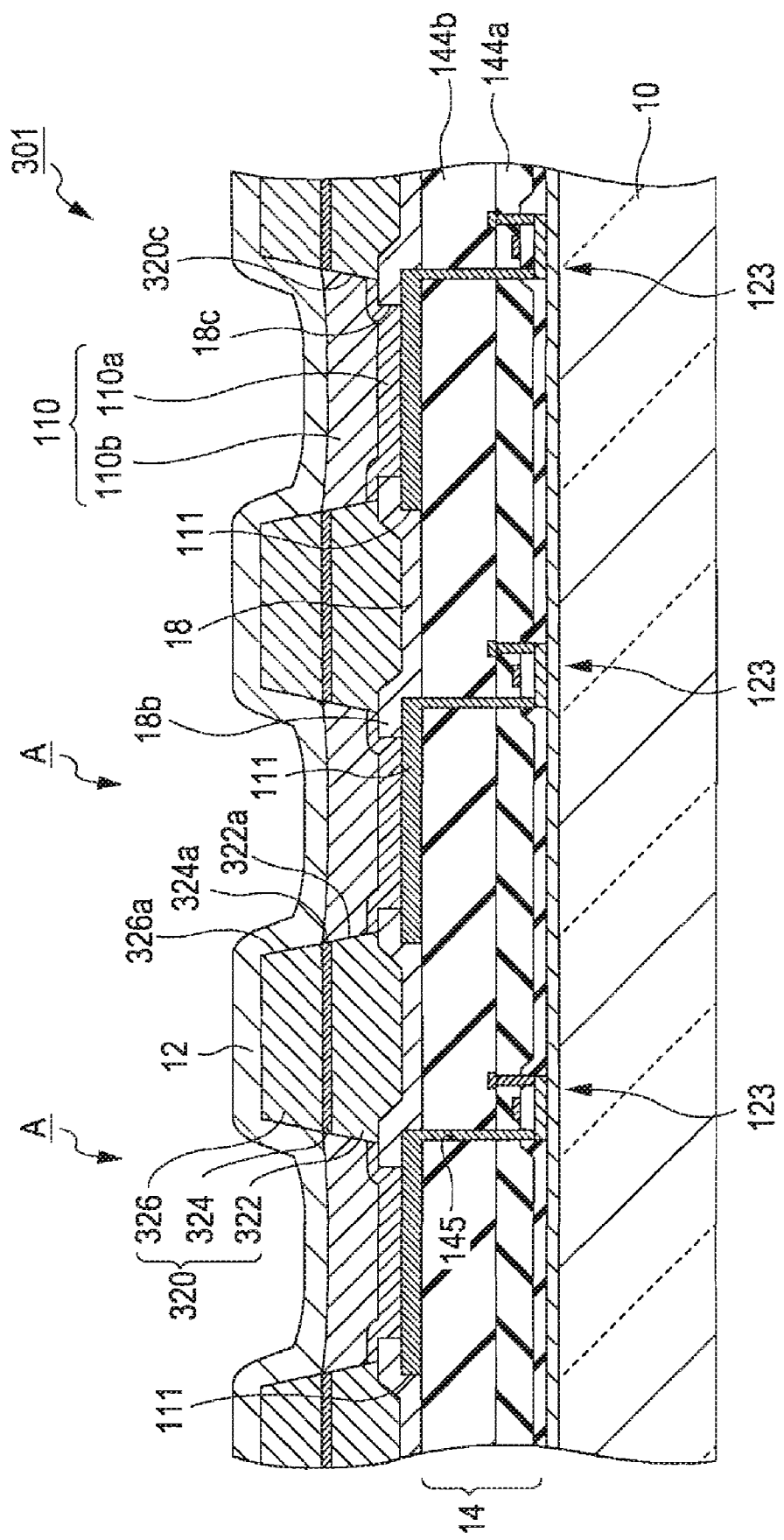
FIG. 24 is a cross-sectional view of the principal portion of the organic EL device.

FIG. 24 is an enlarged view of a light-emitting element of the organic EL device, and in particular, an enlarged view showing the cross-sectional structure of the display area. FIG. 24 shows three pixel areas A. The organic EL device 301 includes a substrate 10, a circuit element portion 14 that is provided on the substrate 10 and that includes circuits such as TFTs and the like, and a light-emitting element portion 11 that is provided on the circuit element portion 14 and that includes pixel electrodes (positive electrode) 111, a functioning layer 110 including a hole injection layer 110a and a luminescent layer 110b, and a negative electrode 12. The pixel electrode 111, the hole injection layer 110a, the luminescent layer 110b, and the negative electrode 12 can constitute an organic EL element. In this organic EL device 301, light emitted from the functioning layer 110 to the side of the substrate 10 is transmitted through the circuit element portion 14 and the substrate 10 and is emitted to the lower side of the substrate 10 (the side of a viewer). In addition, light emitted from the functioning layer 110 to the opposite side of the substrate 10 is reflected by the negative electrode 12. The reflected light is transmitted through the circuit element portion 14 and the substrate 10 and is emitted to the lower side of the substrate 10 (the side of a viewer).

As shown in FIG. 24, an inorganic bank layer 18 controls the luminescent area and is provided between pixel electrodes 111 so as to separate the pixel electrodes 111 from each other. A part of the inorganic bank layer 18 is disposed on the periphery of each pixel electrode 111, and thus the inorganic bank layer 18 partly overlaps with the pixel electrode 111 in plan view. Accordingly, pixel openings 18c that are separated by the inorganic bank layer 18 are provided on the pixel electrodes 111. The ratio of the total area of the pixel openings 18c to the area of the display area is the opening ratio. The inorganic bank layer 18 is composed of, for example, an inorganic material, such as $SiO_2$, $TiO_2$, or SiN; or SiN containing a trace amount of carbon. The thickness of the inorganic bank layer 18 is preferably, for example; in the range of 30 to 200 nm, and in particular, in the range of 50 to 100 nm.

An organic bank layer 320 is provided on the inorganic bank layer 18. In consideration of the accuracy of photolithography, the organic bank layer 320 is provided inside the periphery of the inorganic bank layer 18 so that a certain space is formed between the side face of the organic bank layer 320 and the periphery of the inorganic bank layer 18. Consequently, a protrusion 18b protruding from the side face of the organic bank layer 320 toward the central portion of the pixel electrode 111 is provided at the periphery of the inorganic bank layer.

In this embodiment, the organic bank layer 320 has a structure in which, from the side of the substrate 10, a first organic layer 322, an oxide layer (barrier insulating layer 324, and a second organic layer 326 are laminated in that order. The organic bank layer 320 has a trapezoidal cross section having inclined planes. The first organic layer 322 and the second organic layer 326 are composed of an acrylic resin or a polyimide resin, and the oxide layer 324 is composed of $SiO_2$ or $TiO_2$. A liquid-repellency-providing treatment is performed on side faces 322a of the first organic layer 322 and side faces 326a of the second organic layer 326. A lyophilicity-providing treatment is performed on side faces 324a of the oxide layer 324. That is, the liquid repellency of the side faces 324a of the oxide layer 324 is relatively lower than that of the side faces 322a of the first organic layer 322 and the like. The side faces 324a of the oxide layer 324 serve as the pinning points. Preferably, the thickness of the first organic layer 322 is substantially the same as the target thickness of the luminescent layer. More specifically, the thickness of the first organic layer 322 is preferably in the range of 50 to 100 nm. The thickness of the second organic layer 326 is preferably in the range of 0.5 to 2 μm. The thickness of the oxide layer 324 is preferably small, in the range of 20 to 50 nm. When the thickness of the oxide layer 324 is large, the range of the pinning point of the surface of the oxide layer 324 is also increased and it is difficult to control (pin) the pinning point at a certain position. Instead of the oxide layer 324 of the organic bank layer 320, a SiN layer or the like may be formed.

As shown in FIG. 24, the functioning layer 110 includes the hole injection layer 110a provided on each pixel electrode 111 and the luminescent layer 110b laminated on the hole injection layer 111a.

As shown in FIG. 24, the hole injection layer 110a is provided on each pixel electrode 111 in the pixel openings 18c separated by the inorganic bank layer 18. The periphery of the hole injection layer 110a is formed on the protrusion 18b of the inorganic bank layer 18. A preferred example of a hole injection layer-forming material is a mixture (PEDOT/PSS) of a polythiophene derivative such as polyethylenedioxythiophene (PEDOT) and polystyrene sulfonic acid (PSS) or the like.

As shown in FIG. 24, the luminescent layer 110b is provided on the entire surface of the hole injection layer 110a in each opening 320c separated by the organic bank layer 320. The outer edges of the luminescent layer 110b are in contact with the side faces 324a, i.e., the pinning points, of the oxide layer 324 of the organic bank layer 320. The luminescent layer 110b is formed so that the level of the top surface thereof is the same as the level of the top surface of the oxide layer 324 of the organic bank layer 320. The luminescent layer 110b includes three types of luminescent layer, i.e., a red luminescent layer that emits red (R) light, a green luminescent layer that emits green (G) light, and a blue luminescent layer that emits blue (B) light. These luminescent layers are arranged in a stripe shape. Preferred examples of the polymer luminescent layer-forming material for the luminescent layer 110b include organic polymer materials such as polyfluorene (PF) derivatives, polyparaphenylene vinylene (PPV) derivatives, polyparaphenylene (PPP) derivatives, polyvinylcarbazole (PVK), polythiophene derivatives, and polysilanes, e.g., polymethylphenylsilane (PMPS). The thickness of the luminescent layer 110b is preferably, for example, in the range of 50 to 100 nm.

As shown in FIG. 24, the negative electrode 12 is provided on the entire surface of the organic bank layer 320 and the luminescent layer 110b so as to face the pixel electrodes 111. This negative electrode 12 is formed by laminating, from the substrate 10 side, a calcium (Ca) layer and an aluminum (Al) layer in that order. The Al layer reflects light emitted from the luminescent layer 110b to the side of the substrate 10 (the side of a viewer). Instead of the Al layer, the layer may be preferably composed of, for example, a Ag layer or a laminated layer including an Al layer and a Ag layer. In order to efficiently emit light from the material of the luminescent layer 110b, a lithium fluoride (LiF) layer may be provided between the luminescent layer 110b and the Ca layer of the negative electrode 12. The thickness of the CC layer is preferably, for example, in the range of 2 to 20 nm, and particularly preferably about 10 nm. The thickness of the Al layer is preferably, for example, in the range of 100 to 1,000 nm, and particularly preferably about 200 nm. Furthermore, a protective layer for preventing oxidation, the protective layer being composed of SiO, $SiO_2$, SiN, or the like, may be provided on the Al layer.

Method of Producing Organic EL Device

A method of producing an organic EL device according to the fifth embodiment will now be described. FIGS. 25 to 32 are cross-sectional vies showing the steps of producing the organic EL device according to the fifth embodiment. Since TFTs and the like are produced by a known method, a description of the production process is omitted.

Step of Forming Inorganic Bank Layer

Figure 25:
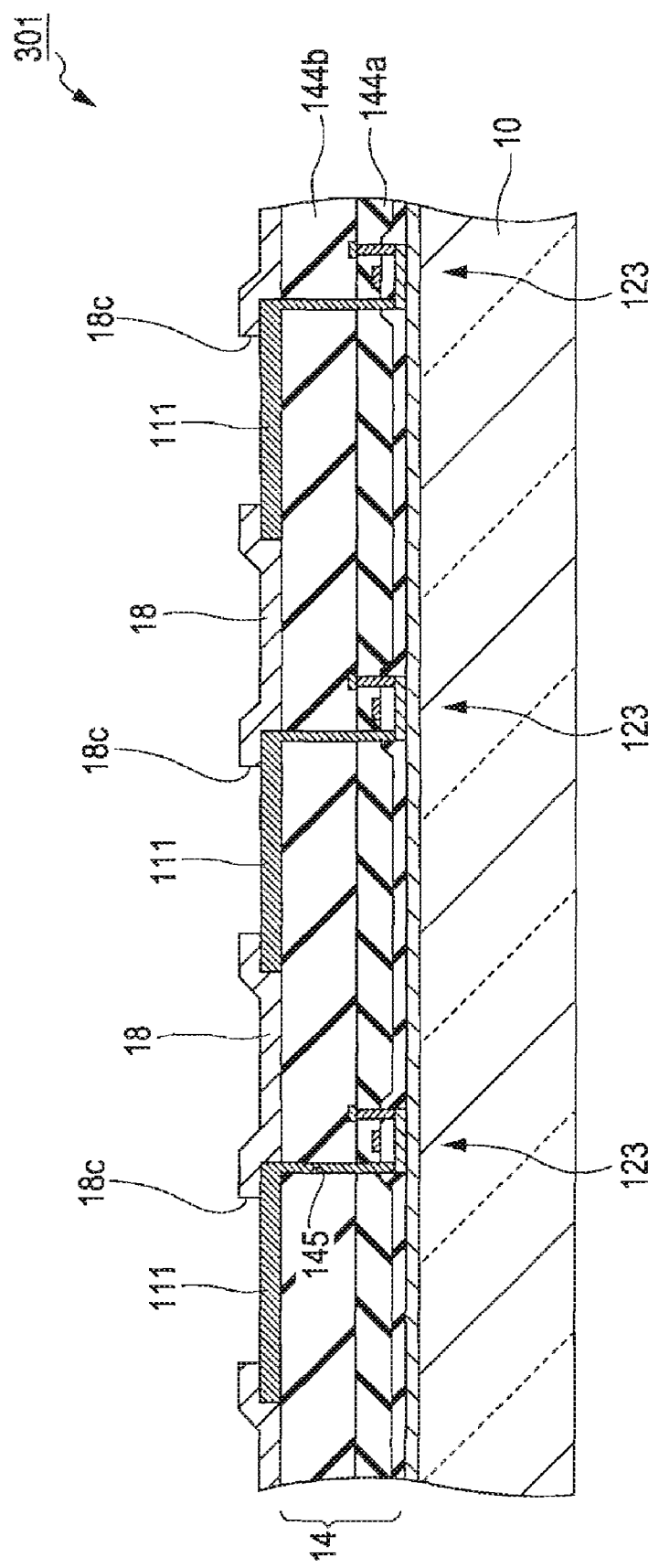
FIG. 25 is a cross-sectional view showing a step of producing the organic EL device according to the fifth embodiment.

First, an insulating layer composed of, for example, $SiO_2$ or $TiO_2$, which becomes an inorganic bank layer, is formed on the entire surface of a second interlayer insulation film 144b including pixel electrodes 111 by CVD, coating, sputtering, vapor deposition, or the like. A photosensitive resist is then applied on the entire surface of the insulating layer. The photosensitive resist is then processed by photolithography using a mask in which areas of the resist at positions corresponding to pixel openings 18c are opened. Accordingly, the photosensitive resist is patterned so as to have a predetermined shape. Subsequently, the insulating layer is etched using the patterned photosensitive resist as a mask. Consequently, as shown in FIG. 25, an inorganic bank layer 18 which separates the pixel electrodes 111 and a part of which is provided on the periphery of each pixel electrode 111 is formed.

Step of Forming Organic Bank Layer

Figure 26:
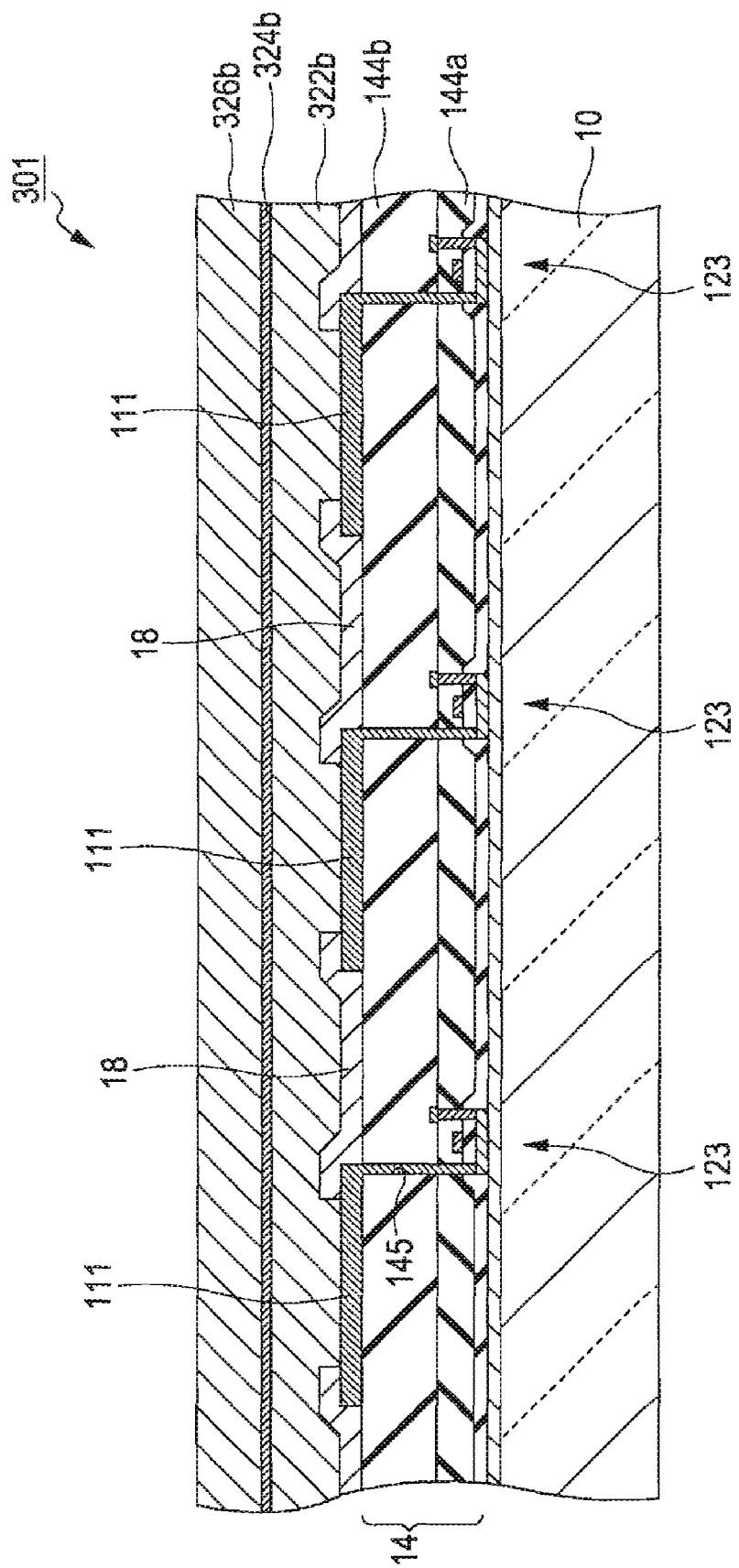
FIG. 26 is a cross-sectional view showing a step of producing the organic EL device according to the fifth embodiment.

Next, as shown in FIG. 26, a first organic layer-forming material 322b such as an acrylic resin or a polyimide resin is formed on the entire surface of the inorganic bank layer 18 and the pixel electrodes 111 by spin coating. As shown in FIG. 26, an oxide layer-forming material 324b such as $SiO_2$ or $TiO_2$ is then formed on the entire surface of the first organic layer-forming material 322b by CVD, sputtering, vapor deposition, or the like. As shown in FIG. 26, a second organic layer-forming material 326b such as an acrylic resin or a polyimide resin is formed on the entire surface of the inorganic material by spin coating.

A photosensitive resist is then applied on the en ire surface of the second organic layer-forming material 326b. The photosensitive resist is then processed by photolithography using a mask in which areas of the resist at positions corresponding to the pixel openings 18 separated by the inorganic bank layer 18 are somewhat opened. In this step, in consideration of the accuracy of photolithography, the position of the organic bank layer 320 is controlled so that side faces of the organic bank layer 320 are disposed inside the periphery of the inorganic bank layer 18. That is, the photolithography is performed so that the area of the opening separated by the organic bank layer 320 is larger than the pixel opening separated by the inorganic bank layer 18.

Figure 27:
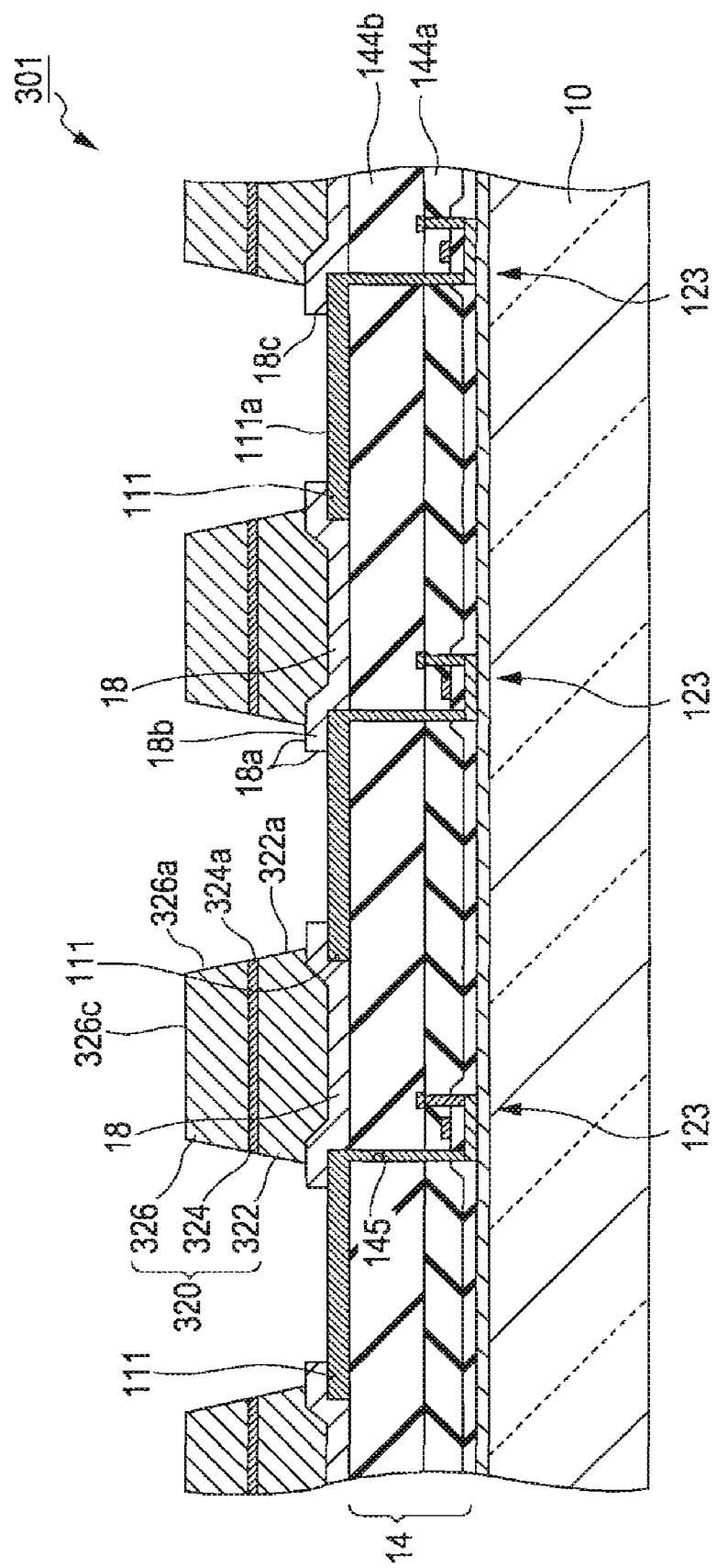
FIG. 27 is a cross-sectional view showing a step of producing the organic EL device according to the fifth embodiment.

Subsequently, the first organic layer-forming material 322b, the oxide layer-forming material 324b, and the second organic layer-forming material 326b are etched at the same time using the patterned photosensitive resist as a mask. In this etching process, etching conditions such as the type of etchant used and the etching time are controlled so that the organic bank layer 320 has a trapezoidal cross section having inclined planes. Accordingly, as shown in FIG. 27, the organic bank layer 320 including the first organic layer 322, the oxide layer 324, and the second organic layer 326 is formed on the inorganic bank layer 18. The height of the oxide layer 324 can be adjusted by adjusting the thickness of the first organic layer 322 on the inorganic bank layer 18. Accordingly, the position of the pinning point can be controlled.

Step of Activation Treatment

An activation treatment is performed on electrode surfaces of the pixel electrodes 111, surfaces 18a of the inorganic bank layer 18, and the surface of the organic bank layer 320. The activation treatment includes the adjustment and control of the work function in the pixel electrodes 111, cleaning of the surfaces of the pixel electrodes 111, and a lyophilicity-providing treatment of the surfaces of the pixel electrodes, the surface of the inorganic layer, and the surface of the oxide layer. First, a plasma treatment is performed as the lyophilicity-providing treatment in the atmosphere using oxygen as a process gas ($O_2$ plasma treatment). By performing this $O_2$ plasma treatment, electrode surfaces 111a of the pixel electrodes 111, the surfaces 18a of protrusions 18b of the inorganic bank layer 18 (hereinafter simply referred to as surface 18a), and the side faces 324a of the oxide layer 324 of the organic bank layer 320 are subjected to a lyophilicity-providing treatment. By this $O_2$ plasma treatment, not only lyophilicity is provided, but also ITO constituting the pixel electrodes is cleaned and the work function is adjusted, as described above.

Subsequently, a plasma treatment is performed as a liquid-repellency-providing treatment in the atmosphere using tetrafluoromethane as a process gas ($CF_4$ plasma treatment). The process gas is not limited to tetrafluoromethane (carbon tetrafluoride), and other fluorocarbon gases may be used. By performing the $CF_4$ plasma treatment, the side faces 322a of the first organic layer 322, and the side faces 326a and the top surface 326c of the second organic layer 326 of the organic bank layer 320 are subjected to a liquid-repellency-providing treatment. When a preliminary treatment is performed with $O_2$ plasma, fluorination is easily performed. Therefore, this process is particularly effective for this embodiment. Although the electrode surfaces 111a of the pixel electrodes 111, the surfaces 18a of the inorganic bank layer 18, and the side faces 324a of the oxide layer 324 of the organic bank layer 320 are also somewhat affected by this $CF_4$ plasma treatment, the wettability is negligibly affected.

Step of Forming Hole Injection Layer

Figure 28:
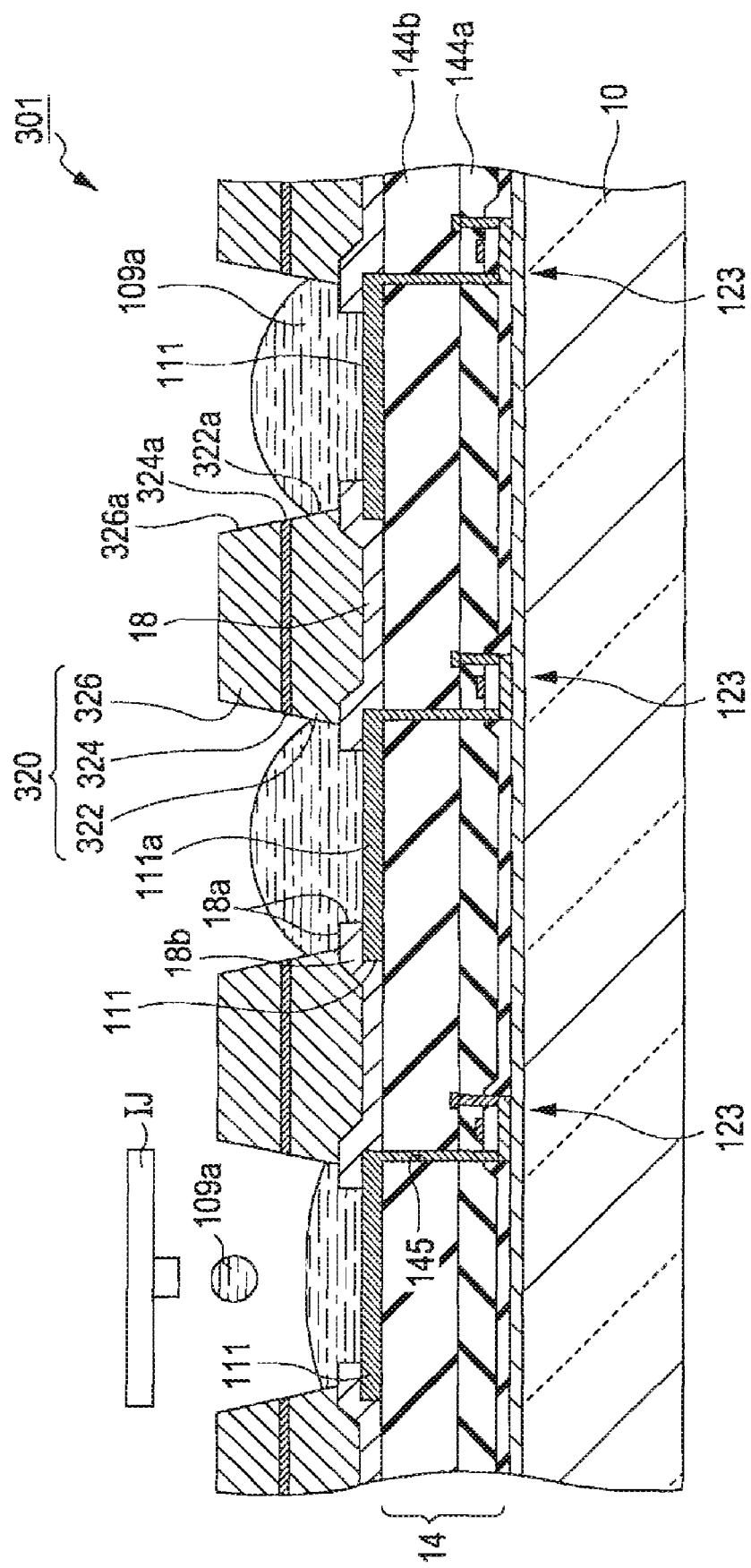
FIG. 28 is a cross-sectional view showing a step of producing the organic EL device according to the fifth embodiment.

Next, as shown in FIG. 28, a hole injection layer-forming material 109a prepared by adding a solvent, such as diethylene glycol, to an aqueous dispersion liquid containing a mixture of PEDOT/PSS (PEDOT:PSS=1:6 or 1:20) is discharged from an ink jet apparatus IJ into the pixel openings 18c separated by the inorganic bank layer 18. The discharged hole injection layer-forming material 109a is disposed on the electrode surfaces 111a of the pixel electrodes 111 and the protrusions 18b of the inorganic bank layer 18.

Drying Step

Figure 29:
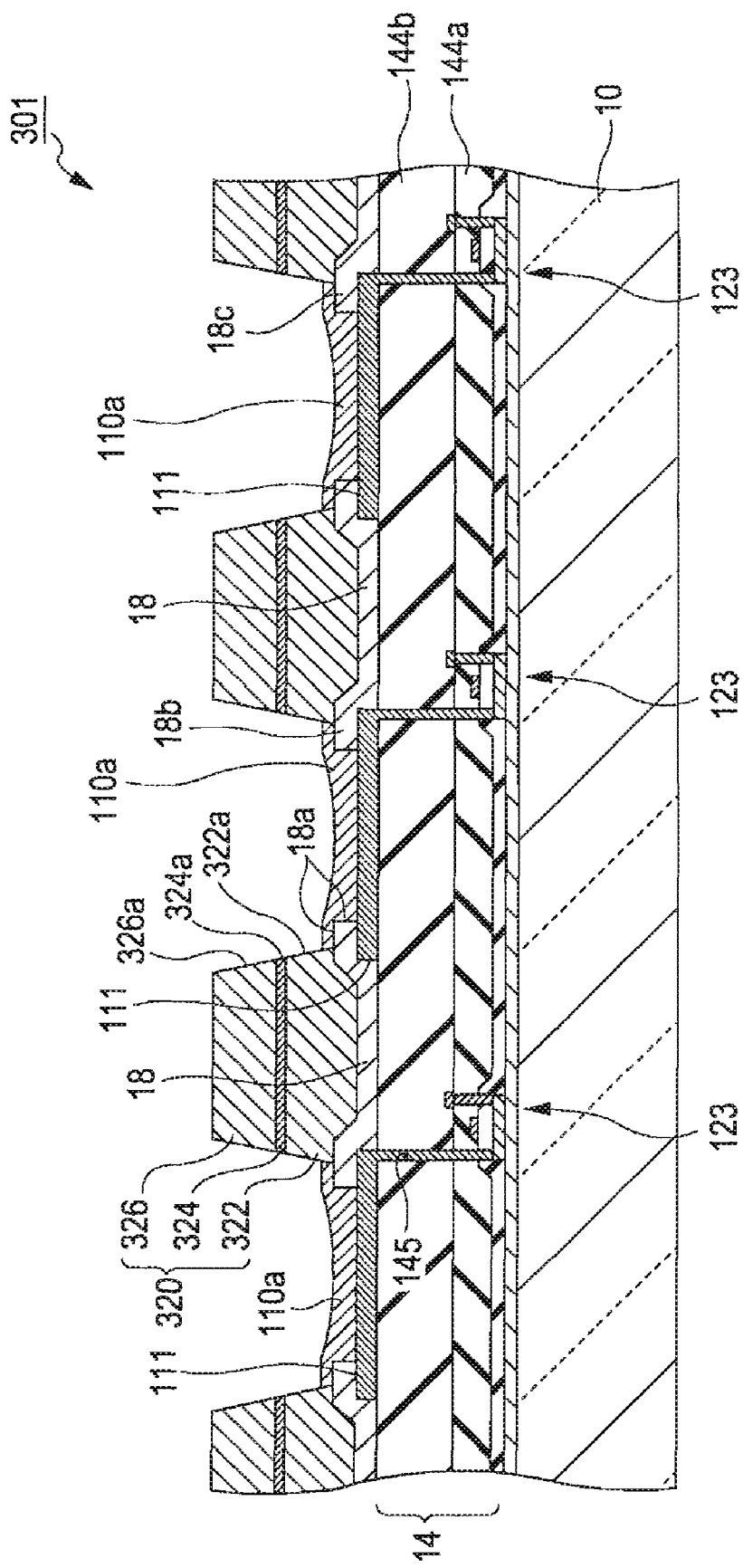
FIG. 29 is a cross-sectional view showing a step of producing the organic EL device according to the fifth embodiment.

Next, as shown in FIG. 29, the solvent contained in the discharged hole injection layer-forming material is vaporized by a drying process. Accordingly, the hole injection layer 110a is formed on each pixel electrode 111 in the pixel openings 18c separated by the inorganic bank layer 18. More specifically, the discharged hole injection layer-forming material is dried under vacuum and then dried in the atmospheric pressure at 200° C. for 10 minutes. By performing this drying process, as shown in FIG. 29, the hole injection layer 110a is formed on each electrode surface 111a of the pixel electrode 111 so as to cover the peripheries of the inorganic bank layer 18.

Step of Forming Luminescent Layer

Figure 30:
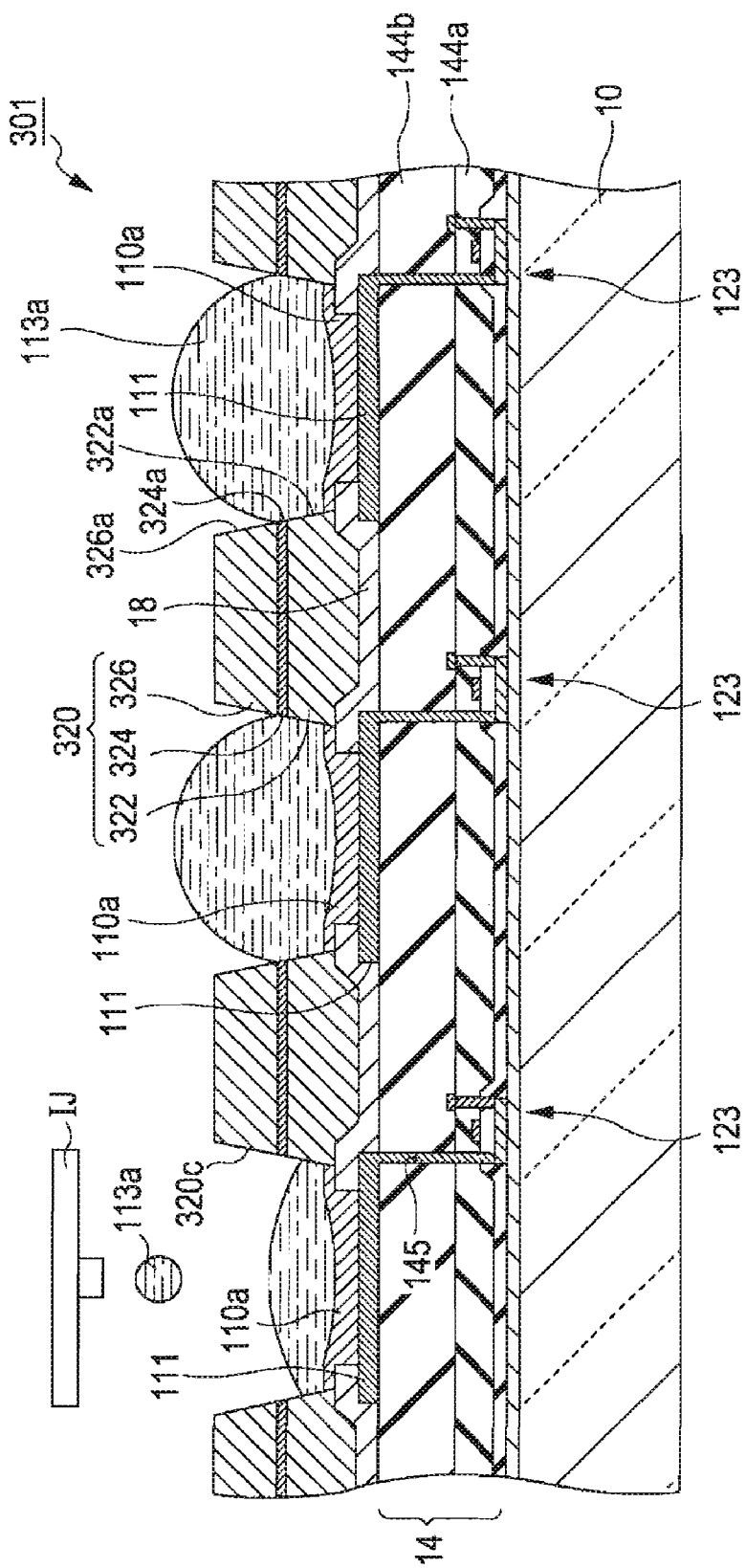
FIG. 30 is a cross-sectional view showing a step of producing the organic ELI device according to the fifth embodiment.

Next, as shown in FIG. 30, a luminescent layer-forming material 113a is discharged onto the entire surface of the inorganic bank layer 18 and the hole injection layer 110a in the opening 320c separated by the organic bank layer 320 with an ink jet apparatus IJ. A solution prepared by dissolving a polyfluorene (PF) derivative or a polyparaphenylene vinylene (PPV) derivative in an aromatic hydrocarbon solvent is used as the luminescent layer-forming material 113a. Examples of the aromatic hydrocarbon solvent include alkyl-group-containing benzene solvents, such as tri-methylbenzene, cyclohexylbenzene, and dodecylbenzene; and ether-group-containing benzene solvents, such as methoxyethoxybenzene.

Figure 31:
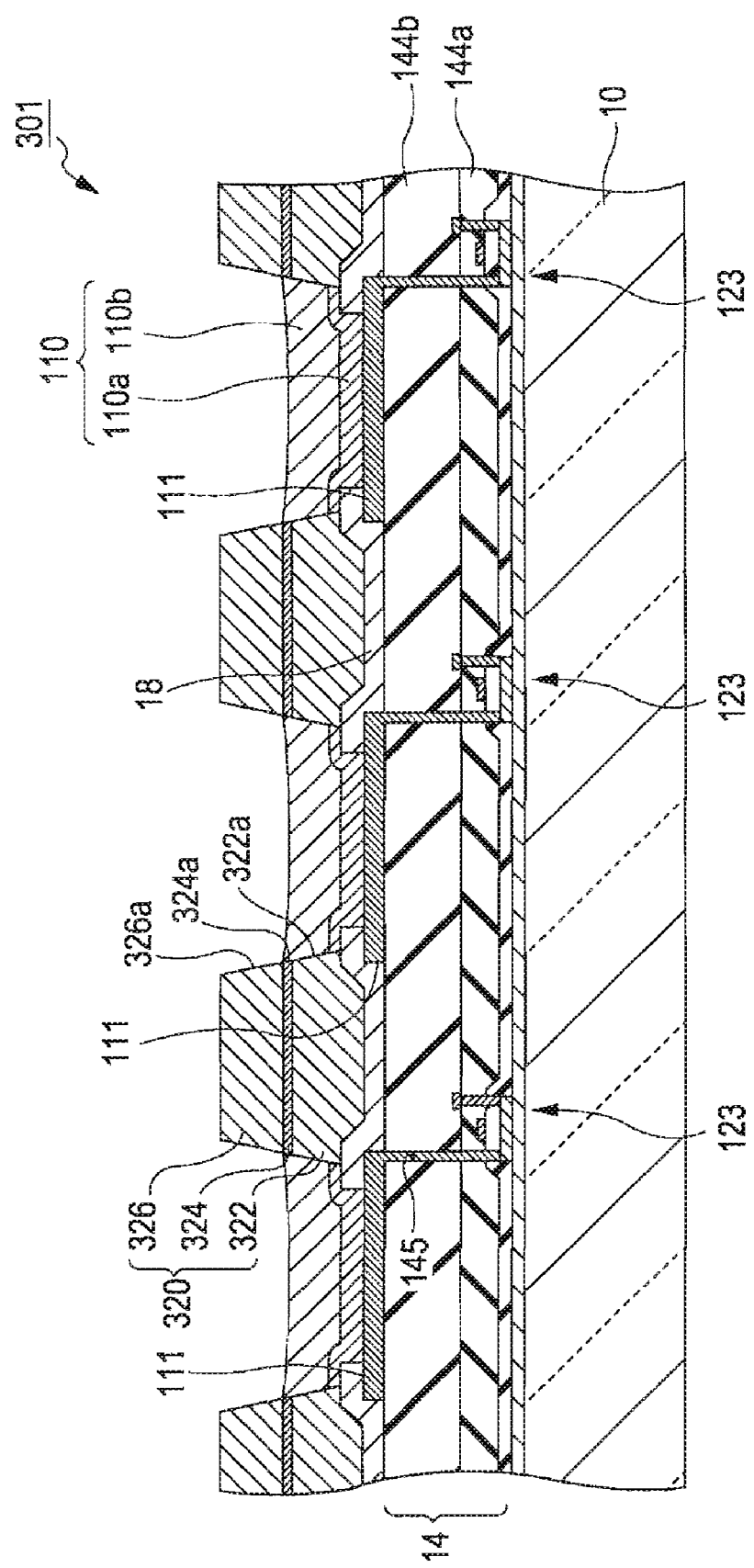
FIG. 31 is a cross-sectional view showing a step of producing the organic EL device according to the fifth embodiment.

Subsequently, as shown in FIGS. 30 and 31, the solvent contained in the discharged luminescent layer-forming material 113a is removed by a drying process. Accordingly, the luminescent layer 110b is formed on the entire surface of the inorganic bank layer 18 and the hole injection layer 110a. More specifically, the solvent contained in the discharged luminescent layer-forming material 113a is removed, and annealing is then performed in an atmosphere of an inert gas such as Ar or nitrogen at 130° C. for 60 minutes. Accordingly, the luminescent layer 110b having a uniform thickness of, for example, 80 nm can be formed. In this embodiment, the oxide layer 324 is provided in the middle of the organic bank layer 320, and the lyophilicity-providing treatment is performed on the side faces 324a of the oxide layer 324. Consequently, the luminescent layer-forming material 113a discharged in the openings 320c separated by the organic bank layer 320 is pinned while the side faces 324a of the oxide layer 324 serve as base points. That is, drying and precipitation start at the outer periphery of the luminescent layer-forming material 113a that is in contact with the side faces 324a of the oxide layer 324 of the organic bank layer 320, and the solvent contained in the luminescent layer-forming material 113a is vaporized. Thus, as shown in FIG. 31 the flat luminescent layer 110b having a uniform thickness of, for example, 80 nm is formed on the hole injection layer 110a.

Step of Forming Negative Electrode

Figure 32:
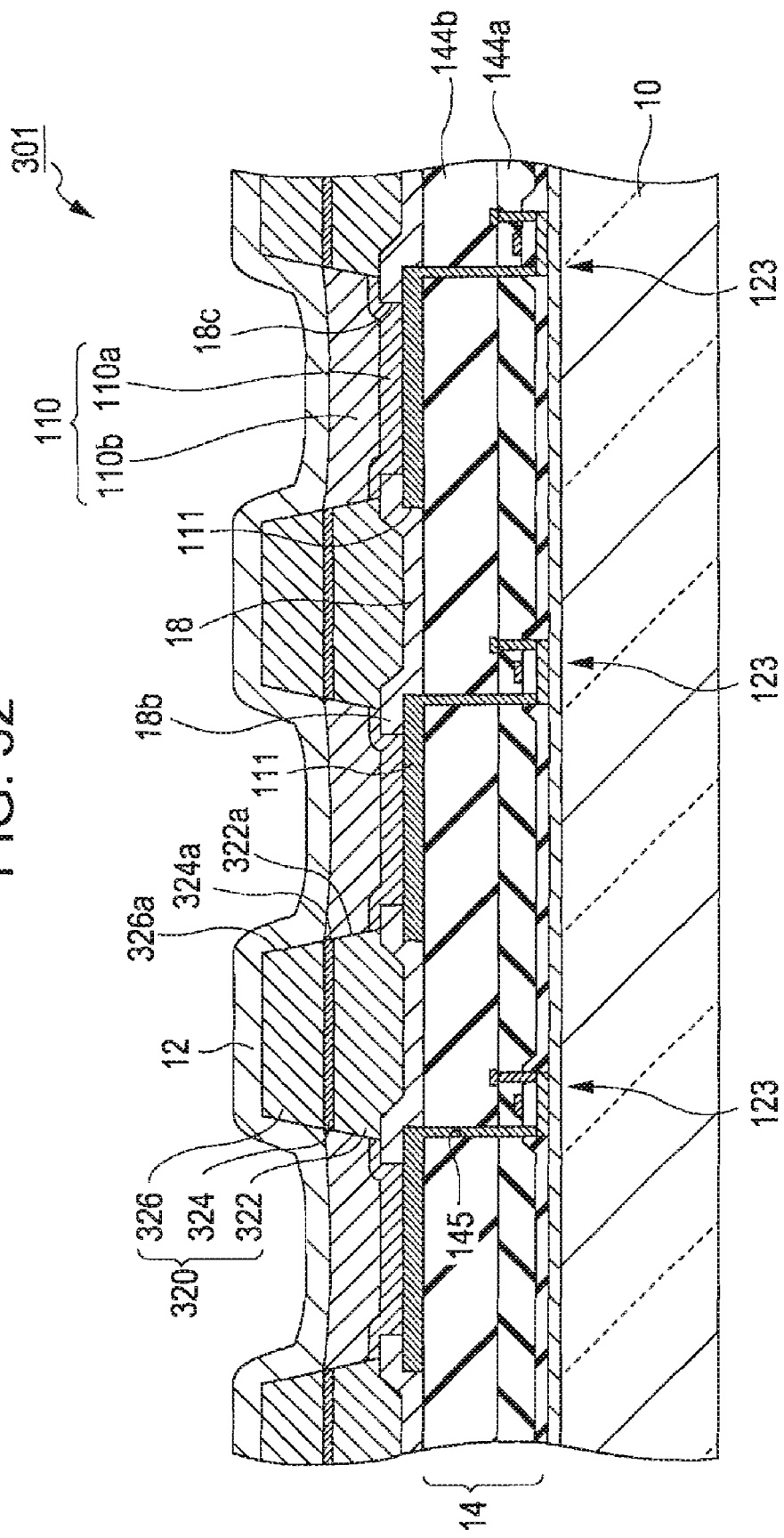
FIG. 32 is a cross-sectional view showing a step producing the organic EL device according to the fifth embodiment.

Next, as shown in FIG. 32, a Ca layer and an Al layer are sequentially laminated on the entire surface of the luminescent layer 110b by vacuum heating vapor deposition to form a negative electrode 12 including these laminated layers. As described above, a LiF layer may be formed under the Ca layer. In order to prevent oxidation, a protective layer composed of $SiO_2$, SiN, or the like may be preferably formed on the negative electrode 12.

Finally, as shown in FIG. 23B, a sealing resin 3a composed of a thermosetting resin or a UV curable resin is applied on the entire surface of the negative electrode 12. A sealing substrate 3b is then laminated on the sealing resin 3a to form a sealing portion 3. This sealing step is preferably performed in an atmosphere of an inert gas such as nitrogen, argon, or helium. The organic EL device 301 according to the fifth embodiment can be produced by the above method.

In the fifth embodiment, a hole-transporting layer is omitted, but the hole-transporting layer may be formed between the hole injection layer 110a and the luminescent layer 110b. A triphenylamine polymer can be used as the material of the hole-transporting layer. In such a case, since holes can be injected into the luminescent layer 110b more efficiently, excellent luminous efficiency and lifetime can be achieved.

According to this embodiment, the liquid repellency of the side faces 324a (second area) of the oxide layer 324 of the organic bank layer 320 is relatively lower than that of the side faces 322a (first area) of the first organic layer 322 and that of the side faces 326a (first area, or the second organic layer 326. That is, the side faces 324a of the oxide layer 324 are lyophilic, and the discharged luminescent layer-forming material is easily wetted on the side faces 324a compared with the other liquid-repellent areas. Accordingly, the side faces 324a of the oxide layer 324 serve as the pinning points at which drying and precipitation of the luminescent layer-forming material start. Therefore, the pinning points at which drying and precipitation start can be controlled (pinned) by adjusting the position of the side faces 324a of the oxide layer 324 of the organic bank layer 320. Accordingly, the thickness or the layer after drying can be controlled by controlling the amount of discharge of the luminescent layer-forming material or the like. Thus, a more uniform and flatter luminescent layer 110b can be formed. Furthermore, since the film thicknesses can be uniform at the periphery and at the central portion of the hole injection layer 110a and the luminescent layer 110b, the emission lifetime is uniform. Accordingly, a uniform emission lifetime can be achieved.

Sixth Embodiment

A sixth embodiment of the invention will now be described with reference to the drawing. This embodiment differs from the fifth embodiment in the shape of the organic bank layer 320. The other basic structure and the production method of the organic EL device are the same as those of the fifth embodiment. The common constituent elements are assigned the same reference numerals, and the detailed description of those elements is omitted.

Figure 33:
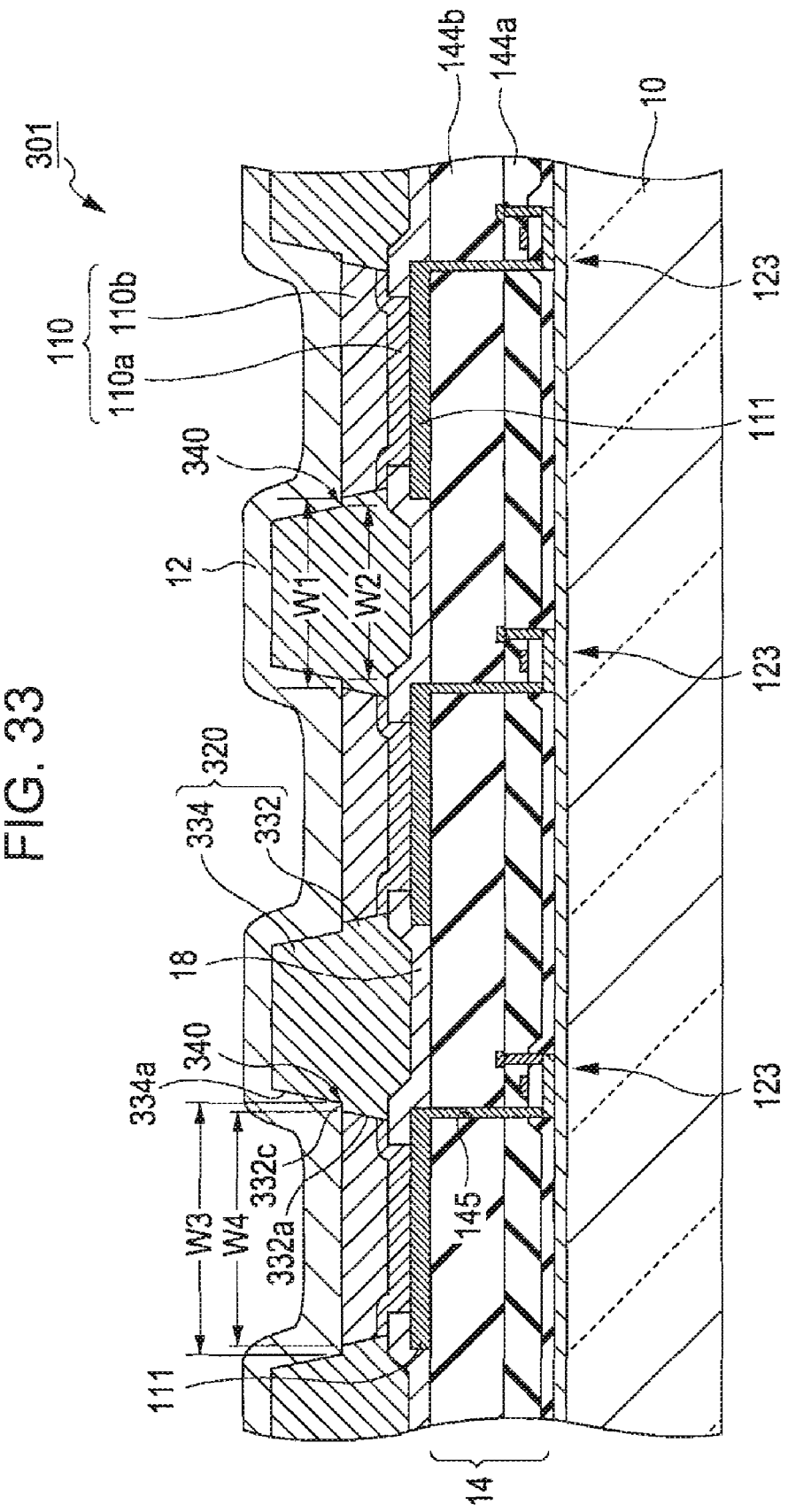
FIG. 33 is a cross-sectional view showing a step of producing an organic EL device according to a sixth embodiment.

As shout in FIG. 33, an organic bank layer 320 according to this embodiment includes an upper bank layer 334 (upper barrier portion) and a lower bank layer 332 (lower barrier portion) that are integrated with each other. The width W2 of the upper bank layer 334 of the organic bank layer 320 is smaller than the width W1 of the lower bank layer 332. The side faces 332a of the lower bank layer 332 project beyond the side faces 334a of the upper bank layer 334. A flexion 340 is provided at the boundary between the top surface 332c of the projecting lower bank layer 332 and the side face 334a of the upper bank layer 334. This flexion 340 serves as the pinning point at which drying and precipitation of a luminescent layer-forming material start. The flexion 340 may be provided along the entirety of, the side faces of the organic bank layer 320 or a part of the side faces of the organic bank layer 320.

The shape of the organic bank layer 320 is not limited to the above shape. For example, a slit-shaped recess or a protrusion having a triangular cross section may be provided on a part of the side faces of the organic bank layer 320 having a trapezoidal, cross section. The position of the flexion 340 is determined so as to correspond to the thickness of the luminescent layer 110b.

A method of forming the organic bank layer 320 according to this embodiment will be described. An organic material such as an acrylic resin or a polyimide resin is applied on pixel electrodes 111 and an inorganic bank layer 18. The organic material is then processed by photolithography using a mask having openings with an opening width W3 shown in FIG. 33. In this step, the photolithography is performed to the position (depth) at which the flexions 340 are formed. Next, photolithography is performed using a mask having openings with an opening width W4 shown in FIG. 33. As described above, the flexions 340 are formed on the side faces of the organic bank layer 320 by two-step photolithography.

According to this embodiment, the flexion 340 is provided on the side faces of the organic bank layer 320 on the inorganic bank layer 18, and the flexions 340 serve as the pinning points at which drying and precipitation of a liquid material start. Accordingly, in a luminescent layer-forming material discharged in areas separated by the organic bank layer 320, drying and precipitation of the material starts while the flexions 340 serve as base points. Accordingly, the pinning point at which the drying starts can be controlled by controlling the position of the flexions 340.

Seventh Embodiment

As a seventh embodiment of the invention, another method that can be used for producing the organic EL devices of the fifth embodiment and the sixth embodiment will now be described with reference to FIGS. 34 and 35. The method of this embodiment differs from the method of the fifth embodiment in that a liquid-repellency-providing treatment is performed on the inorganic bank layer 18 and the thickness of the hole injection layer is controlled. The other structures and the production method of the organic EL device, in particular, the other structures and the production method of the organic bank layer 320 are the same as those of the fifth embodiment and the sixth embodiment. The common constituent elements are assigned the same reference numerals, and the detailed description of those elements is omitted.

Step of Forming Bank Layer

First, an insulating layer, which becomes an inorganic bank layer, is formed on the entire surface of a second interlayer insulation film 144b including pixel electrodes 111 by sputtering using a material prepared by mixing a trace amount (20% or less) of carbon (C) with silicon nitride (SiN).

Subsequently, the deposited insulating layer is processed by photolithography. The insulating layer is then etched using a patterned resist as a mask. Consequently, as shown in FIG. 34, an inorganic bank layer 18 which separates the pixel electrodes 111 and a part of which is provided on the periphery of each pixel electrode 111 is formed.

Figure 34:
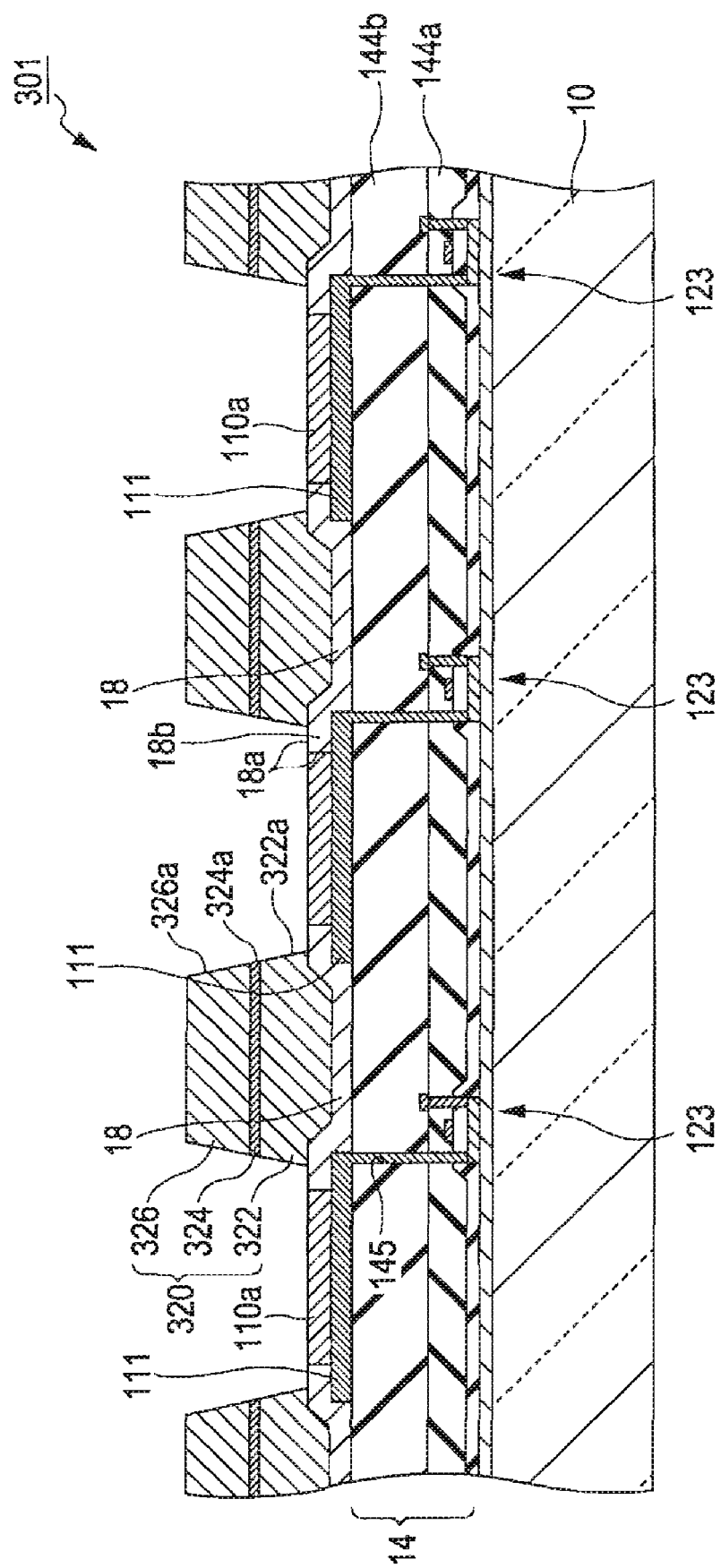
FIG. 34 is a cross-sectional view showing a step of producing an organic EL device according to a seventh embodiment.

Next, as shown in FIG. 34, an organic bank layer 320 is formed on the inorganic bank layer 18. The organic bank layer 320 is formed by laminating, from the side of a substrate 10, a first organic layer 322, an oxide layer 324, and a second organic layer 326 in that order. As described in the sixth embodiment, the organic bank layer 320 may include the flexions 340.

Subsequently, a continuous plasma treatment is performed on the surfaces of the pixel electrodes 111, the inorganic bank layer 18, and the organic bank layer 320 using $O_2$ and $CF_4$ as process gases. By performing this plasma treatment, electrode surfaces 111a of the pixel electrodes 111 are subjected to a lyophilicity-providing treatment. On the other hand, the side face 322a of the first organic layer 322 of the organic bank layer 320, the side face 326a of the second organic layer 326 of the organic bank layer 320, and the inorganic bank layer containing a trace amount of carbon are subjected to a liquid-repellency-providing treatment. Although a part of C of the surface 18a of the inorganic bank layer 111 is fluorinated by this plasma treatment, unlike the first organic layer 322 and the like, the surface 18a of the inorganic bank layer 18 is not changed to Teflon (registered trademark)

Step of Forming Hole Injection Layer

Next, as shown in FIG. 34, a hole injection layer-forming material is discharged from an ink jet apparatus into the pixel openings 18c separated by the inorganic bank layer 18. The solvent contained in the hole injection layer-forming material is then vaporized by a drying process to form a hole injection layer 110a of the pixel electrodes 111.

In this case, the liquid-repellency-providing treatment has already been performed on the surface 18a of the inorganic bank layer 18. The angle of contact between the surface 18a of the inorganic bank layer 18 and the hole injection layer-forming material is about 80°. Accordingly, even if the hole injection layer-forming material to be discharged into the pixel openings 18c of the inorganic bank layer 18 is discharged onto the top surface of protrusions 18b of the inorganic bank layer 18, the hole injection layer-forming material is repelled and flows into the pixel openings 18.

In this embodiment, the amount of discharge of the hole injection layer-forming material discharged from the ink jet apparatus IJ and the solid content of PEDOT/PSS or the like contained in the solvent of the hole injection layer-forming material to be discharged are controlled. Accordingly, the hole injection layer 110a can be formed so that the level of the top surface of the protrusions 18b of the inorganic bank layer 18 is the same as the level of the top surface of the hole injection layer 110a obtained by drying the discharged hole injection layer-forming material.

Step of Forming Luminescent Layer

Figure 35:
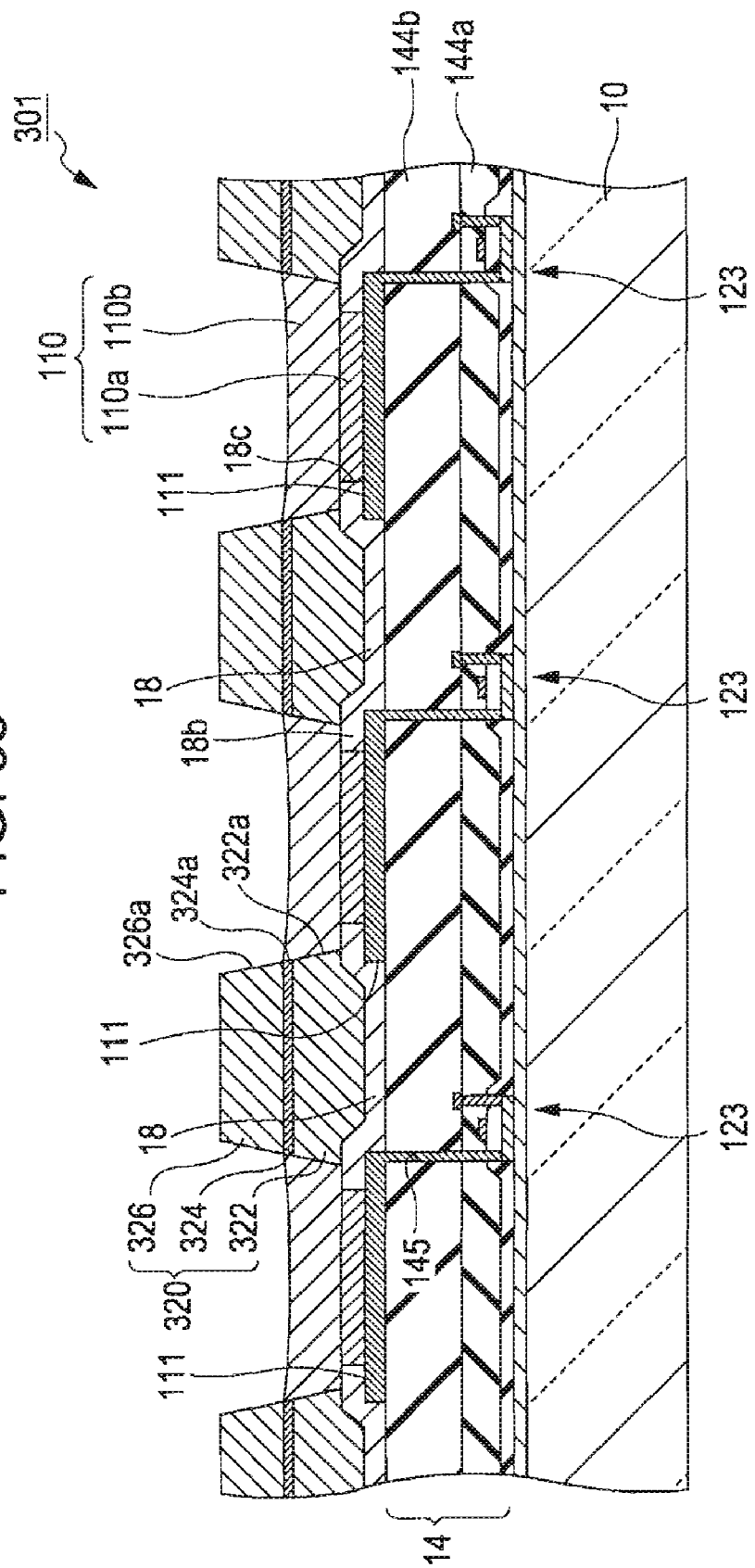
FIG. 35 is a cross-sectional view showing a step of producing the organic EL device according to the seventh embodiment.

Next, as shown in FIG. 35, a luminescent layer 110b is formed on the hole injection layer 110a and the protrusions 18b of the inorganic bank layer 18. Since the liquid-repellency-providing treatment has already been performed on the surface 18a of the inorganic bank layer 18, the hole injection layer 110a is not formed on the inorganic bank layer 18, and the top surface of the inorganic bank layer 18 and the top surface of the hole injection layer 110a form a continuous flat surface. Accordingly, the uniform and fat luminescent layer 110b having a thickness of, for example, 80 nm can be formed.

According to this embodiment/since the inorganic bank layer 18 is subjected to the liquid-repellency-providing treatment, the hole injection layer-forming material discharged on the inorganic bank layer 18 is repelled and flows into the openings separated by the inorganic bank layer 18. In addition, the level of the top surface of the hole injection layer is substantially the same as the level of the top surface of the inorganic bank layer 18, and the hole injection layer-forming material is controlled so that the material does not leak onto the inorganic bank layer 112a. Consequently, the hole injection layer is disposed only on the pixel electrodes in the openings separated by the inorganic bank layer 18 and is not disposed on the inorganic bank layer 18. Accordingly, a uniform and flat hole injection layer can be formed. Since the luminescent layer can be formed on this hole injection layer, a uniform and flat luminescent layer can be formed. Furthermore, since the film thicknesses can be uniform at the central portion and the periphery of the hole injection layer and the luminescent layer, the emission lifetime is uniform. Accordingly, a uniform emission lifetime can be achieved.

According to this embodiment, the surface of the inorganic bank layer 18 has liquid repellency. Therefore, even when an ink jet apparatus is used, the hole injection layer 110a can be selectively formed without leaking the material for forming the hole injection layer 110a outside the pixel openings 18c separated by the inorganic bank layer 18. Accordingly, by using the ink jet apparatus, wastage of the material can be suppressed, and the hole injection layer 110a can be formed with high accuracy and at low cost.

Furthermore, according to this embodiment, the organic bank layer 320 described in the fifth embodiment and the sixth embodiment is provided. Consequently, the pinning point can be controlled (pinned), and a uniform and flat luminescent layer can be formed.

Modification of Seventh Embodiment

A method of producing an organic EL device according to this embodiment will now be described. This embodiment differs from the seventh embodiment in the method of performing a liquid-repellency-providing treatment on the inorganic bank layer 18. The other structures and the production method of the organic EL device are the same as those of the fifth to seventh embodiments. Therefore, the description will be made with reference to FIG. 34. The common constituent elements are assigned the same reference numerals, and the detailed description of those elements is omitted.

First, an inorganic material such as $SiO_2$ or $TiO_2$ is deposited on the entire surface of a second interlayer insulation 144b including pixel electrodes 111 by CVD, sputtering, vapor deposition, or the like. Subsequently, as shown in FIG. 34, an inorganic bank layer 18 is formed by a photolithography process and an etching process.

As shown in FIG. 34, an organic bank layer 320 is formed on the inorganic bank layer 18. In the organic bank layer 320, from the side of a substrate 10, a first organic layer 322, an oxide layer 324, and a second organic layer 326 are laminated in that order.

Subsequently, a continuous plasma treatment is performed on the surfaces of the pixel electrodes 111, the inorganic bank layer 18, and the organic bank layer 320 using $O_2$ and $CF_4$ as process gases. By performing this plasma treatment, electrode surfaces of the pixel electrodes 111 and surfaces 18a of the inorganic bank layer 18 are subjected to a lyophilicity-providing treatment. On the other hand, the side face 322a of the first organic layer 322 and the side face 326a of the second organic layer 326 of the organic bank layer 320 are subjected to a liquid-repellency-providing treatment.

After the plasma treatment, the substrate is immersed in a solution of a silane coupling agent such as trimethoxysilane. Accordingly, a single layer film of the coupling agent is formed on the surfaces 118a of the inorganic bank layer 18, the surfaces being subjected to the lyophilicity-providing treatment. The silane coupling agent has satisfactory adhesiveness to oxides, and the wettability to ink such as a hole injection layer-forming material can be controlled by appropriately selecting the type of terminal functional group of the silane coupling agent used. When the substrate is immersed in the solution of the silane coupling agent, the silane coupling agent may be adhered to the electrode surfaces of the pixel electrodes 111 because the pixel electrodes 111 and the like are also composed of an oxide. In this case, the substrate may be irradiated with ultraviolet rays through a mask having openings at positions corresponding to pixel openings 18c. Consequently, the silane coupling agent can remain only on the surfaces 18a of the inorganic bank layer 18.

Electronic Device

Figure 36:
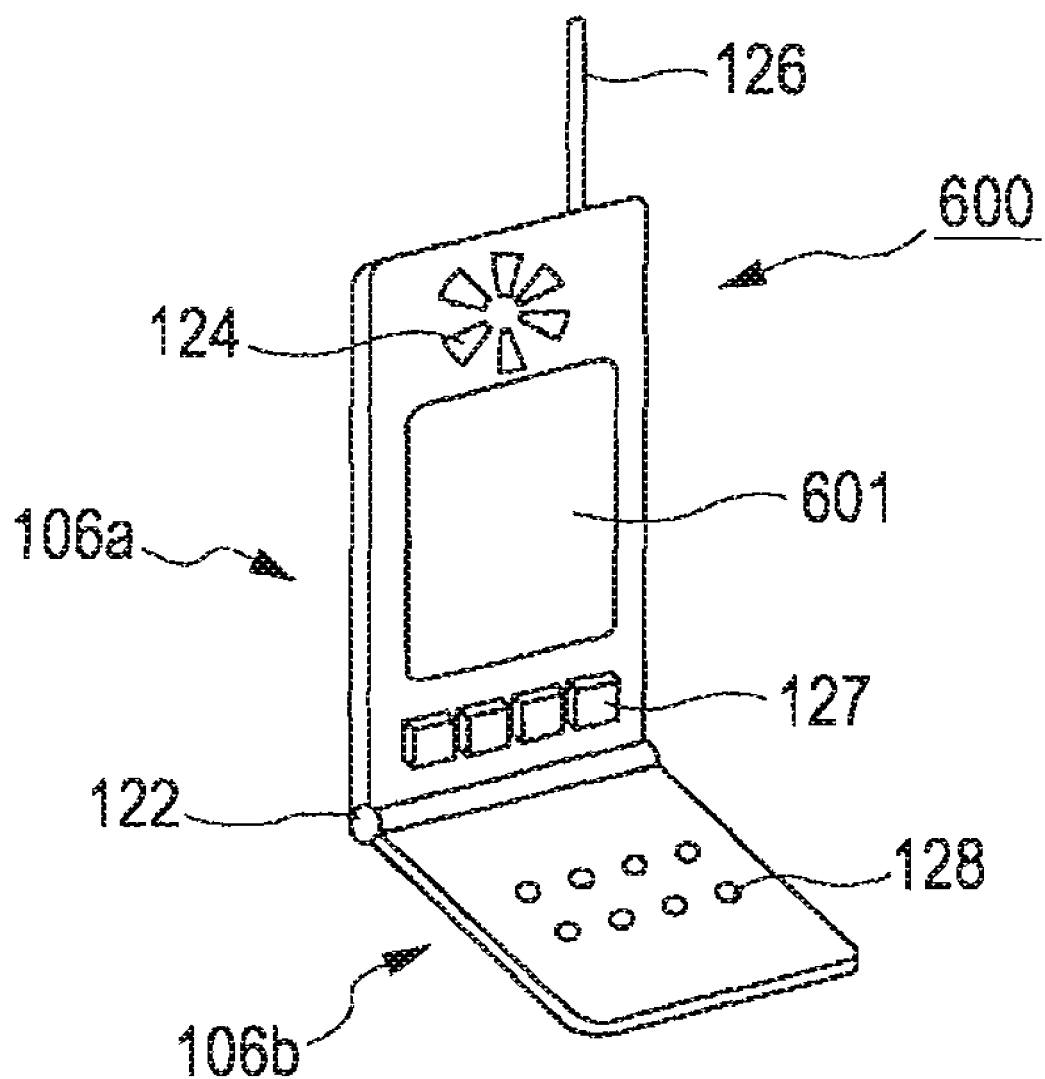
FIG. 36 is a perspective view showing the schematic structure of a mobile phone.

All electronic device including the organic EL device 1, 201, or 301 described in the above embodiments will now be described. FIG. 36 is a perspective view showing the schematic structure of a mobile phone. The mobile phone 600 shown in FIG. 36 includes a first body 106a and a second body 106b that can be folded around a hinge 122. The first body 106a includes a display 601 composed of the organic EL device, a plurality of operation buttons 127, an earpiece 124, and an antenna 126. The second body 106b includes a mouthpiece 128. According to this mobile phone 600, since the organic EL device 1, 201, or 301 is provided, a high-quality electronic device without unevenness of luminance can be provided.

The technical scope of the invention is not limited to the embodiments described above. Various modifications may be optionally added to the above-described embodiments without departing from the essence of the invention. For example, bottom-emission-type organic EL devices have been described in the above embodiments, but the invention can be applied to top-emission-type organic EL devices in which light is mainly supplied from the opposite side of an element substrate. In the case of such top-emission-type organic EL devices, a function of a reflective film is preferably added to the above-described pixel electrodes. In addition, a film prepared by laminating a transparent conductive material such as ITO is preferably used as the negative electrode.

What is claimed is:

1. A light-emitting device comprising:
    a substrate;
    pixel electrodes provided on the substrate;
    a negative electrode facing the pixel electrodes; and
    a hole injection layer and a luminescent layer that are provided between the pixel electrodes and the negative electrode so as to be laminated, from the substrate side, in that order,
    wherein a first barrier is provided between the adjacent pixel electrodes so as to separate the pixel electrodes from each other and to overlap with the peripheries of the pixel electrodes in plan view,
    a second barrier is provided on the first barrier so as to separate the pixel electrodes from each other, and side faces of the second barrier each include a first area, a second area, and a third area disposed between the first and second areas, the first and second areas having liquid repellency and the third area having a lyophilic property.

2. The light-emitting device according to claim 1, wherein the second barrier includes a first organic layer, a barrier insulating layer, and a second organic layer that are laminated, from the substrate side, in that order, and the liquid repellency of the surface of the barrier insulating layer is relatively lower than the liquid repellency of the surfaces of the first organic layer and the second organic layer.

3. The light-emitting device according to claim 1, wherein the first barrier has liquid repellency for a hole injection layer-forming material, and the level of the top surface of the hole injection layer is substantially the same as the level of the top surface of the first barrier provided on the peripheries of the pixel electrodes.

* * * * *